US011320313B2

(12) United States Patent
Kawasaki et al.

(10) Patent No.: US 11,320,313 B2
(45) Date of Patent: May 3, 2022

(54) INFRARED SENSOR AND METHOD FOR COOLING BOLOMETER INFRARED RAY RECEIVER OF INFRARED SENSOR

(71) Applicant: Panasonic Intellectual Property Management Co., Ltd., Osaka (JP)

(72) Inventors: Takashi Kawasaki, Osaka (JP); Kouhei Takahashi, Osaka (JP); Naoki Tambo, Osaka (JP); Yasuyuki Naito, Osaka (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 17 days.

(21) Appl. No.: 16/796,115

(22) Filed: Feb. 20, 2020

(65) Prior Publication Data

US 2020/0191658 A1 Jun. 18, 2020

Related U.S. Application Data

(63) Continuation of application No. 16/193,152, filed on Nov. 16, 2018, now Pat. No. 10,605,667.

(30) Foreign Application Priority Data

Dec. 11, 2017 (JP) .............................. JP2017-236574

(51) Int. Cl.
*G01J 5/06* (2022.01)
*G01J 5/061* (2022.01)
(Continued)

(52) U.S. Cl.
CPC ............. *G01J 5/061* (2013.01); *G01J 5/0853* (2013.01); *G01J 5/20* (2013.01); *H01L 35/32* (2013.01);
(Continued)

(58) Field of Classification Search
CPC .. G01J 5/061; G01J 5/0853; G01J 5/20; G01J 2005/062; G01J 5/06; G01J 5/024;
(Continued)

(56) References Cited

U.S. PATENT DOCUMENTS 6,100,463 A     8/2000   Ladd et al.
7,309,830 B2   12/2007   Zhang et al.
(Continued)

FOREIGN PATENT DOCUMENTS

JP          5-079906 A       3/1993
JP    2000230857 A   *   8/2000
(Continued)

OTHER PUBLICATIONS

Notice of Allowance issued in U.S. Appl. No. 16/193,152 dated Nov. 25, 2019.
(Continued)

*Primary Examiner* — Marcus H Taningco
(74) *Attorney, Agent, or Firm* — McDermott Will & Emery LLP

(57) ABSTRACT

An infrared sensor comprises a base substrate including a recess, a bolometer infrared ray receiver, and a Peltier device. The bolometer infrared ray receiver comprises a resistance variable layer, a bolometer first beam, and a bolometer second beam. The Peltier device comprises a Peltier first beam formed of a p-type semiconductor material and a Peltier second beam formed of an n-type semiconductor material. The Peltier device is in contact with a back surface of the bolometer infrared ray receiver. One end of each of the bolometer first beam, the bolometer second beam, the Peltier first beam, and the Peltier second beam is connected to the base substrate. The bolometer infrared ray receiver and the Peltier device are suspended above the base substrate. Each of the bolometer first beam, the bolometer
(Continued)

second beam, the Peltier first beam, and the Peltier second beam has a phononic crystal structure including a plurality of through holes arranged regularly.

9 Claims, 55 Drawing Sheets

(51) Int. Cl.
    *H01L 37/02*     (2006.01)
    *G01J 5/20*     (2006.01)
    *H01L 35/32*     (2006.01)
    *H01L 37/00*     (2006.01)
    *G01J 5/08*     (2022.01)

(52) U.S. Cl.
    CPC .............. *H01L 37/00* (2013.01); *H01L 37/02* (2013.01); *G01J 2005/062* (2013.01)

(58) Field of Classification Search
    CPC .......... G01J 5/023; H01L 37/00; H01L 35/32; H01L 37/02
    See application file for complete search history.

(56) References Cited

U.S. PATENT DOCUMENTS

| | | | |
|---|---|---|---|
| 7,709,795 B2 | 5/2010 | Yamanaka et al. | |
| 7,825,324 B2 | 11/2010 | Hodes et al. | |
| 7,836,566 B1 | 11/2010 | Olsson et al. | |
| 8,094,023 B1 | 1/2012 | El-Kady et al. | |
| 8,508,370 B1 | 8/2013 | El-Kady et al. | |
| 8,969,850 B2 | 3/2015 | Brown et al. | |
| 9,006,857 B1 * | 4/2015 | Carr ........................ | G01J 5/023 257/469 |
| 9,324,733 B2 | 4/2016 | Rogers et al. | |
| 9,417,465 B2 | 8/2016 | Hussein et al. | |
| 9,696,492 B1 | 7/2017 | Cox et al. | |
| 9,817,130 B1 | 11/2017 | Carr | |
| 9,978,926 B2 | 5/2018 | Huang et al. | |
| 2005/0274892 A1 | 12/2005 | Oda | |
| 2006/0118158 A1 | 6/2006 | Zhang et al. | |
| 2008/0173344 A1 | 7/2008 | Zhang et al. | |
| 2009/0114819 A1 | 5/2009 | Yamanaka et al. | |
| 2009/0295505 A1 | 12/2009 | Mohammadi et al. | |
| 2011/0128094 A1 | 6/2011 | Huang et al. | |
| 2011/0175145 A1 | 7/2011 | Tsuji et al. | |
| 2012/0061569 A1 | 3/2012 | Noguchi | |
| 2013/0075699 A1 | 3/2013 | Brown et al. | |
| 2013/0187169 A1 | 7/2013 | Taylor et al. | |
| 2013/0206989 A1 | 8/2013 | Zhou et al. | |
| 2013/0255738 A1 | 10/2013 | Mitrovic et al. | |
| 2015/0015930 A1 | 1/2015 | Hussein et al. | |
| 2015/0207052 A1 | 7/2015 | Carr | |
| 2016/0065169 A1 | 3/2016 | Rinaldi et al. | |
| 2016/0093420 A1 | 3/2016 | Urzhumov | |
| 2016/0153837 A1 | 6/2016 | Kakimoto et al. | |
| 2016/0211828 A1 | 7/2016 | Simmonds et al. | |
| 2016/0240762 A1 | 8/2016 | Carr | |
| 2016/0245696 A1 | 8/2016 | Shibayama et al. | |
| 2016/0336502 A1 | 11/2016 | Huang et al. | |
| 2017/0069818 A1 | 3/2017 | Mitrovic et al. | |
| 2017/0317260 A1 | 11/2017 | Verheyen et al. | |
| 2017/0356806 A1 | 12/2017 | Takahashi et al. | |
| 2018/0364153 A1 * | 12/2018 | Carr .......................... | G01J 5/12 |
| 2018/0374981 A1 * | 12/2018 | Carr ....................... | H05B 3/009 |
| 2020/0018714 A1 * | 1/2020 | Carr ..................... | G01N 27/125 |

FOREIGN PATENT DOCUMENTS

| | | |
|---|---|---|
| JP | 2012-063359 A | 3/2012 |
| JP | 2014-235064 A | 12/2014 |

OTHER PUBLICATIONS

Final Office Action issued in U.S. Appl. No. 16/193,152 dated Sep. 10, 2019.
Non-Final Office Action issued in U.S. Appl. No. 16/193,152 dated May 23, 2019.
M. Nomura et al., "Impeded thermal transport in Si multiscale hierarchical architectures with phononic crystal rianostructures", Physical Review B 91, 205422 (2015).
Kory Forrest Gray, "A MEMS Infrared Thermopile Fabricated from Silicon-On-Insulator with Phononic Crystal Structures and Carbon Nanotube Absorption Layer", A dissertation submitted to the Graduate Faculty of North Carolina State University, Mar. 29, 2016.
Jia-Hong Sun et al., "A Lamb Wave Source Based on the Resonant Cavity of Phononic-Crystal Plates", IEEE Transactions on Ultrasonics, Ferroelectrics, and Frequency Control, vol. 56, No. 1, Jan. 2009, pp. 121-128.
Peng Li et al., "Temperature insensitive mass sensing of mode selected phononic crystal cavity", J. Micromech. Microeng. 25 (2015) 125027.
Notice of Allowance issued in corresponding U.S. Appl. No. 16/193,152, dated Nov. 25, 2019.
Final Office Action issued in corresponding U.S. Appl. No. 16/193,152, dated Sep. 10, 2019.
Non-Final Office Action issued in corresponding U.S. Appl. No. 16/193,152, dated May 23, 2019.

\* cited by examiner

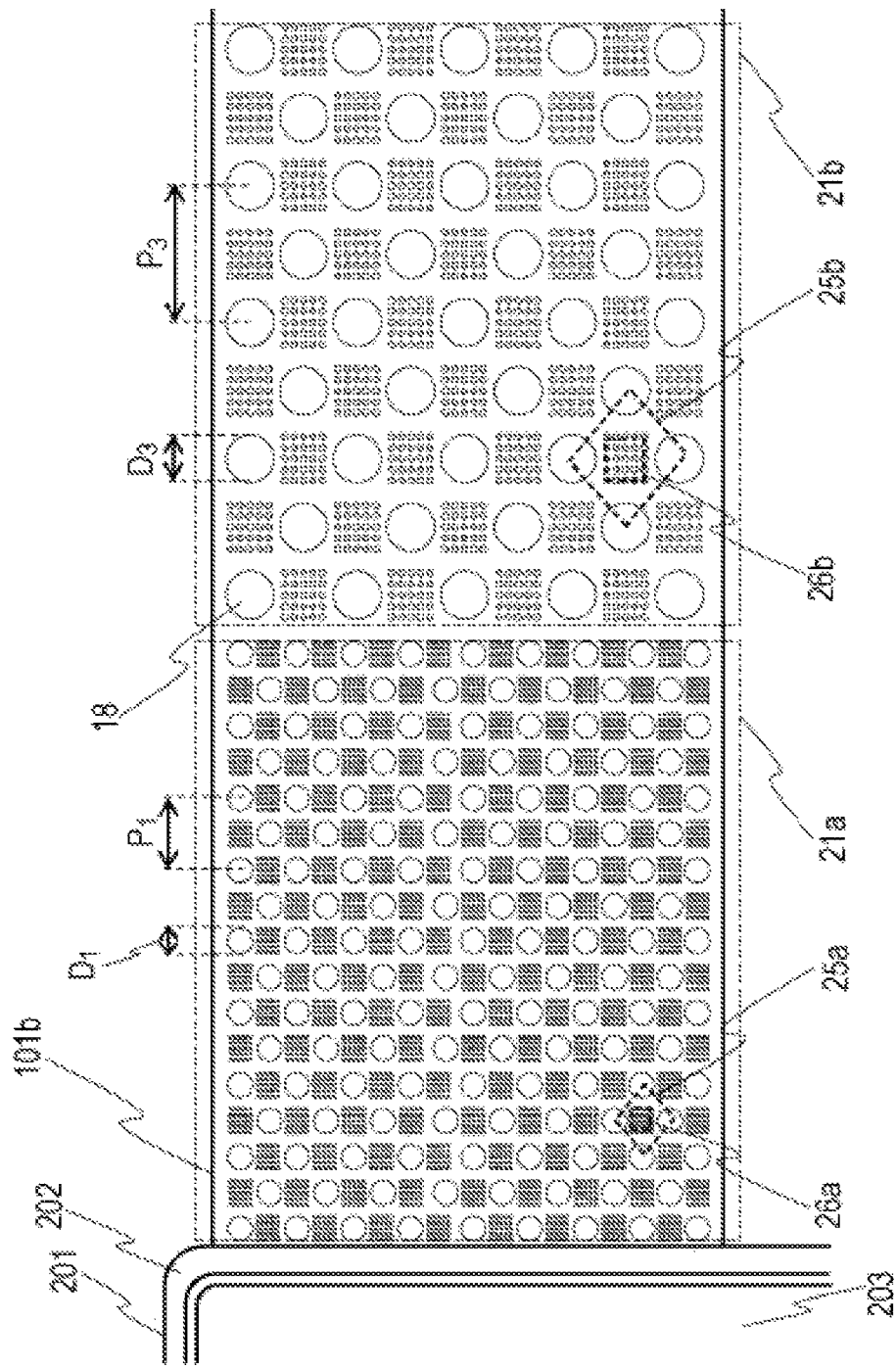

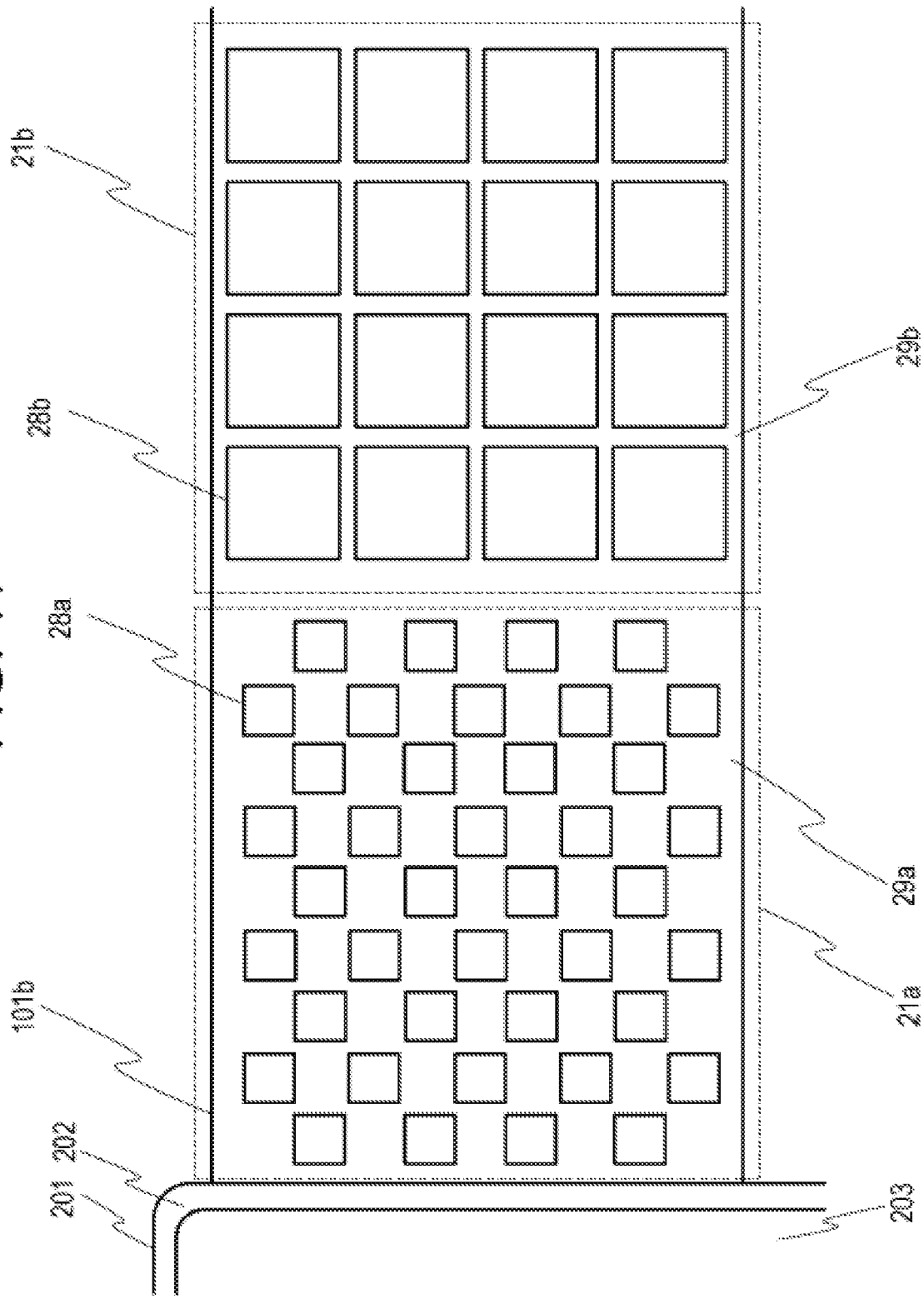

INFRARED SENSOR AND METHOD FOR COOLING BOLOMETER INFRARED RAY RECEIVER OF INFRARED SENSOR

CROSS-REFERENCE OF RELATED APPLICATIONS

This application is a Continuation of U.S. patent application Ser. No. 16/193,152, filed on Nov. 16, 2018, which in turn claims the benefit of Japanese Application No. 2017-236574, filed on Dec. 11, 2017, the entire disclosures of which applications are incorporated by reference herein.

BACKGROUND

1. Technical Field

The present disclosure relates to an infrared sensor and a method for cooling a bolometer infrared ray receiver of the infrared sensor.

2. Description of the Related Art

PTL 1 discloses a structure in which a thermal infrared ray receiver is spaced apart from a base substrate using beams. This structure is intended to thermally insulate the infrared ray receiver from the base substrate. The thermal infrared sensor in this structure exhibits higher detection sensitivity for an infrared ray as the heat-insulation performance of the beams is higher.

PTL 2 and NPL 1 each disclose a periodic structure structured by a plurality of through holes for reducing the thermal conductivity of a thin film. In the periodic structure, the through holes are regularly arranged with a period on the order of nanometers (in the region from 1 nm to 1000 nm inclusive) in the thin film as seen in a plan view. This periodic structure is one type of phononic crystal structures. The phononic crystal structure of this type is the periodic structure in which the minimum unit of the arrangement of the through holes is a unit lattice.

For example, as disclosed in PTL1, the thermal conductivity of a thin film is reduced by being rendered porous, because voids thus introduced in the thin film reduce the thermal conductivity of the thin film. Meanwhile, the phononic crystal structure is capable of reducing the thermal conductivity of the base material itself structuring the thin film. Therefore, the phononic crystal structure is expected to further reduce the thermal conductivity as compared to simply rendering the thin film porous.

In an insulator and a semiconductor, heat is mainly transferred by lattice vibrations called a phonon. The thermal conductivity of a material structured by an insulator or a semiconductor is determined by the phonon dispersion relation of the material. The phonon dispersion relation means the relation between the frequency and the wave number, or the band structure. In an insulator and a semiconductor, the phonon transferring heat has a wide frequency band falling within a range of 100 GHz to 10 THz inclusive. This frequency band is a thermal band. The thermal conductivity of a material is determined by the phonon dispersion relation in the thermal band.

In the above-described phononic crystal structure, the phonon dispersion relation of a material is controllable by the periodic structure of the through holes. That is, the phononic crystal structure allows control of the thermal conductivity itself of a material, for example, the base material of the thin film. Particularly, formation of the phononic band gap (PBG) by virtue of the phononic crystal structure can largely reduce the thermal conductivity of the material. No phonon can exist in the PBG. Accordingly, any PBG positioned in the thermal band may serve as a gap for thermal conduction. Further, in any frequency band other than the PBG also, the PBG makes the slope of the phonon dispersion curve gentle. Such a gentle slope reduces the group velocity of the phonon, and reduces the thermal conduction speed. These factors largely contribute to reducing the thermal conductivity of the material.

Applying the phononic crystal structure to beams supporting an infrared ray receiver improves the detection sensitivity of the infrared sensor.

CITATION LIST

Patent Literature

PTL 1: Unexamined Japanese Patent Publication No. 2012-63359
PTL 2: U.S. Patent Publication No. 2017/0069818

Non-Patent Literature

NPL 1: M. Nomura et al., "Impeded thermal transport in Si multiscale hierarchical architectures with phononic crystal nanostructures", Physical Review B 91, 205422 (2015)

The improved heat-insulation performance of beams improves the detection sensitivity of an infrared sensor. However, at the same time, a change in the temperature of the infrared ray receiver becomes slow, posing a problem that the response speed of the infrared sensor becomes poor.

Here, as means for improving the response speed of the infrared sensor, it may be contemplated to dispose, for example, in the infrared sensor disclosed in PTL1, a Peltier device having the shape of a beam connected to the base substrate so as to be in contact with the infrared ray receiver. By virtue of the Peltier device locally absorbing heat from the infrared ray receiver, the temperature of the infrared ray receiver which has been raised by incident infrared rays lowers. However, since the applied Peltier device increases the thermal conductance between the infrared ray receiver and the base substrate, a reduction in sensitivity of detecting an infrared ray is invited. Further, in fabricating a Peltier device having the shape of a beam monolithically on the semiconductor substrate, a semiconductor material used in the silicon process technology needs to be used. In this case, any normally employed semiconductor material (for example, Si or SiGe) only exhibits low Peltier effect and hence hardly exhibits satisfactory heat absorption function.

SUMMARY

One non-limiting and exemplary embodiment provides an infrared sensor being excellent both in detection sensitivity and response speed, and a method for cooling an infrared ray receiver of the infrared sensor.

In one general aspect, the techniques disclosed here feature an infrared sensor including:
 a base substrate including a recess;
 a bolometer infrared ray receiver; and
 a Peltier device, wherein
 the bolometer infrared ray receiver comprises
  a resistance variable layer in which resistance varies upon absorption of an infrared ray,
  a bolometer first beam electrically connected to the resistance variable layer, and a bolometer second beam electrically connected to the resistance variable layer, the Peltier device is interposed between the bolometer infrared ray receiver and the recess, a front surface of the bolometer infrared ray receiver is irradiated with the infrared ray, the Peltier device comprises a Peltier first beam formed of a p-type semiconductor material, and a Peltier second beam formed of an n-type semiconductor material, the Peltier device is in contact with a back surface of the bolometer infrared ray receiver, one end of the bolometer first beam, one end of the bolometer second beam, one end of the Peltier first beam, and one end of the Peltier second beam are connected to the base substrate, the bolometer infrared ray receiver, the Peltier device, the bolometer first beam, the bolometer second beam, the Peltier first beam, and the Peltier second beam are suspended above the base substrate, the bolometer first beam has a first phononic crystal structure including a plurality of through holes arranged regularly, the bolometer second beam has a second phononic crystal structure including a plurality of through holes arranged regularly, the Peltier first beam has a third phononic crystal structure including a plurality of through holes arranged regularly, and the Peltier second beam has a fourth phononic crystal structure including a plurality of through holes arranged regularly.

In the infrared sensor of the present disclosure, the bolometer first beam, the bolometer second beam, the Peltier first beam, and the Peltier second beam separating the resistance variable layer and the base substrate from each other each have a phononic crystal structure. This largely reduces thermal conductance between the resistance variable layer and the base substrate. As a result, excellent detection sensitivity for an infrared ray is realized.

Further, by virtue of the Peltier first beam and the Peltier second beam functioning as a Peltier device each having a phononic crystal, even in the case where the Peltier first beam and the Peltier second beam are formed of a semiconductor material used in the silicon process technology being poor in Peltier effect (such as Si or SiGe) also, the temperature of the bolometer infrared ray receiver having raised in accordance with absorption of an infrared ray is satisfactorily cooled. The reason why the configuration of the present disclosure is capable of improving the Peltier effect is explained as follows. Since the phononic crystal structure is applied to each of the Peltier first beam and the Peltier second beam, just the thermal conductivity of the material of each of the Peltier first beam and the Peltier second beam reduces while the electrical conductivity of the material is maintained. That is, in the phononic crystal structure, the electrical conductivity being dependent on the electron transport does not change, and just the thermal conductivity being dependent on the phonon transport changes. The excellent Peltier effect makes it possible to cool the bolometer infrared ray receiver in a short time. Thus, the response speed of the infrared sensor improves.

The present disclosure provides an infrared sensor being excellent both in detection sensitivity and response speed, and a method for cooling a bolometer infrared ray receiver of the infrared sensor.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 9A is yet another exemplary schematic enlarged view around the resistance variable layer, the insulating film, the infrared ray absorption layer, and the beam in the infrared sensor according to the first exemplary embodiment;

FIG. 11 is an enlarged view of a beam for describing that a sub phononic domain functions similarly to one large through hole for a long-wavelength phonon in the infrared sensor according to the first exemplary embodiment;

DETAILED DESCRIPTION

In the following, with reference to the drawings, a description will be given of exemplary embodiments of the present disclosure. U.S. Patent Application No. 2015/497353 and Chinese Patent Application No. 201710274259.9 corresponding to Unexamined Japanese Patent Publication No. 2017-223644 and Unexamined Japanese Patent Publication No. 2017-223644 are incorporated herein by reference.

First Exemplary Embodiment

Figure 10A:
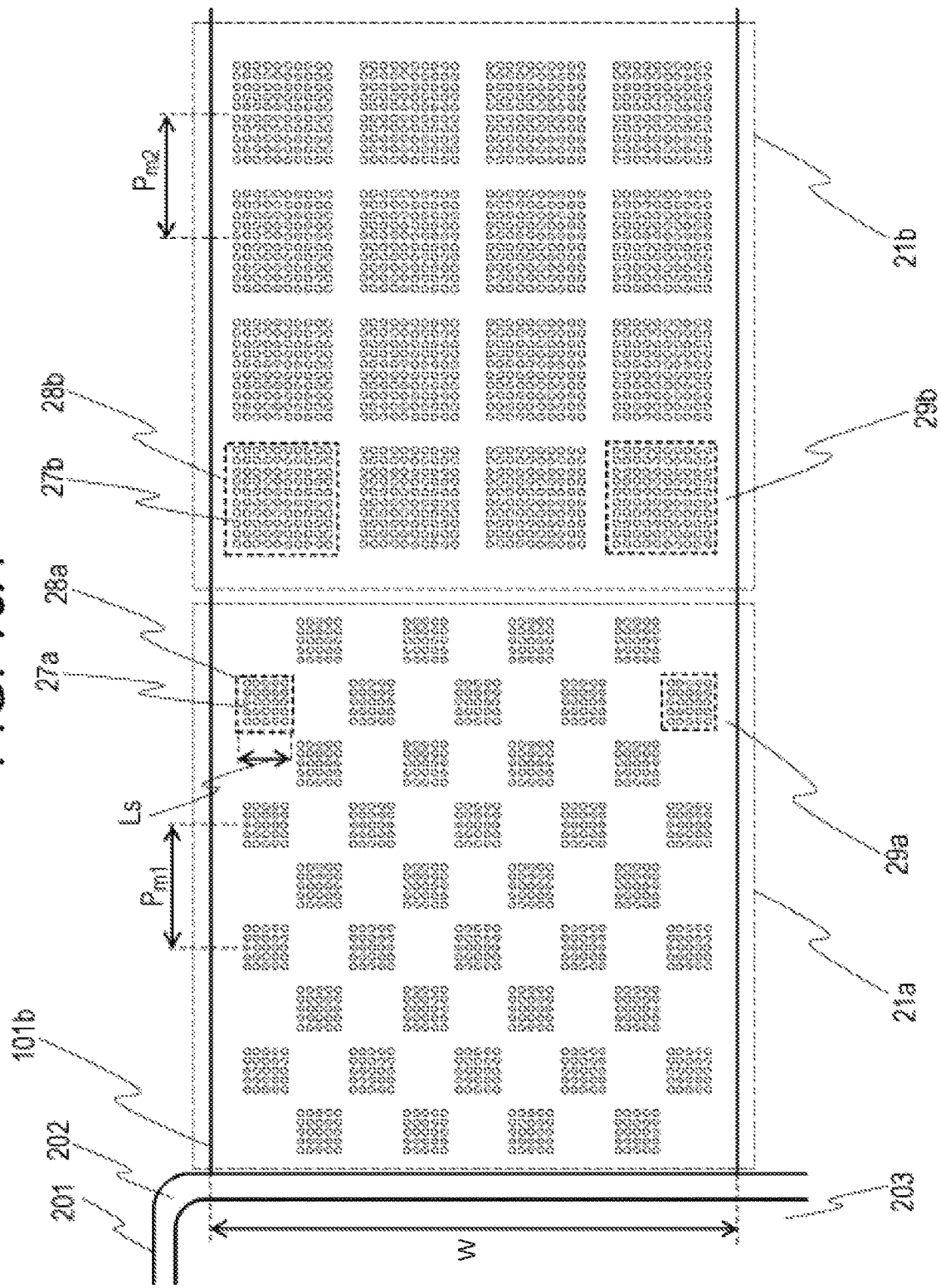
FIG. 10A is a still another exemplary schematic enlarged view around an infrared ray receiver, and the beam in the infrared sensor according to the first exemplary embodiment.
Figure 10B:
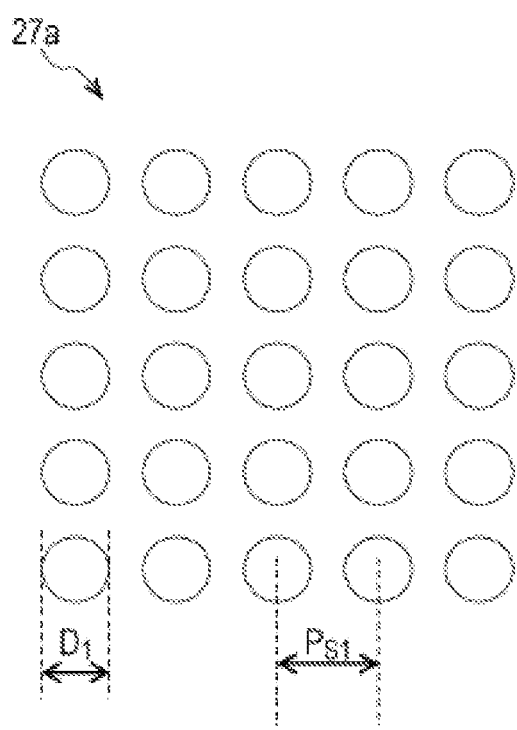
FIG. 10B is an enlarged view of a micro periodic structure shown in FIG. 10A.
Figure 10C:
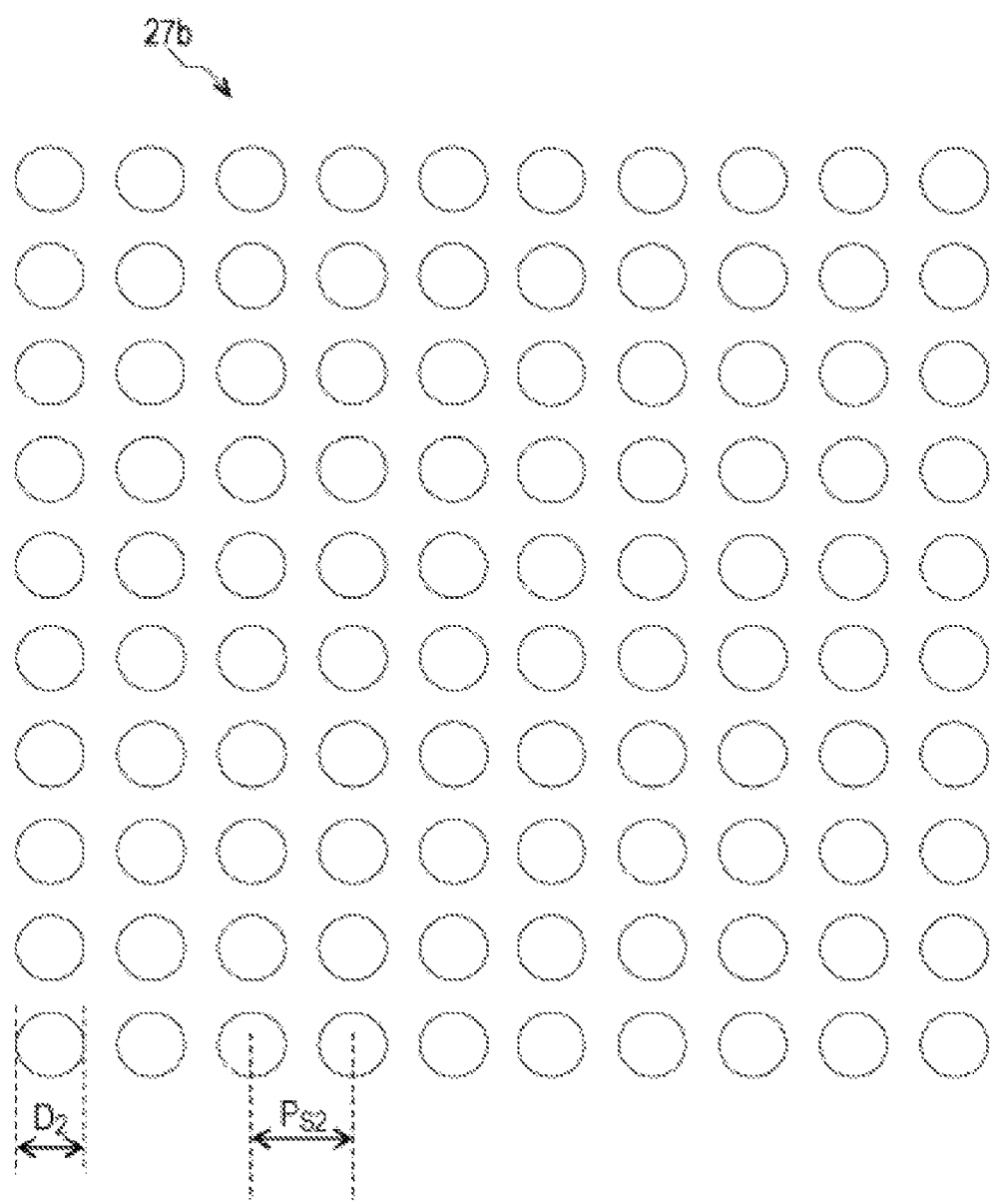
FIG. 10C is an enlarged view of a micro periodic structure shown in FIG. 10A.

FIGS. 1A to 10 show infrared sensor 1A according to a first exemplary embodiment. FIG. 1B is a cross-sectional view of infrared sensor 1A taken along line 1B-1B in FIG. 1A. FIG. 10 is a cross-sectional view of infrared sensor 1A taken along line 10-10 in FIG. 1A. Infrared sensor 1A is a bolometer infrared sensor.

Infrared sensor 1A includes base substrate 11 with recess 32, bolometer infrared ray receiver 12A, and Peltier device 12P. Infrared sensor 1A further includes electrode pads 13a, 13b, 15a, 15b, and second wires 14a, 14b, 14c, 14d. Electrode pads 13a, 13b, 15a, 15b, and second wires 14a, 14b, 14c, 14d are provided on base substrate 11.

Bolometer infrared ray receiver 12A includes resistance variable layer 201 whose resistance varies upon absorption of an infrared ray, beam 101a electrically connected to resistance variable layer 201, and beam 101b electrically connected to resistance variable layer 201. Note that, beam 101a and beam 101b are respectively also referred to as a bolometer first beam and a bolometer second beam. Further, bolometer infrared ray receiver 12A includes insulating film 202 formed on resistance variable layer 201, and infrared ray absorption layer 203 formed on insulating film 202. Bolometer infrared ray receiver 12A has a shape of a film. A surface where bolometer infrared ray receiver 12A is provided is referred to as a front surface of bolometer infrared ray receiver 12A. Further, a surface where resistance variable layer 201 is provided is referred to as a back surface of bolometer infrared ray receiver 12A.

Peltier device 12P includes beam 102a formed of a p-type semiconductor material, and beam 102b formed of an n-type semiconductor material. Note that, beam 102a and beam 102b are respectively also referred to as a Peltier first beam and a Peltier second beam. Peltier device 12P further includes first wire 16 and insulating film 17.

Figure 1A:
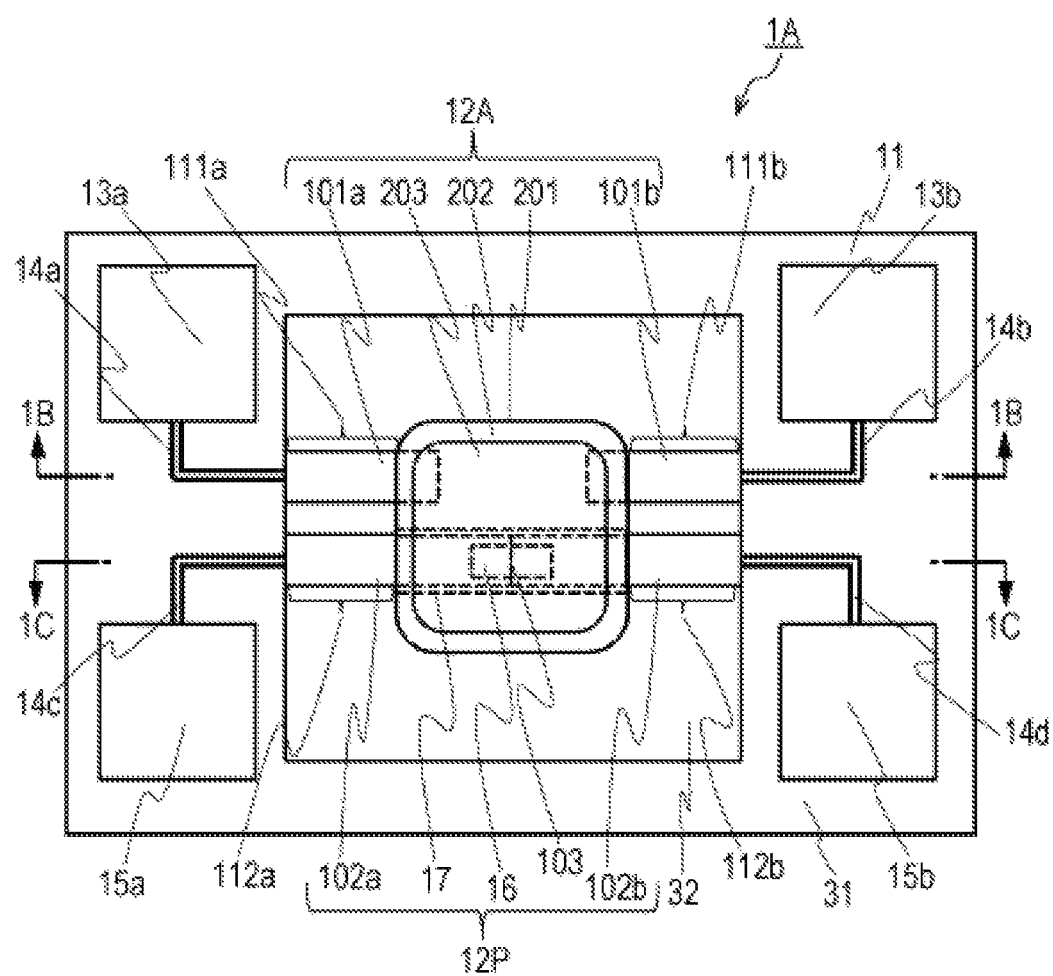
FIG. 1A is a schematic plan view of an example of an infrared sensor according to a first exemplary embodiment.
Figure 1B:
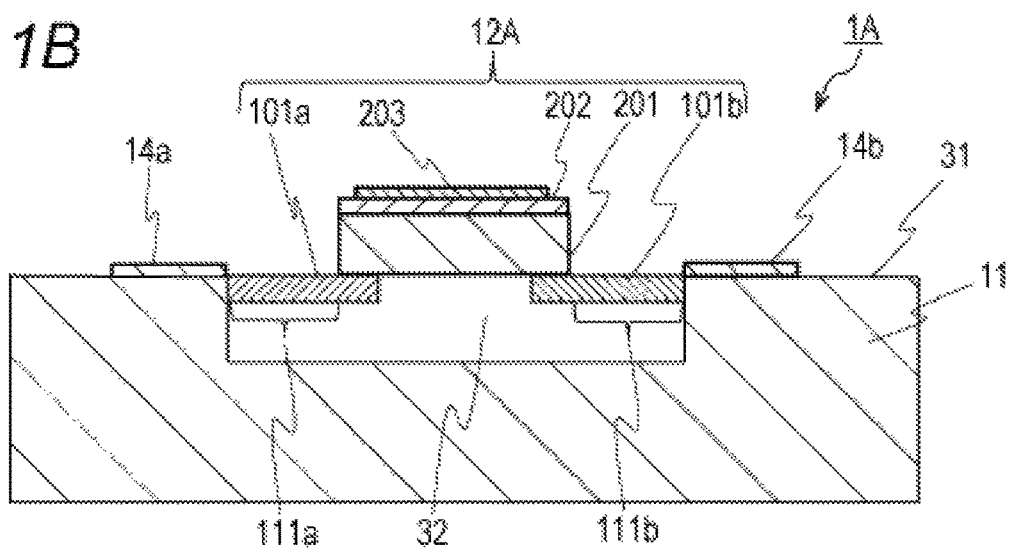
FIG. 1B is a schematic cross-sectional view of the infrared sensor according to the first exemplary embodiment taken along line 1B-1B in FIG. 1A.
Figure 1C:
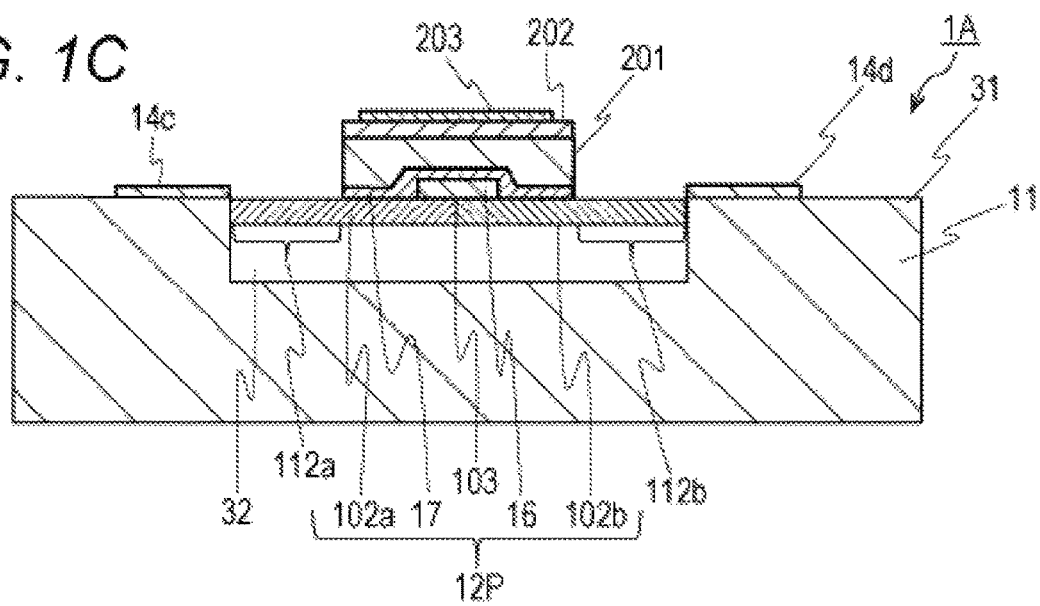
FIG. 1C is a schematic cross-sectional view of the infrared sensor according to the first exemplary embodiment taken along line 1C-1C in FIG. 1A.

As shown in FIGS. 1A and 1B, one end of beam 101a and one end of beam 101b are connected to base substrate 11. Further, the other end of beam 101a and another end of beam 101b are connected to resistance variable layer 201. Further, beams 101a, 101b are respectively electrically connected to second wires 14a, 14b. Second wires 14a, 14b are respectively electrically connected to electrode pads 13a, 13b.

As shown in FIGS. 1A and 10, one end of beam 102a and one end of beam 102b are connected to base substrate 11. Further, the other end of beam 102a is connected to the other end of beam 102b, to form interface 103. First wire 16 electrically connecting between beams 102a, 102b is formed on beams 102a, 102b across interface 103. Further, insulating film 17 is formed on first wire 16, beam 102a, and beam 102b so as to cover first wire 16. Further, beams 102a, 102b are respectively electrically connected to second wires 14c, 14d. Second wires 14c, 14d are respectively electrically connected to electrode pads 15a, 15b.

As shown in FIGS. 1A to 10, base substrate 11 has recess 32 at upper surface 31 where infrared ray receiver 12A is provided.

As seen in a plan view, recess 32 is greater in area than infrared ray receiver 12A. Further, as seen in a plan view, infrared ray receiver 12A is surrounded by an outer edge of recess 32. Note that, in the present specification, "as seen in a plan view" means viewing a target object perpendicularly to the main surface of the target object. Further, the "main surface" refers to the surface having the greatest area. In the present exemplary embodiment, the main surface is upper surface 31.

Recess 32 is provided to base substrate 11 in order to hinder leakage of heat accumulated in resistance variable layer 201, insulating film 202, and infrared ray absorption layer 203. As is well known in the art, hindering leakage of heat improves detection sensitivity of the infrared sensor.

As shown in FIG. 1B, recess 32 is positioned between infrared ray receiver 12A, beams 101a, 101b, and base substrate 11. As shown in FIG. 10, Peltier device 12P is interposed between bolometer infrared ray receiver 12A and recess 32. Further, in order to cool bolometer infrared ray receiver 12A, Peltier device 12P is in contact with the back surface of bolometer infrared ray receiver 12A. Specifically, insulating film 17 is in contact with resistance variable layer 201. Interface 103 is interposed between resistance variable layer 201 and recess 32. Insulating film 17 is interposed between resistance variable layer 201 and beams 102a, 102b. Bolometer infrared ray receiver 12A, Peltier device 12P, and beams 101a, 101b, 102a, 102b are suspended above base substrate 11. As is well known in the art, suspending bolometer infrared ray receiver 12A improves detection sensitivity of the infrared sensor.

Beams 101a, 101b are used in reading a detection signal for an infrared ray becoming incident on infrared ray absorption layer 203.

Beams 101a, 101b are formed of an electrically conductive material. The electrically conductive material is, for example, metal or a semiconductor. More preferably, the electrically conductive material is a semiconductor. This is because the medium that transfers heat in metal is not phonons, but is mainly free electrons. The semiconductor is a single-element semiconductor such as Si or Ge, a compound semiconductor such as SiN, SiC, SiGe, GaAs, InAs, InSb, InP, GaN, or AlN, and an oxide semiconductor such as $Fe_2O_3$, $VO_2$, $TiO_2$, or $SrTiO_3$.

Each of beam 101a and beam 101b has a phononic crystal structure structured by a plurality of regularly arranged through holes in order to improve the heat-insulation performance of resistance variable layer 201 against base substrate 11. The phononic crystal structure is desirably provided at section 111a between one end of beam 101a connected to base substrate 11 and one end of resistance variable layer 201 in beam 101a as seen in a plan view, and at section 111b between one end of beam 101b connected to base substrate 11 and the other end of resistance variable layer 201 in beam 101b as seen in a plan view. The phononic crystal structure will be detailed later.

Beams 102a, 102b structure a thermocouple, and function as Peltier device 12P. That is, beams 102a, 102b are used in absorbing heat generated at infrared ray receiver 12A. Interface 103 corresponds to the cold junction of Peltier device 12P. One of beams 102a, 102b is formed of a p-type semiconductor material. The other one of beams 102a, 102b is formed of an n-type semiconductor material. The p-type semiconductor material and the n-type semiconductor material are each desirably, for example, a silicon-based semiconductor material (for example, Si or SiGe) used in the silicon process technology.

First wire 16 is provided on interface 103 in order to facilitate flow of current through beams 102a, 102b. While Peltier device 12P can function without first wire 16, Peltier device 12P desirably includes first wire 16.

Figure 1D:
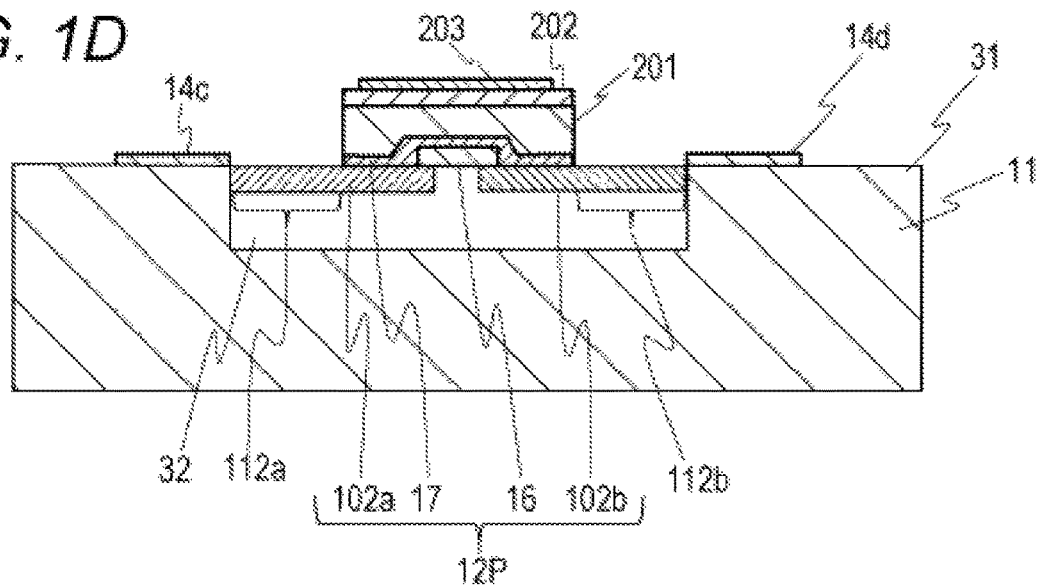
FIG. 1D is a cross-sectional view of another example of the infrared sensor according to the first exemplary embodiment.

Note that, as shown in FIG. 1D, in the case where Peltier device 12P not having interface 103 is used, first wire 16 that electrically connects beam 102a to beam 102b is essential. In this case, first wire 16 corresponds to the cold junction of Peltier device 12P. As shown in FIG. 1D, first wire 16 is interposed between resistance variable layer 201 and recess 32.

Figure 4A:
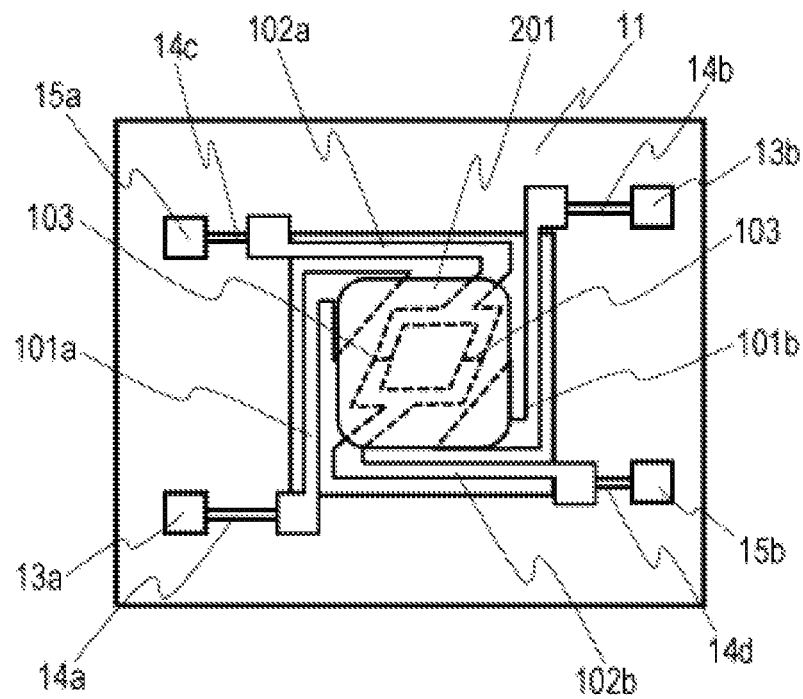
FIG. 4A is a schematic illustration of one example of the layout of an interface on a resistance variable layer in the infrared sensor according to the first exemplary embodiment.
Figure 4B:
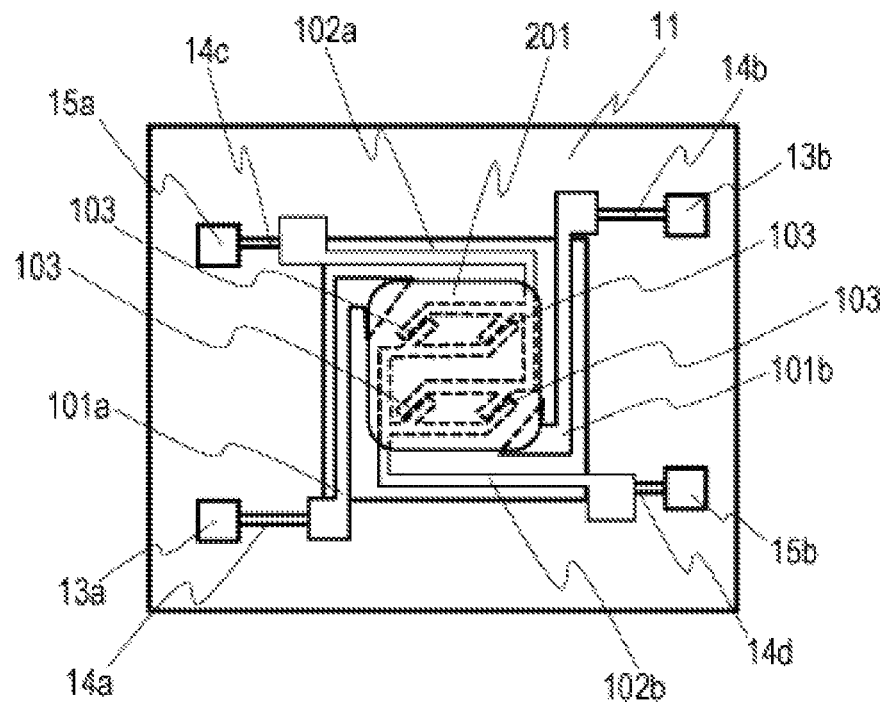
FIG. 4B is a schematic illustration of another example of the layout of the interface on the resistance variable layer in the infrared sensor according to the first exemplary embodiment.

Infrared sensor 1A desirably has a plurality of interfaces 103. The plurality of interfaces 103 are desirably disposed so as to be dispersed within the plane of resistance variable layer 201, because the region from which heat is absorbed by the Peltier effect is limited to a local region near each interface 103. Therefore, in the structure in which a plurality of interfaces 103 are disposed so as to be dispersed in resistance variable layer 201, resistance variable layer 201, insulating film 202, and infrared ray absorption layer 203 are more evenly cooled. As shown in FIGS. 4A and 4B, when the plane of resistance variable layer 201 is divided into four equal regions, preferably a plurality of interfaces 103 exist at least at two of the regions. Note that, FIGS. 4A and 4B do not show first wire 16, insulating film 17, insulating film 202, and infrared ray absorption layer 203.

Figure 5A:
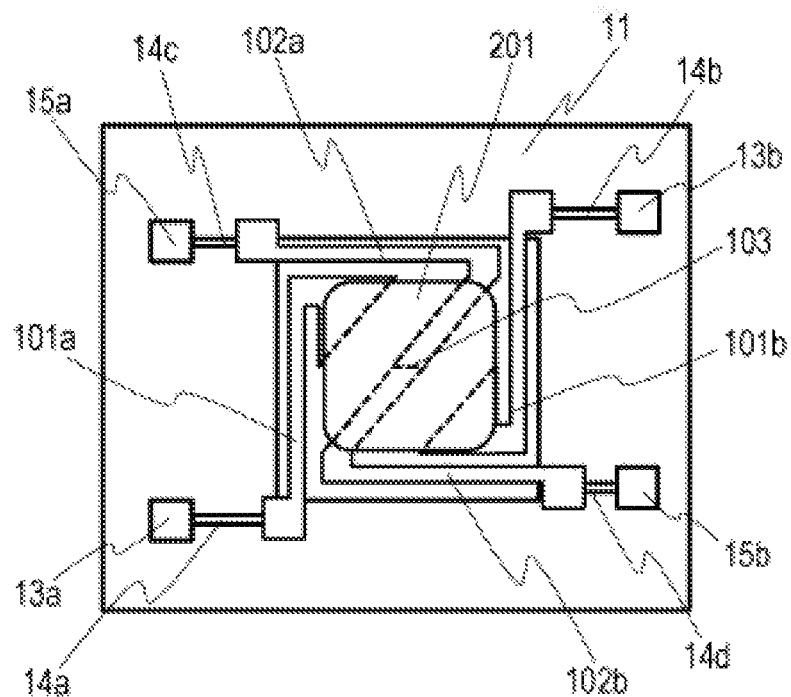
FIG. 5A is a schematic illustration of yet another example of the layout of the interface on the resistance variable layer in the infrared sensor according to the first exemplary embodiment.
Figure 5B:
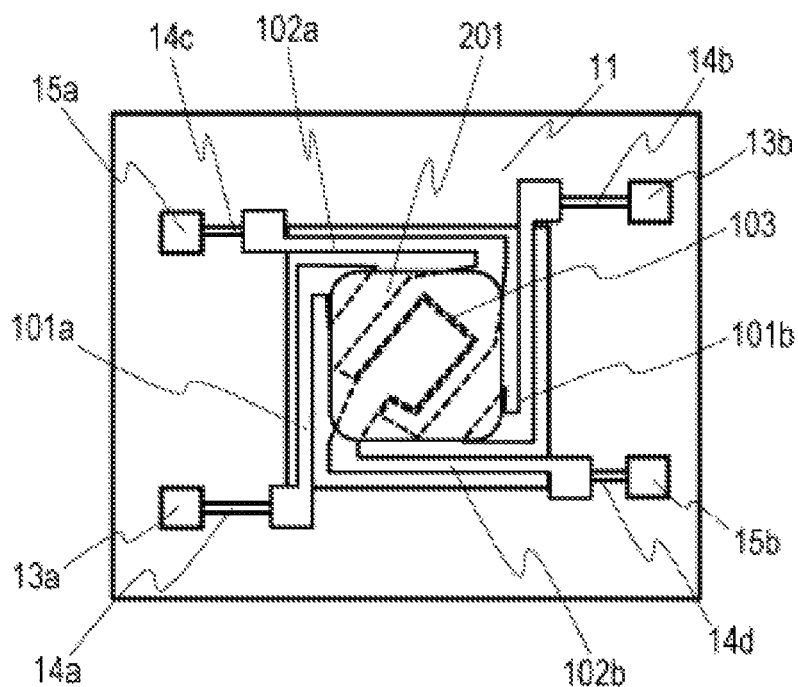
FIG. 5B is a schematic illustration of still another example of the layout of the interface on the resistance variable layer in the infrared sensor according to the first exemplary embodiment of the present disclosure.

Further, as shown in FIGS. 5A and 5B, when the plane of infrared ray receiver 12A is divided into plurality of equal regions, one interface 103 may be disposed across at least two of the regions. This structure achieves efficient absorption of heat from infrared ray receiver 12. Note that, FIGS. 5A and 5B do not show first wire 16, insulating film 17, insulating film 202, and infrared ray absorption layer 203.

Each of beam 102a and beam 102b has a phononic crystal structure structured by a plurality of regularly arranged through holes in order to improve the heat-insulation performance of resistance variable layer 201 against base substrate 11. The phononic crystal structure is desirably provided at section 112a between one end of beam 102a connected to base substrate 11 and one end of resistance variable layer 201 in beam 102a as seen in a plan view, and at section 112b between one end of beam 102b connected to base substrate 11 and the other end of resistance variable layer 201 in beam 102b as seen in a plan view.

Base substrate 11 is representatively structured by a semiconductor. The semiconductor is, for example, Si. The oxide film may be formed at upper surface 31 of base substrate 11 structured by Si. The oxide film is, for example, an $SiO_2$ film.

Resistance variable layer 201 is structured by a material exhibiting a great temperature coefficient of resistance, for example, amorphous Si, vanadium oxide, or platinum. Insulating film 202 is structured by, for example, SiN. The material of infrared ray absorption layer 203 is desirably metal (for example, Ti, Cr, Au, Al, Cu, or Ni) or a nitride (for example, TiN or SiN). Additionally, the material of infrared ray absorption layer 203 may be an oxide (for example, SiO).

First wire 16 is structured by, for example, a doped semiconductor, or metal. The metal is, for example, Al.

Second wires 14a, 14b, 14c, 14d are structured by, for example, a doped semiconductor, or metal. The metal is, for example, Al.

Insulating film 17 is provided in order to electrically insulate resistance variable layer 201 from Peltier device 12P. Insulating film 17 is structured by, for example, SiN.

Electrode pads 13a, 13b, 15a, 15b are structured by, for example, Al.

Electrode pads 13a, 13b are electrically connected to a signal processing circuit (not shown) that applies current to beams 101a, 101 b. Note that, the signal processing circuit may be provided on base substrate 11, or may be provided outside base substrate 11.

Electrode pads 15a, 15b are electrically connected to a signal processing circuit (not shown) that applies current to Peltier device 12P. Note that, the signal processing circuit may be provided on base substrate 11, or may be provided outside base substrate 11.

The following description relates to a phononic crystal structure that each of beams 101a, 101b, 102a, 102b has. As an example, a detailed description will be given of the phononic crystal structure of beam 101b. Note that, the description applies similarly to each of beams 101a, 102a, 102b.

Figure 7A:
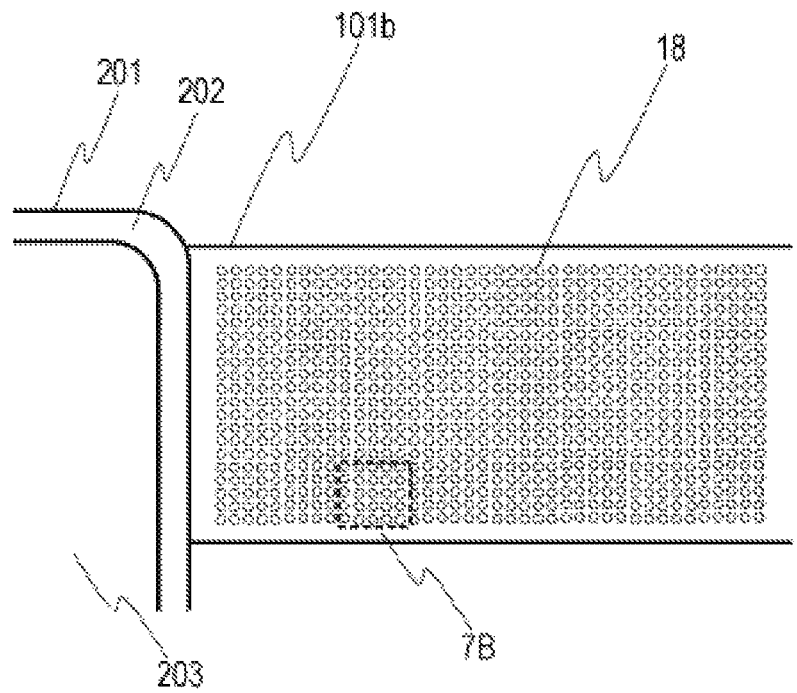
FIG. 7A is an exemplary schematic enlarged view around the resistance variable layer, an insulating film, the infrared ray absorption layer, and a beam in the infrared sensor according to the first exemplary embodiment.
Figure 7B:
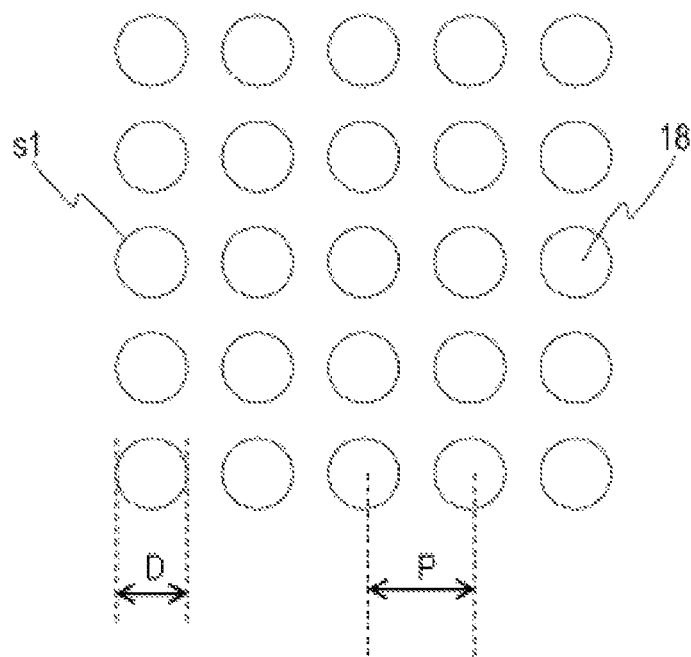
FIG. 7B is an enlarged view of region 7B of the phononic crystal structure shown in FIG. 7A.

FIGS. 7A and 7B show an exemplary phononic crystal structure. FIG. 7A is an exemplary schematic enlarged view around resistance variable layer 201, insulating film 202, infrared ray absorption layer 203, and beam 101b in infrared sensor 1A according to the first exemplary embodiment. FIG. 7B is an enlarged view of region 7B of the phononic crystal structure shown in FIG. 7A. Beam 101b is a thin film having a thickness falling within a range of, for example, 10 nm to 500 nm inclusive. Beam 101b is rectangular as seen in a plan view. The direction of the long side of beam 101b coincides with the direction connecting resistance variable layer 201 and second wire 14b, that is, the macroscopic heat transfer direction in infrared sensor 1A. Beam 101b is provided with a plurality of through holes 18 extending in the thickness direction of beam 101b. The phononic crystal structure of beam 101b is a two-dimensional phononic crystal structure in which a plurality of through holes 18 are regularly arranged in the in-plane direction. Thus, the phononic crystal structure has the periodic structure structured by a plurality of through holes 18.

A domain being the phononic crystal region is a region having an area of, for example, $25P^2$ or more as seen in a plan view, where P is the period of the arrangement of a plurality of through holes 18. Here, as shown in FIG. 7B, period P is determined by the center-to-center distance between adjacent through holes 18 as seen in a plan view.

In order to control the phonon dispersion relation by the phononic crystal structure, the domain may have an area of at least $25P^2$. In a square domain as seen in a plan view, the area of at least $25P^2$ can be secured with a period of at least 5×P.

Period P of the arrangement of through holes 18 falls within a range of, for example, 1 nm to 300 nm inclusive, because the wavelength of the phonon transferring heat mainly falls within a range of 1 nm to 300 nm. Through holes 18 arranged in each of beams 101a, 101b, 102a, 102b may differ or identical in period among beams 101a, 101b, 102a, 102b.

The shape of the opening of each through hole 18 shown in FIG. 7B is a circle. Diameter D of each of a plurality of through holes 18 is expressed in a ratio relative to period P, i.e., D/P, and for example, D/P≥0.5 holds. When a ratio D/P<0.5 holds, the void fraction in beam 101b excessively reduces, and the thermal conductivity may fail to satisfactorily reduce. Here, the upper limit of ratio D/P is, for example, less than 0.9, in order to avoid overlap between adjacent through holes 18. The shape of the opening of each through hole 18 is not necessarily a circle as seen in a plan view. In the case where the opening is not circular, diameter D is determined by a diameter of a virtual circle whose area is equivalent to that of the opening.

Figure 6A:
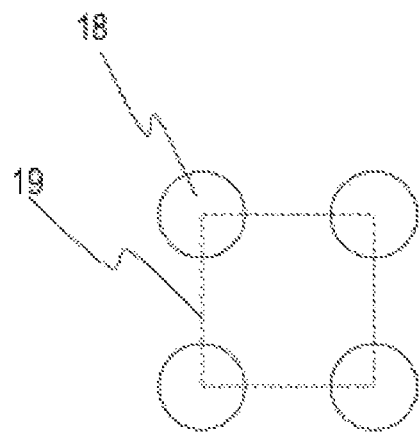
FIG. 6A is a schematic illustration of one example of a unit lattice of a periodic structure structuring a phononic crystal structure.
Figure 6B:
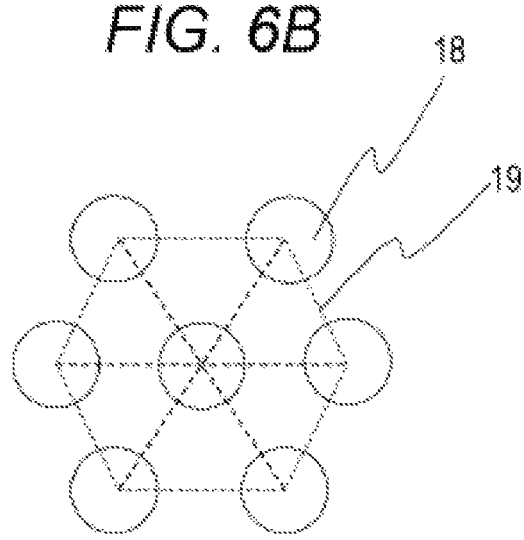
FIG. 6B is a schematic illustration of another example of the unit lattice of the periodic structure structuring the phononic crystal structure.
Figure 6C:
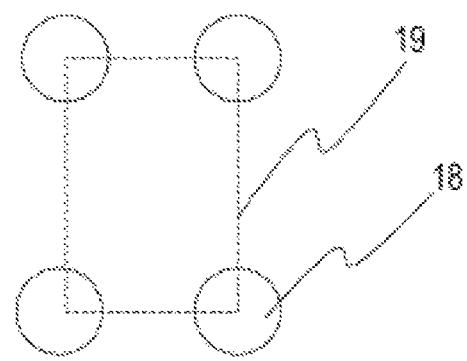
FIG. 6C is a schematic illustration of yet another example of the unit lattice of the periodic structure structuring the phononic crystal structure.
Figure 6D:
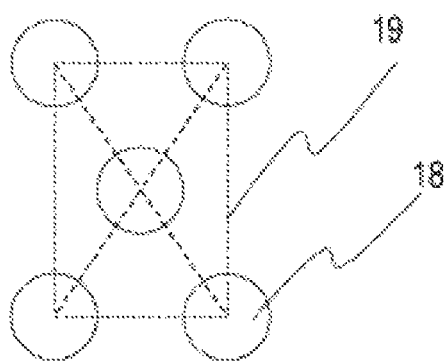
FIG. 6D is a schematic illustration of still another example of the unit lattice of the periodic structure structuring the phononic crystal structure.

The type of unit lattice 19 structured by a plurality of regularly arranged through holes 18 includes, for example, the tetragonal lattice (FIG. 6A), the hexagonal lattice (FIG. 6B), the rectangular lattice (FIG. 6C), and the centered-rectangular lattice (FIG. 6D). However, the type of unit lattice 19 is not limited thereto. The type of unit lattice 19 structuring the phononic crystal structure may be one, or two or more, over entire beam 101b.

In the following, an example of the phononic crystal structure is shown. A detailed description will be exemplarily given of the phononic crystal structure of beam 101b in the following. Note that, the description applies similarly to each of beams 101a, 102a, 102b.

Figure 8A:
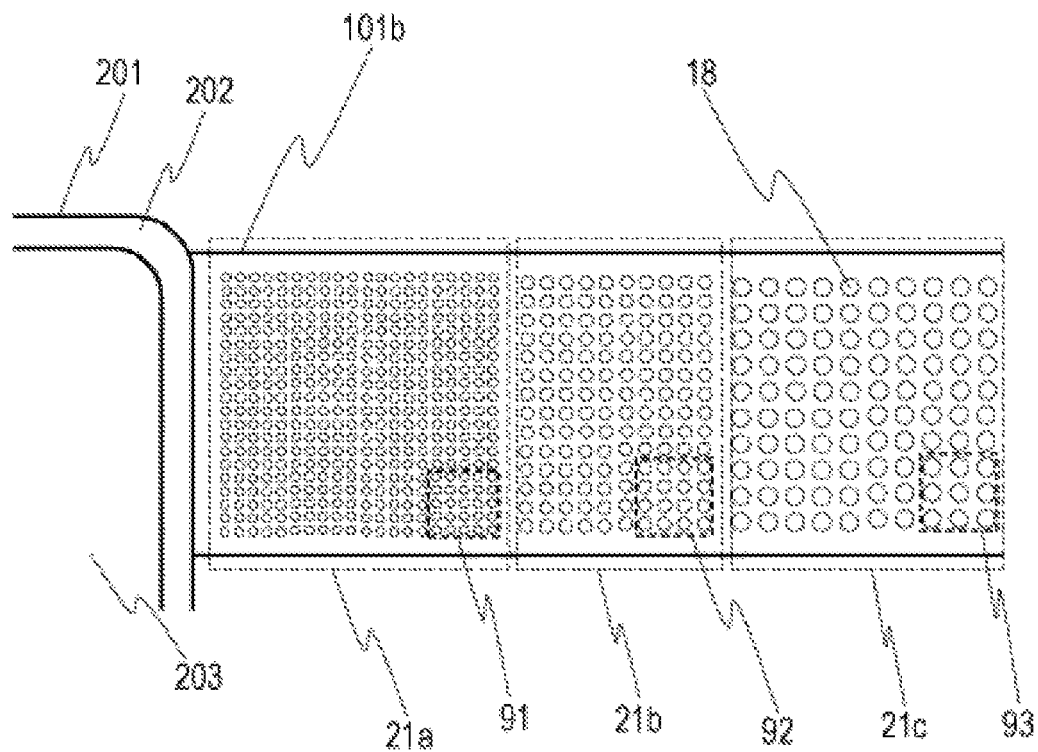
FIG. 8A is a schematic enlarged view of another example around the resistance variable layer, the insulating film, the infrared ray absorption layer, and the beam in the infrared sensor according to the first exemplary embodiment.

FIG. 8A is a schematic enlarged view of another example around resistance variable layer 201, insulating film 202, infrared ray absorption layer 203, and beam 101b in infrared sensor 1A according to the first exemplary embodiment. In this example, beam 101b has three phononic domains 21a, 21b, 21c.

Figure 8B:
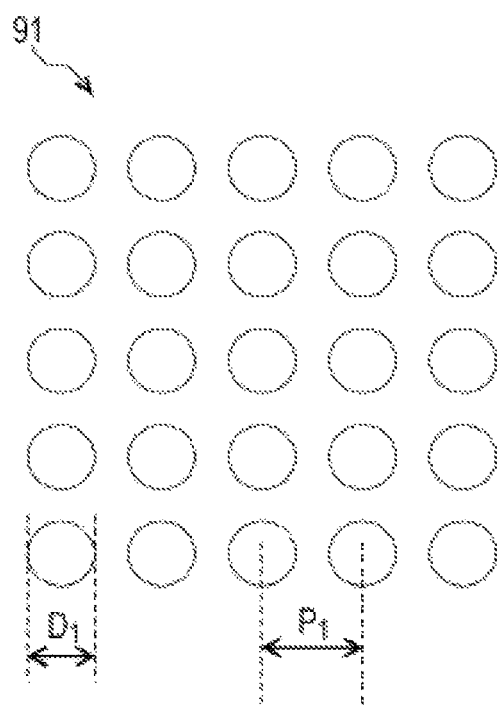
FIG. 8B is an enlarged view of a phononic domain shown in FIG. 8A.
Figure 8C:
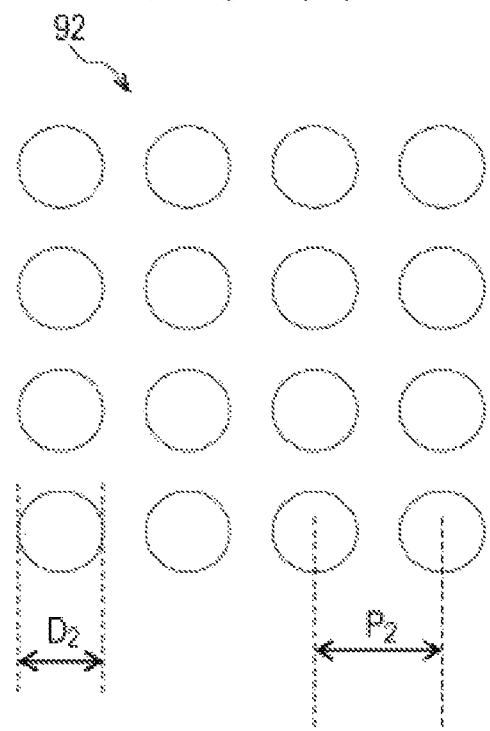
FIG. 8C is an enlarged view of a phononic domain shown in FIG. 8A.
Figure 8D:
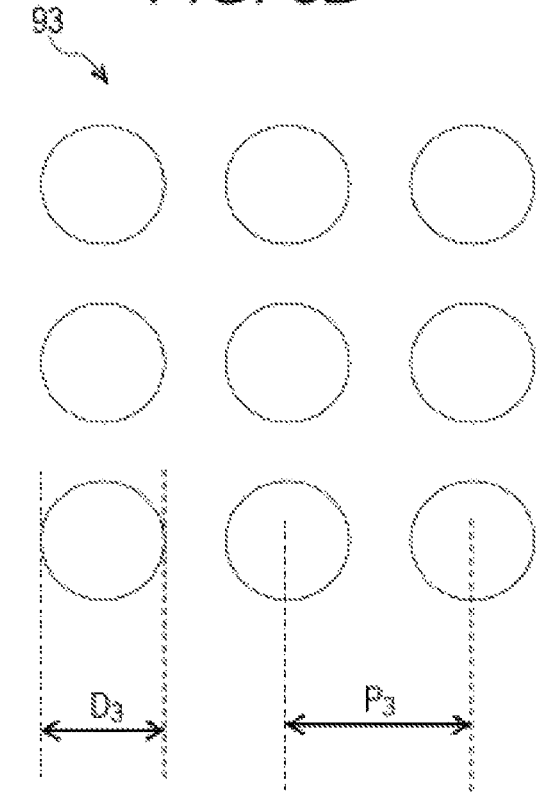
FIG. 8D is an enlarged view of a phononic domain shown in FIG. 8A.
Figure 9B:
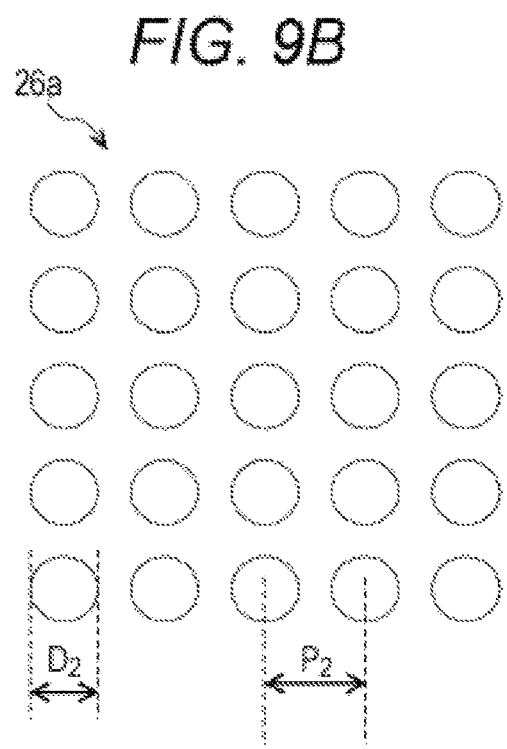
FIG. 9B is an enlarged view of a second periodic structure shown in FIG. 9A.
Figure 9C:
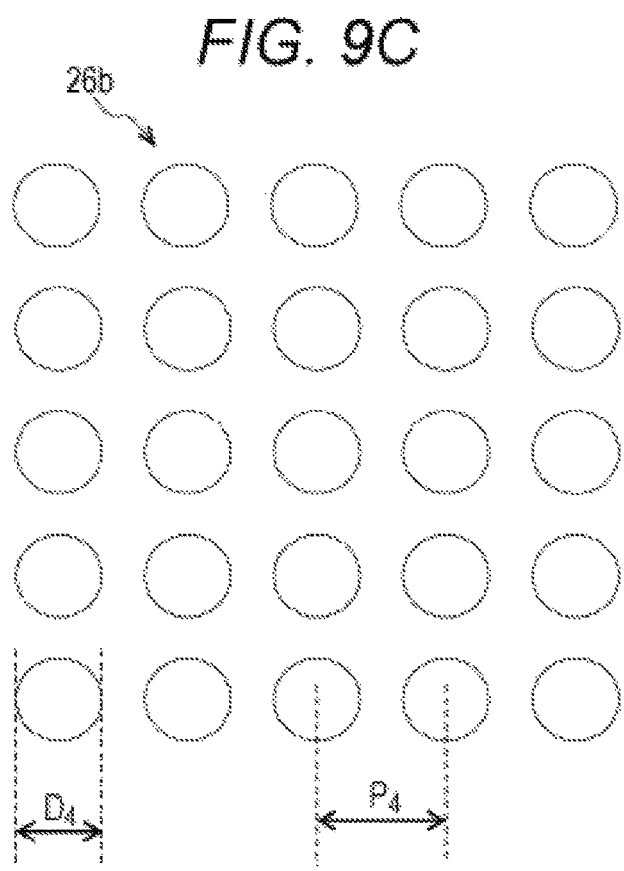
FIG. 9C is an enlarged view of a second periodic structure shown in FIG. 9A.

FIGS. 8B, 8C, and 8D are respectively enlarged views of one part 91 of phononic domain 21a, one part 92 of phononic domain 21b, and one part 93 of phononic domain 21c. As shown in FIG. 8B, phononic domain 21a has diameter $D_1$ and period $P_1$. As shown in FIG. 8C, phononic domain 21b has diameter $D_2$ and period $P_2$. As shown in FIG. 8D, phononic domain 21c has diameter $D_3$ and period $P_3$. In this example, $D_1<D_2<D_3$ and $P_1<P_2<P_3$ are satisfied. That is, as shown in FIG. 8A, the plurality of through holes 18 are arranged so that the diameter of through holes 18 increases and their arrangement period increases in the direction from infrared ray receiver 12A toward base substrate 11.

As an example, period $P_1$ may be 50 nm or smaller; period $P_2$ may be greater than 50 nm and equal to or smaller than 150 nm and period $P_3$ may be greater than 150 nm and may be equal to or smaller than 300 nm.

As another example, period $P_1$ may be 50 nm or smaller; period $P_2$ may fall within a range of 100 nm to 150 nm inclusive; and period $P_3$ may fall within a range of 200 nm to 300 nm inclusive.

When infrared sensor 1A receives an infrared ray, the temperature at resistance variable layer 201, insulating film 202, and infrared ray absorption layer 203 rises, and a temperature gradient occurs at beam 101b. At this time, the temperature is high on the resistance variable layer 201 side and low on the base substrate 11 side. Therefore, in beam 101b, the frequency of the thermal band on the resistance variable layer 201 side becomes higher than that on the base substrate 11 side. Accordingly, setting the PBG on the resistance variable layer 201 side to be high frequency and setting the PBG on the base substrate 11 side to be low frequency, that is, setting the period of through holes 18 to increase from resistance variable layer 201 toward base substrate 11 brings about further excellent heat-insulation performance.

Further, as the number of the phononic domain is greater, the heat-insulation effect improves. This is explained as follows. When the periodic structure of a plurality of through holes 18 is different among a plurality of phononic domains, beam 101b has a plurality of different phonon dispersions; between adjacent phononic domains, interfacial thermal resistance occurs due to a difference in phonon group velocity. The interval of arranged phononic domains may be regular or irregular.

FIG. 9A is a schematic enlarged view of another example around resistance variable layer 201, insulating film 202, infrared ray absorption layer 203, and beam 101b in infrared sensor 1A according to the first exemplary embodiment. In this example, beam 101b is structured by phononic domains 21a, 21b. Each of phononic domains 21a, 21b has, in the space among a plurality of through holes 18 structuring one periodic structure, a periodic structure being different from the one periodic structure.

Specifically, phononic domain 21a includes a multi-periodic structure being a hierarchy in which, in the space among first periodic structure 25a in which a plurality of through holes 18 each having diameter $D_1$ are arranged with period $P_1$, separate second periodic structure 26a in which a plurality of through holes 18 each having diameter $D_2$ are arranged with period $P_2$ (see FIG. 9B) exists. Phononic domain 21b includes a multi-periodic structure being a hierarchy in which, in the space among first periodic structure 25b in which a plurality of through holes 18 each having diameter $D_3$ are arranged with period $P_3$, separate second periodic structure 26b in which a plurality of through holes 18 each having diameter $D_4$ are arranged with period $P_4$ (see FIG. 9C) exists. In this manner, by a plurality of periodic structures being formed in one phononic domain, a plurality of PBGs are formed at once. Further, by a periodic structure being formed having a thermal band interposed between a plurality of PBGs, the band-edge effect lowers the group velocity of the phonon in the thermal band. This attains the effect of further reducing the thermal conductivity.

In the example shown in FIG. 9A also, similarly to the example shown in FIG. 8A, adjacent phononic domains are different from each other in periodic structure. Specifically, in beam 101b, first periodic structures 25a, 25b and second periodic structures 26a, 26b are arranged so that their respective periods increase in the direction from resistance variable layer 201 toward base substrate 11. That is, $P_1<P_3$, and $P_2<P_4$ are satisfied. Note that, when at least one of $P_1<P_3$ and $P_2<P_4$ is satisfied, the effect similar to that the example shown in FIG. 8A exhibits is achieved.

For example, period $P_1$ may be 150 nm or smaller, and period $P_3$ may fall within a range of 200 nm to 300 nm inclusive. For example, period $P_2$ may be 150 nm or smaller, and period $P_4$ may fall within a range of 200 nm to 300 nm inclusive.

Note that, in FIG. 9A, while two types of periodic structures are formed in one phononic domain, three or more types of periodic structures may form one phononic domain. For example, in the space among first periodic structure 25a in which a plurality of through holes each having diameter $D_1$ are arranged with period $P_1$, second periodic structure 26a in which through holes each having diameter $D_2$ arranged with period $P_2$ may exist; and further, in the space among second periodic structure 26a, a third separate periodic structure may exist.

FIG. 10A is a schematic enlarged view of still another example around resistance variable layer 201, insulating film 202, infrared ray absorption layer 203, and beam 101b in infrared sensor 1A according to the first exemplary embodiment. In this example, beam 101b is structured by phononic domains 21a, 21b. Phononic domain 21a includes a plurality of micro periodic structures 27a formed by a plurality of through holes 18 each having diameter $D_1$ being arranged with period Psi (see FIG. 10B). Phononic domain 21b includes a plurality of micro periodic structures 27b formed by a plurality of through holes 18 each having diameter $D_2$ being arranged with period $P_{s2}$ (see FIG. 10O). In this example, $D_1=D_2$, and $P_{s1}=P_{s2}$ are satisfied. Micro periodic structures 27a, 27b are respectively referred to as sub phononic domains 28a, 28b.

Sub phononic domains 28a structuring phononic domain 21a are in a uniform shape, and arranged at intervals of period $P_{m1}$ to form macro periodic structure 29a. Similarly, sub phononic domain 28b structuring phononic domain 21b are in a uniform shape, and arranged at intervals of period $P_{m2}$ to form macro periodic structure 29b. Note that, the shape of sub phononic domains 28a, 28b may each be a circle so long as the shape is uniform among sub phononic domains 28a, 28b, and may be a polygon such as a triangle, a quadrangle, or a hexagon.

When length $L_s$ of one side of each sub phononic domain 28a (see FIG. 10A) is satisfactorily small relative to the whole shape of phononic domain 21a, for example, when $L_s$/width W of beam 101b (see FIG. 10A)<0.2 is satisfied in the present exemplary embodiment, one sub phononic domain 28a functions as one large through hole for a long-wavelength phonon as schematically shown in FIG. 11. Therefore, sub phononic domain 28a exhibits the heat-insulation performance as a phononic crystal structure for a long-wavelength phonon. Sub phononic domain 28b exhibits the effect similar to that sub phononic domain 28a does.

On the other hand, for a short-wavelength phonon, micro periodic structure 27a in sub phononic domain 28a exhibits the heat-insulation performance. Micro periodic structure 27b also exhibits the effect similar to that micro periodic structure 27a does.

Period $P_{s1}$ of a plurality of through holes 18 structuring micro periodic structure 27a needs to satisfy $P_{s1}/L_s \leq 0.1$. This is explained as follows. When $P_{s1}/L_s>0.1$, a long-wavelength phonon is scattered by micro periodic structure 27a and fails to function as a phononic crystal structure.

In this manner, by a plurality of periodic structures being formed in one phononic domain, a plurality of PBGs are formed at once. By a periodic structure being formed having a thermal band interposed between a plurality of PBGs, the band-edge effect lowers the group velocity of the phonon in the thermal band. This attains the effect of further reducing the thermal conductivity.

In the example shown in FIG. 10A also, similarly to the example shown in FIG. 8A, adjacent phononic domains are different from each other in periodic structure. Specifically, in beam 101b, as shown in FIG. 10A, macro periodic structures 29a, 29b are arranged so that their respective periods increase in the direction from resistance variable layer 201 toward base substrate 11. That is, $P_{m1}<P_{m2}$ is satisfied. Note that, the effect similar to that exhibited in FIG. 8A is exhibited without the necessity of satisfying the condition $P_{m1}<P_{m2}$, so long as the condition $P_{s1}<P_{s2}$ is satisfied.

Respective periods $P_{s1}$, $P_{s2}$ of micro periodic structures 27a, 27b preferably fall within a range of 1 nm to 30 nm inclusive. On the other hand, respective periods $P_{m1}$, $P_{m2}$ of macro periodic structures 29a, 29b preferably fall within a range of 10 nm to 300 nm inclusive corresponding to respective periods $P_{s1}$, $P_{s2}$ of micro periodic structures 27a, 27b.

In micro periodic structures 27a, 27b respectively structuring sub phononic domains 28a, 28b, a plurality of through holes for at least five periods need to be aligned. That is, at least five through holes 18 need to be provided. This condition holds true for macro periodic structures 29a, 29b respectively formed by sub phononic domains 28a, 28 b.

The shape of phononic domains 21a, 21b may each be a circle or a polygon.

In the following, a description will be given of an exemplary method for manufacturing infrared sensor 1A according to the first exemplary embodiment.

Figure 12A:
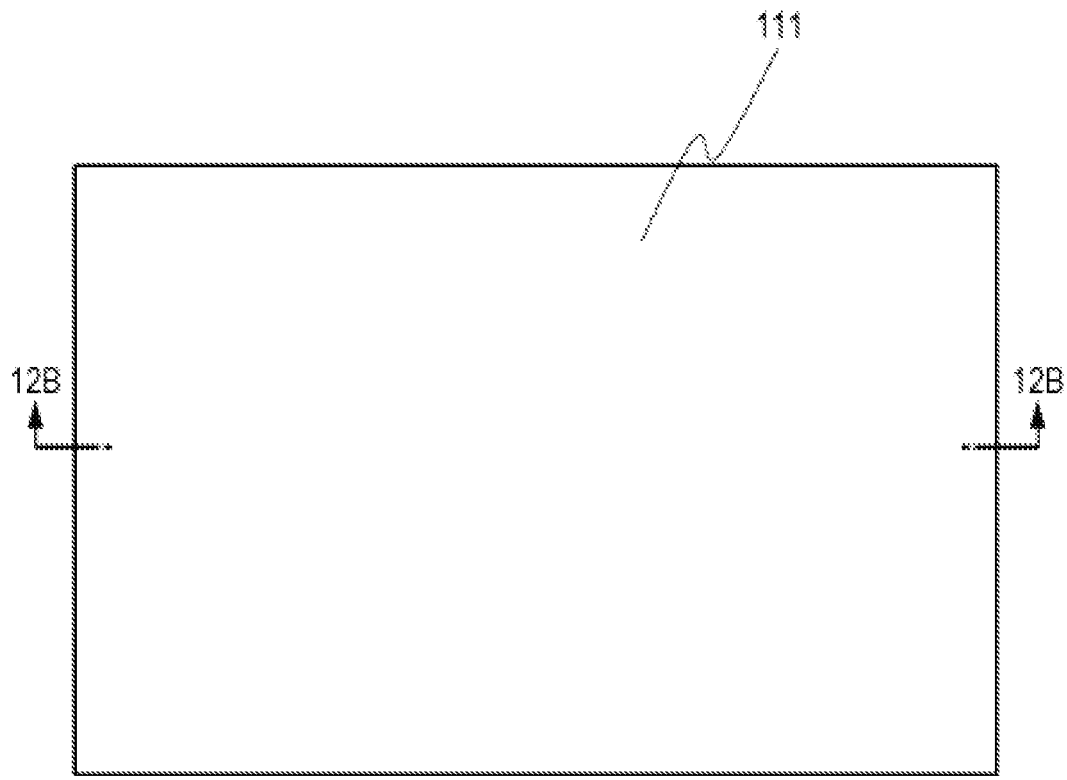
FIG. 12A is a schematic plan view for describing an exemplary method for manufacturing the infrared sensor according to the first exemplary embodiment.
Figure 12B:
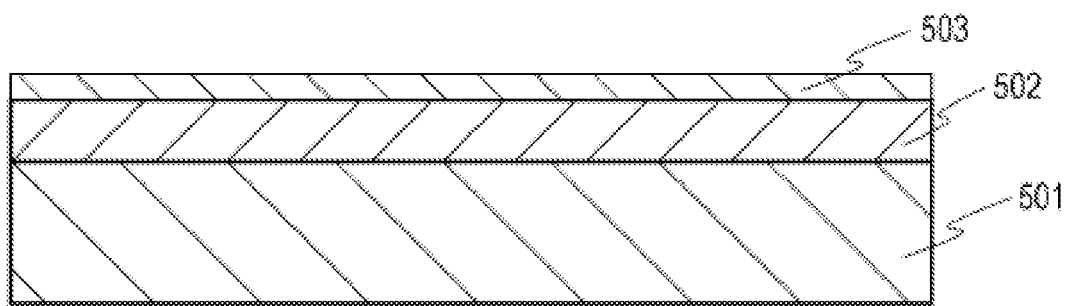
FIG. 12B is a schematic cross-sectional view taken along line 12B-12B in FIG. 12A.

Firstly, Silicon On Insulator (SOI) wafer 111 is provided. As shown in FIGS. 12A and 12B, SOI wafer 111 has a layered structure made up of lower Si layer 501, intermediate $SiO_2$ layer 502, and upper Si layer 503.

Alternatively, in place of SOI wafer 111, it is also possible to use a layered structure in which, on a semiconductor substrate (for example, an Si substrate), a sacrificial layer formed of polyimide or $SiO_2$ is formed, and an Si thin film or an SiGe thin film having a thickness falling within a range of 10 nm to 500 nm inclusive is formed on the sacrificial layer.

Figure 13A:
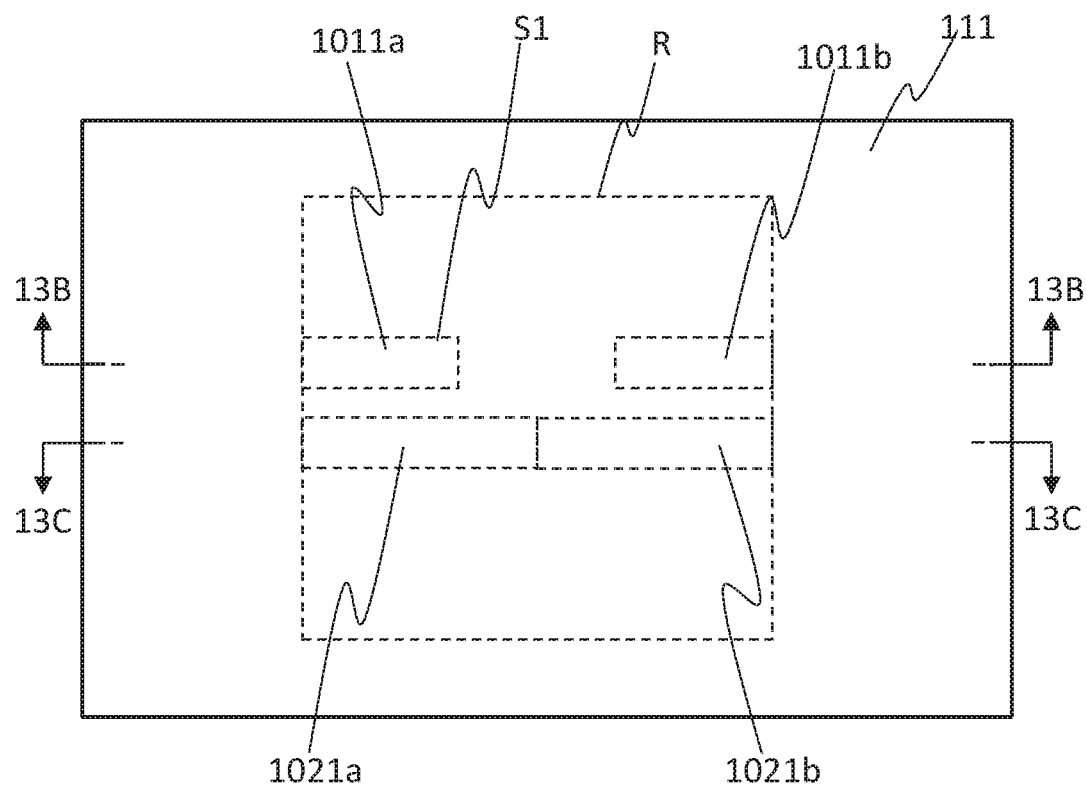
FIG. 13A is a schematic plan view for describing an exemplary method for manufacturing the infrared sensor according to the first exemplary embodiment.
Figure 13B:
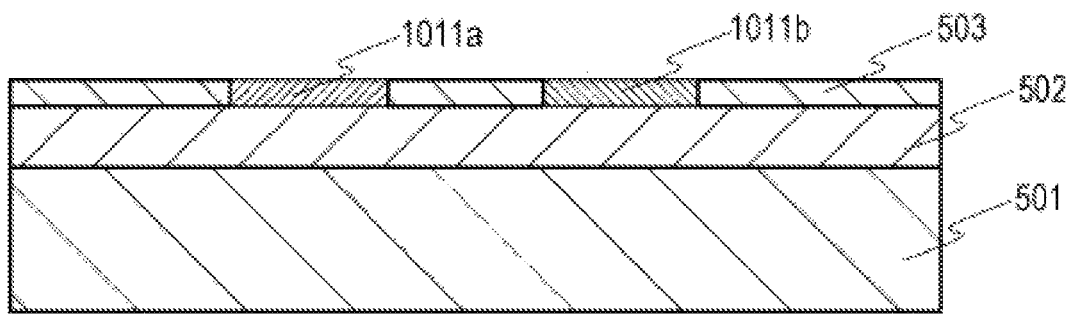
FIG. 13B is a schematic cross-sectional view taken along line 13B-13B in FIG. 13A.
Figure 13C:
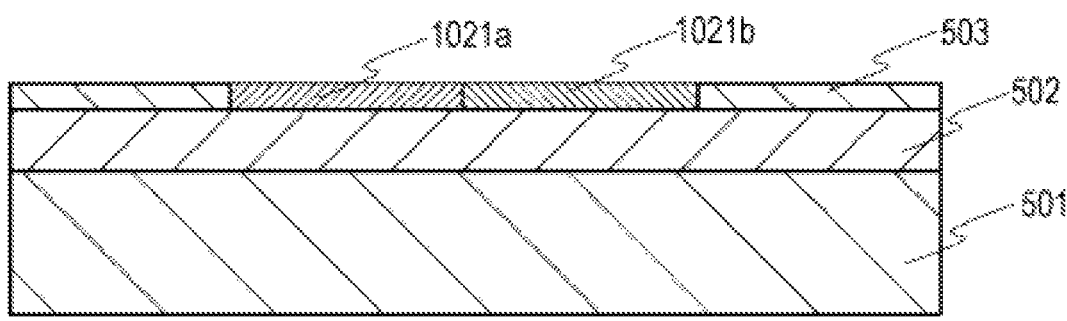
FIG. 13C is a schematic cross-sectional view taken along line 13C-13C in FIG. 13A.

Next, as shown in FIGS. 13A to 13C, by photolithography and ion injection, region 1011a to be beam 101a, region 1011b to be beam 101b, region 1021a to be beam 102a, and region 1021b to be beam 102b are ion-doped. At this time, regions 1021a, 1021b undergo different doping processes. Note that, regions 1011a, 1011b, 1021a, 1021b are included in region R having a quadrangular outer shape.

Next, SOI wafer 111 undergoes heat treatment. This activates the ions injected in the doping process.

Figure 13D:
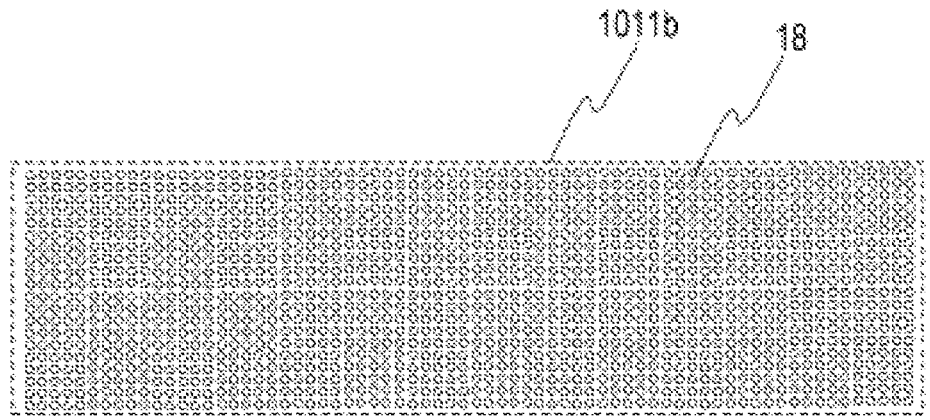
FIG. 13D is an enlarged view of region 1011b where a plurality of through holes are formed.
Figure 14A:
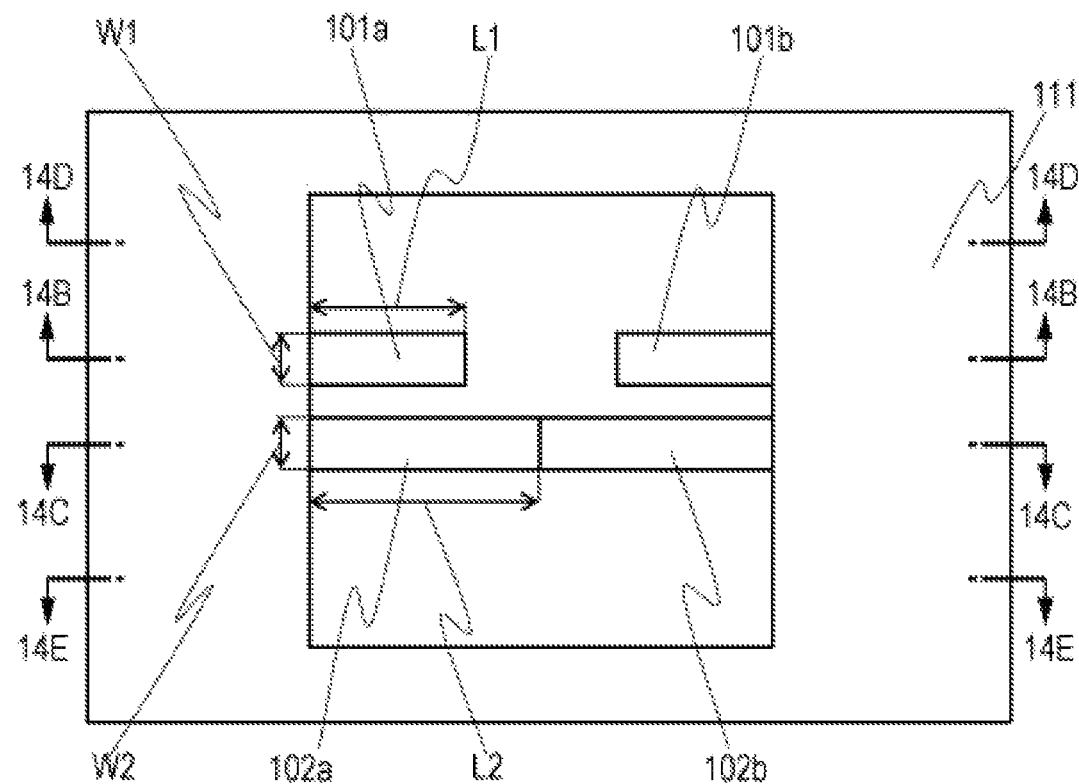
FIG. 14A is a schematic plan view for describing an exemplary method for manufacturing the infrared sensor according to the first exemplary embodiment.
Figure 14B:
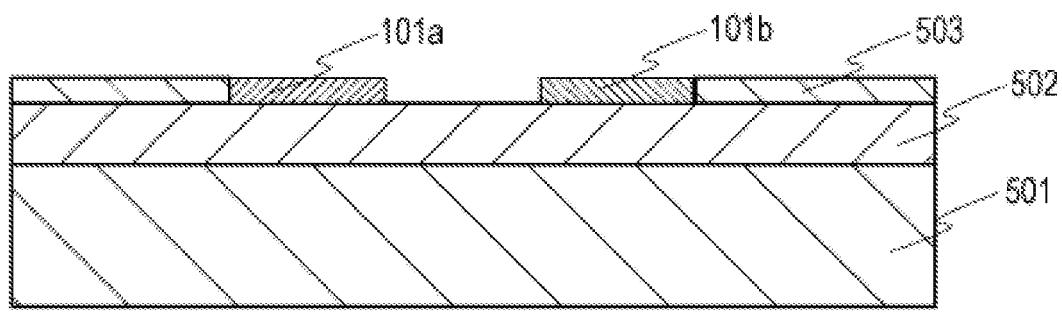
FIG. 14B is a schematic cross-sectional view taken along line 14B-14B in FIG. 14A.
Figure 14C:
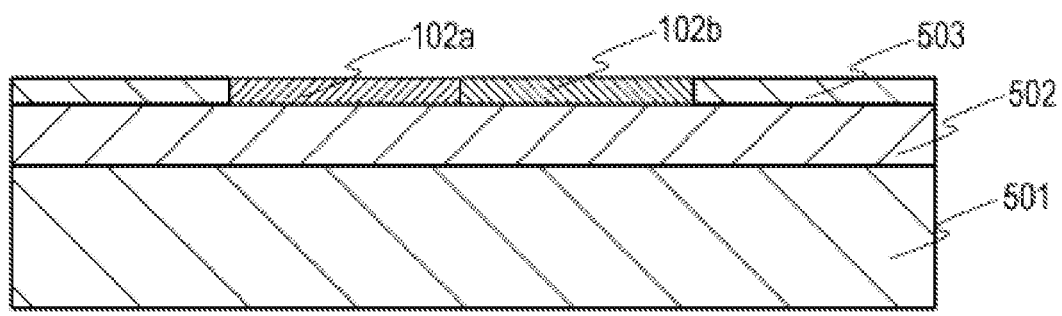
FIG. 14C is a schematic cross-sectional view taken along line 14C-14C in FIG. 14A.
Figure 14D:
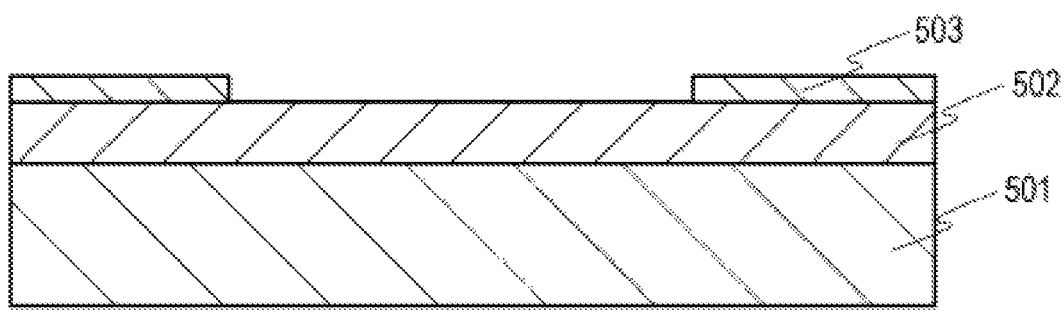
FIG. 14D is a schematic cross-sectional view taken along line 14D-14D in FIG. 14A.
Figure 14E:
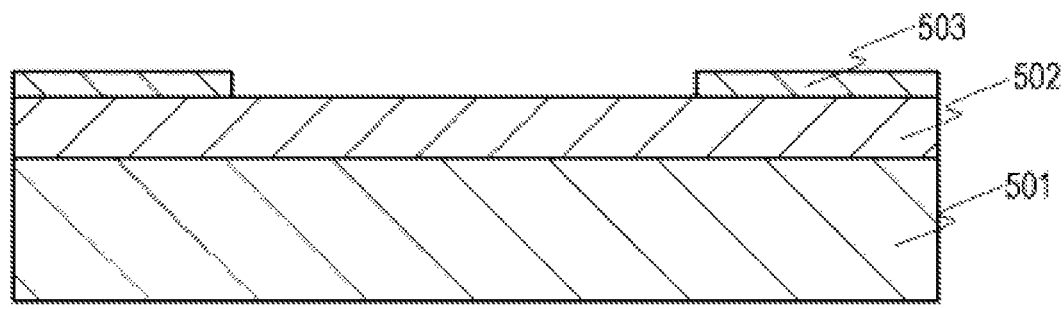
FIG. 14E is a schematic cross-sectional view taken along line 14E-14E in FIG. 14A.

Next, a plurality of through holes 18 are periodically formed in regions 1011a, 1011b, 1021a, 1022b. As an example, FIG. 13D shows an enlarged view of region 1011b where the plurality of through holes 18 are formed. Note that, FIGS. 13A to 13C do not show through holes 18. In forming through holes having a periodic structure falling within a range of 100 nm to 300 nm inclusive, electron beam lithography is used. In forming through holes having a periodic structure falling within a range of 1 nm to 100 nm inclusive, block copolymer lithography is used. In this manner, a phononic crystal structure is formed.

Next, as shown in FIGS. 14A to 14E, Si layer 503 in region R (FIG. 13A) excluding regions 1011a, 1011b, 1021a, 1021b is removed by photolithography and etching, to form beams 101a, 101b, 102a, 102b.

Figure 15A:
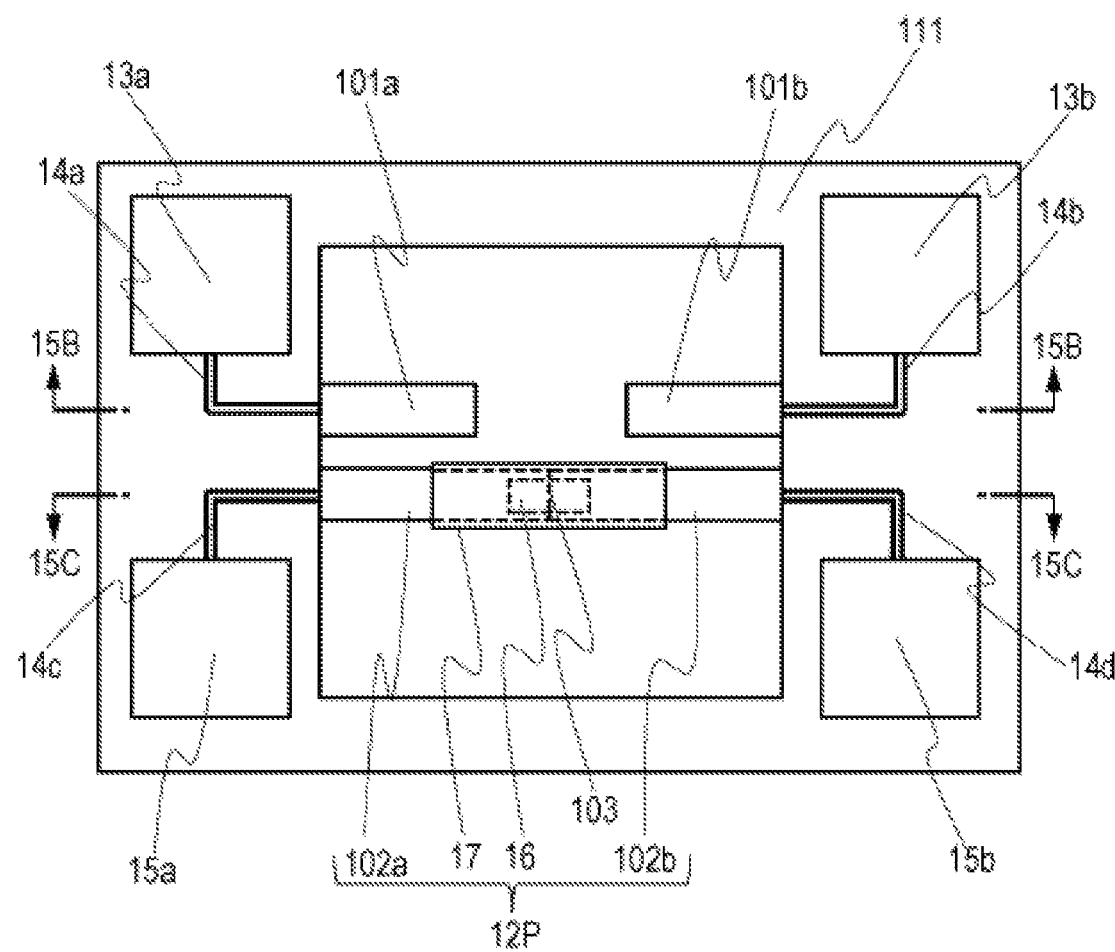
FIG. 15A is a schematic plan view for describing an exemplary method for manufacturing the infrared sensor according to the first exemplary embodiment.
Figure 15B:
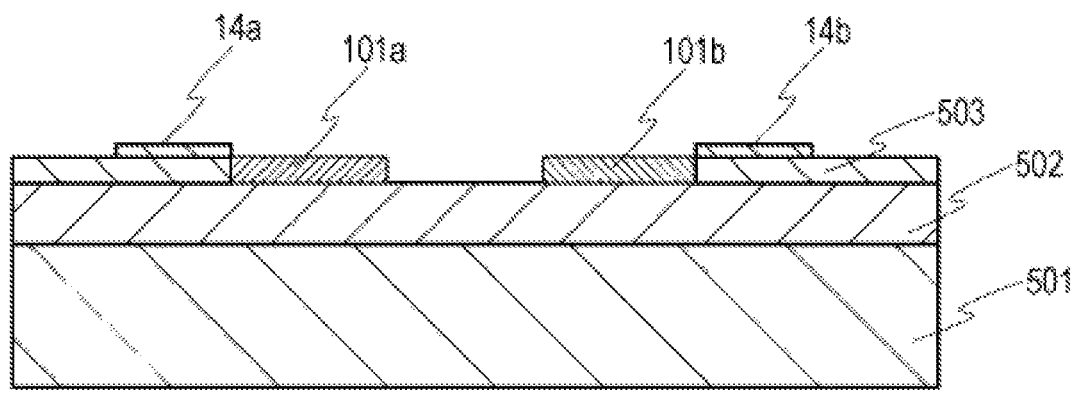
FIG. 15B is a schematic cross-sectional view taken along line 15B-15B in FIG. 15A.
Figure 15C:
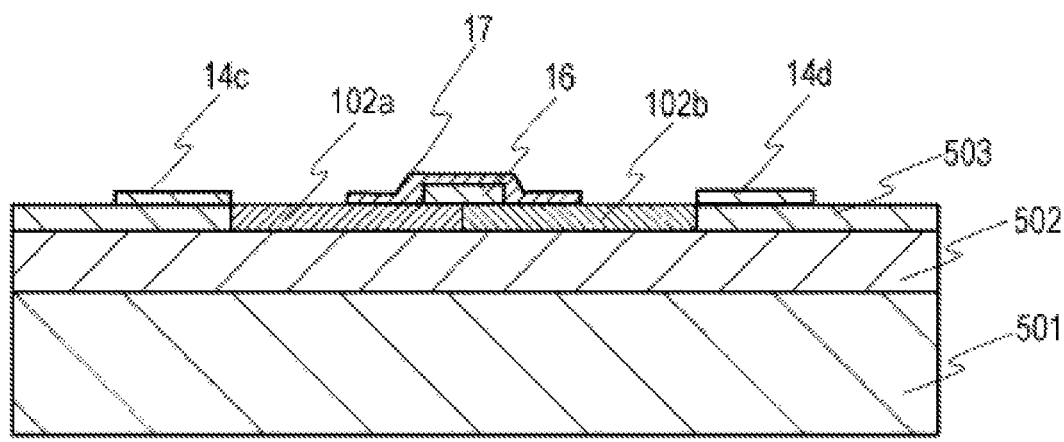
FIG. 15C is a schematic cross-sectional view taken along line 15C-15C in FIG. 15A.

Next, as shown in FIGS. 15A to 15C, using photolithography, etching, and any known thin film forming method (for example, sputtering, vapor deposition, or chemical vapor deposition (CVD)), second wires 14a, 14b, 14c, 14d and electrode pads 13a, 13b, 15a, 15b are formed. At the same time, using the similar scheme, first wire 16 that electrically connects beams 102a, 102b is formed. Then, by photolithography and any known thin film forming method, insulating film 17 formed of SiN is formed so as to cover first wire 16.

Figure 16A:
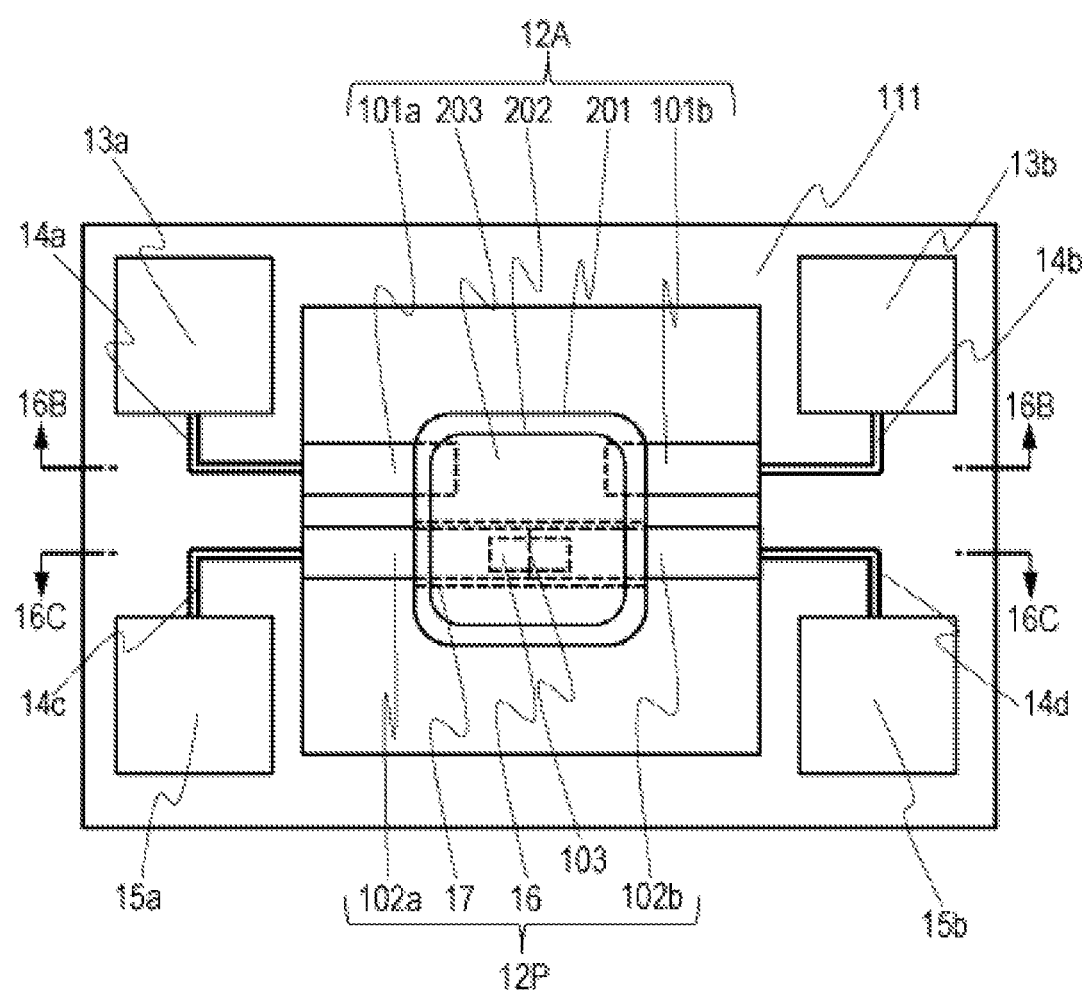
FIG. 16A is a schematic plan view for describing an exemplary method for manufacturing the infrared sensor according to the first exemplary embodiment.
Figure 16B:
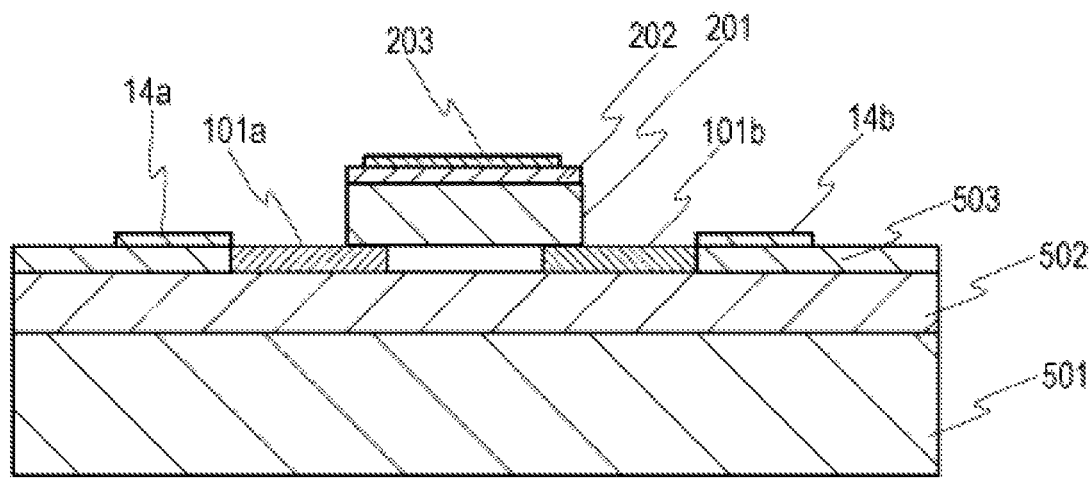
FIG. 16B is a schematic cross-sectional view taken along line 16B-16B in FIG. 16A.
Figure 16C:
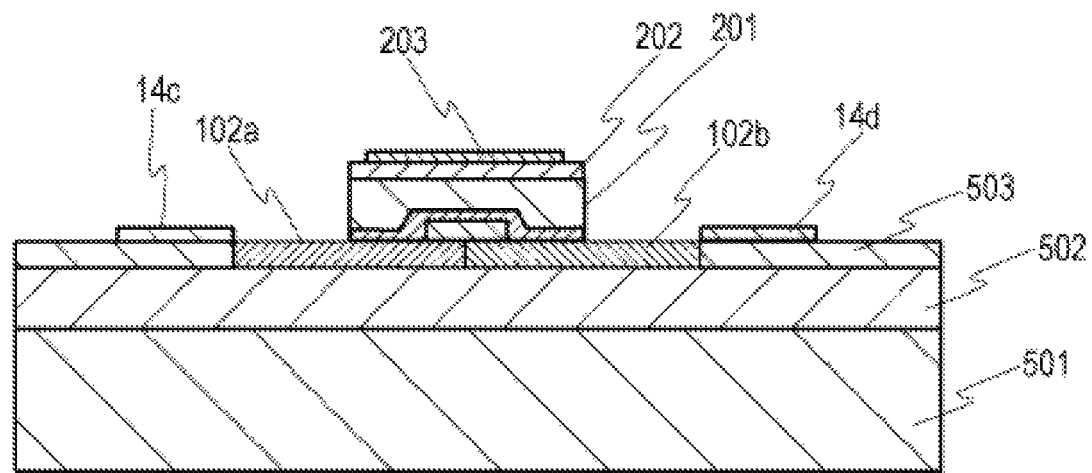
FIG. 16C is a schematic cross-sectional view taken along line 16C-16C in FIG. 16A.

Next, as shown in FIGS. 16A to 16C, by photolithography and any known thin film forming method, resistance variable layer 201, insulating film 202, and infrared ray absorption layer 203 are layered, to form infrared ray receiver 12A. In the case where infrared ray absorption layer 203 consisted of Ti, TiN, or SiN is used, a protective film formed of Si may be further formed on infrared ray absorption layer 203, in order to protect infrared ray absorption layer 203 in the following step of performing hydrogen fluoride vapor phase etching.

Figure 17A:
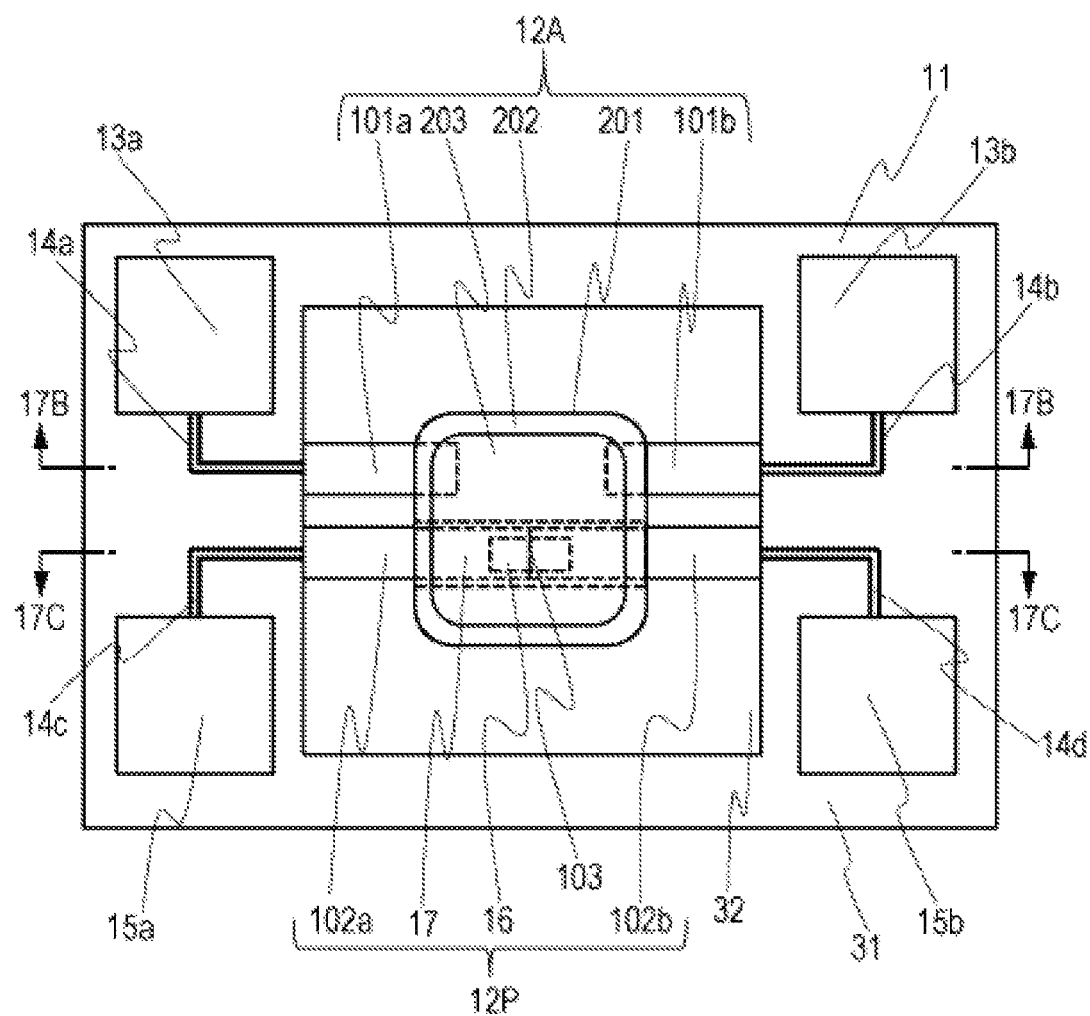
FIG. 17A is a schematic plan view for describing an exemplary method for manufacturing the infrared sensor according to the first exemplary embodiment.
Figure 17B:
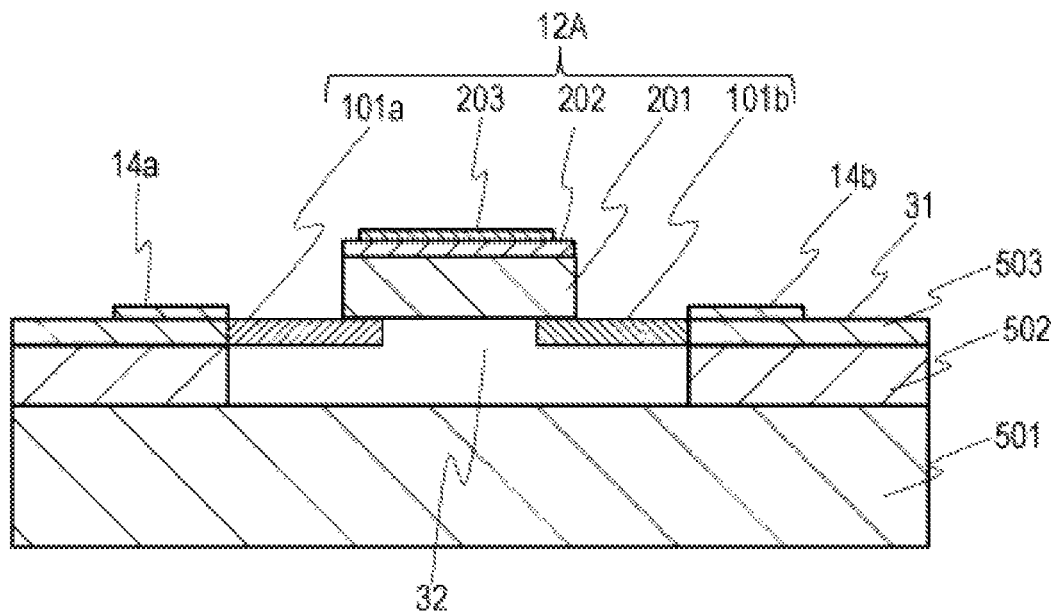
FIG. 17B is a schematic cross-sectional view taken along line 17B-17B in FIG. 17A.
Figure 17C:
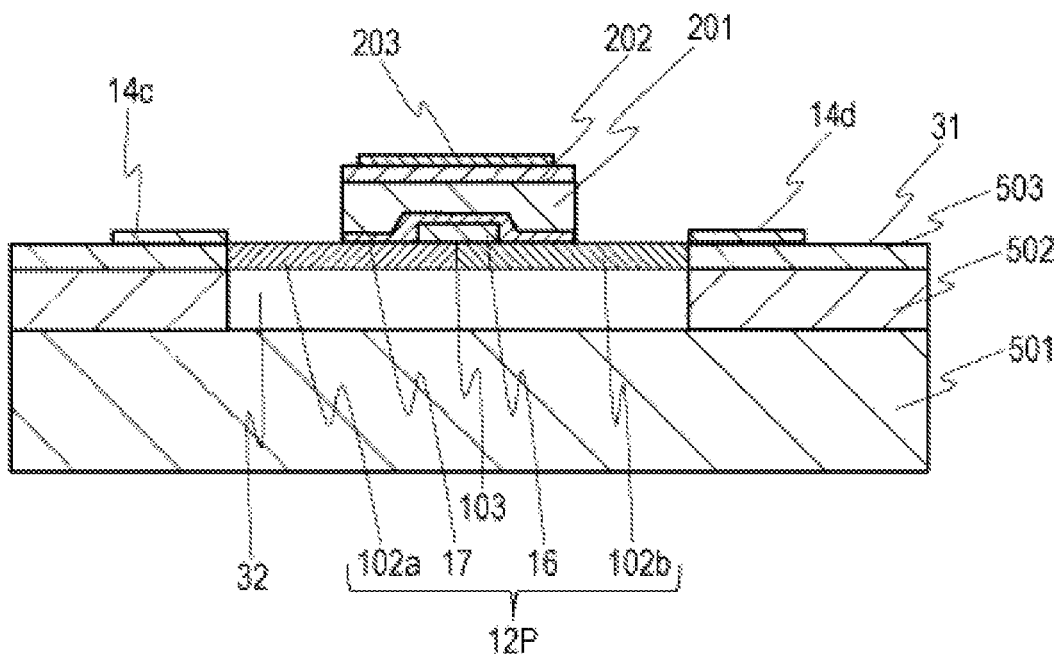
FIG. 17C is schematic cross-sectional view taken along line 17C-17C in FIG. 17A.

Finally, as shown in FIGS. 17A to 17C, by hydrogen fluoride vapor phase etching, intermediate SiO$_2$ layer 502 at SOI wafer 111 is partially removed.

In the foregoing manner, infrared sensor 1A according to the first exemplary embodiment is fabricated.

In the following, a description will be given of an operation of infrared sensor 1A according to the first exemplary embodiment. The operation includes two stages.

In the first stage, the intensity of an infrared ray becoming incident on infrared ray absorption layer 203 via beams 101a, 101b is measured. Specifically, firstly, a signal processing circuit applies constant voltage to beams 101a, 101b via electrode pads 13a, 13b and second wires 14a, 14b, and the signal processing circuit monitors the amount of current passing through resistance variable layer 201. Next, when an infrared ray becomes incident on infrared ray absorption layer 203, infrared ray absorption layer 203 absorbs the infrared ray. Thus, the temperature of insulating film 202 and resistance variable layer 201 being thermally in contact with infrared ray absorption layer 203 and infrared ray absorption layer 203 rises. As a result, in response to the change in temperature of resistance variable layer 201, the electrical resistance of resistance variable layer 201 changes. The signal processing circuit measures a change in the current amount in response to the change in electrical resistance of resistance variable layer 201 at this time, to calculate the intensity of the infrared ray.

Figure 32A:
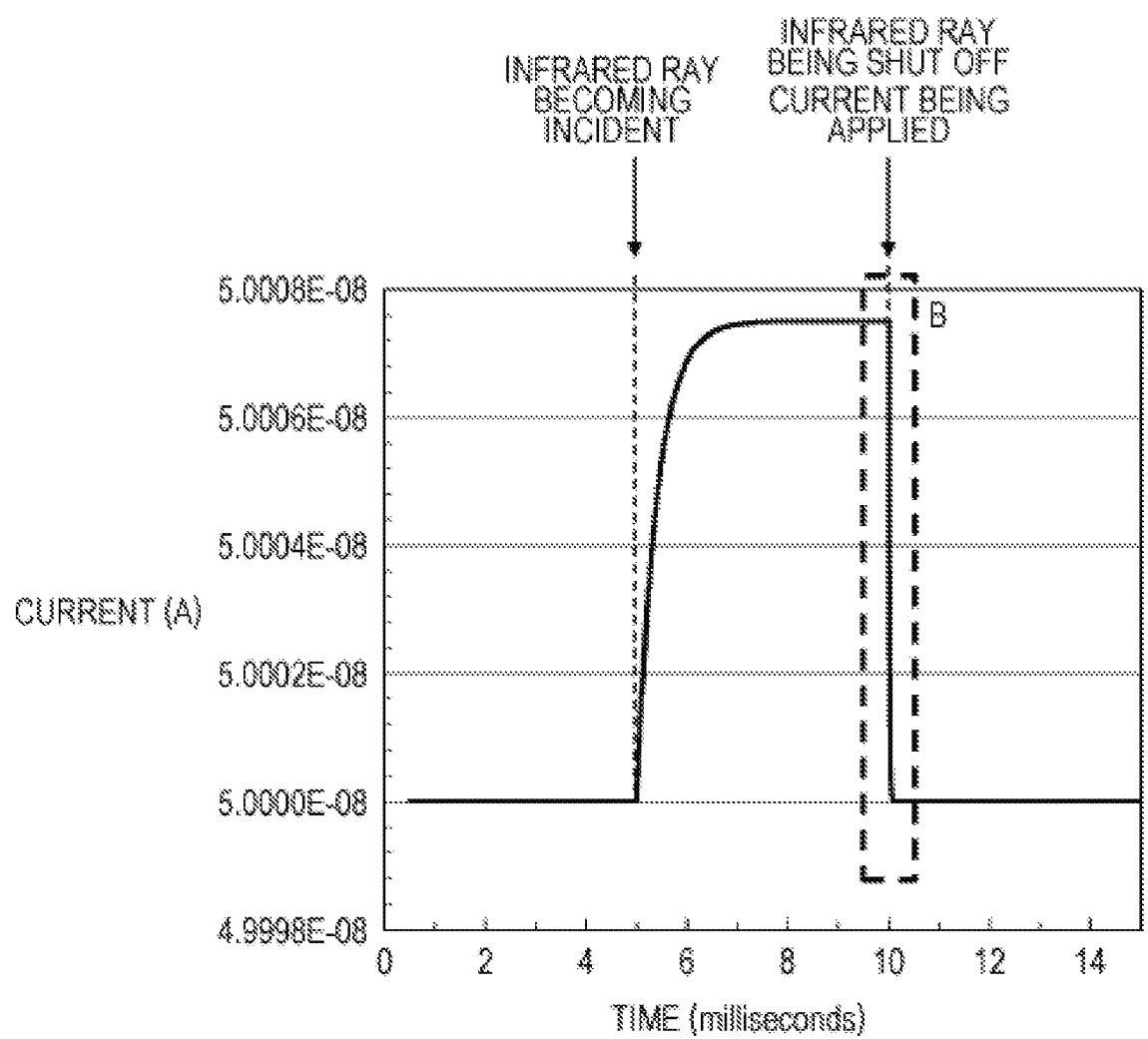
FIG. 32A is a graph showing a result of a time-response test when current is passed through beams of an infrared sensor according to Example 1.

As will be described later, each of beams 101a, 101b, 102a, 102b of the infrared sensor according to Example 1 has a phononic crystal structure, and the infrared sensor according to Example 1 is excellent in detection sensitivity (see FIG. 32A). On the other hand, each of beams 101a, 101b, 102a, 102b of the infrared sensor according to Comparative example 1 does not have the phononic crystal structure, and the detection sensitivity thereof is poor as compared to the infrared sensor according to Example 1 (see FIG. 32E). Note that, the vertical axis in the graph of FIG. 32A represents the current value measured by the signal processing circuit. As the current value is greater, the detection sensitivity is higher. In this manner, providing the phononic crystal structure to each of beams 101a, 101b, 102a, 102b thereby improving the heat-insulation performance of the beams improves the detection sensitivity of infrared sensor 1A.

Next, the operation transits to the second stage.

In the second stage, resistance variable layer 201, insulating film 202, and infrared ray absorption layer 203 are cooled using Peltier device 12P, and the temperature of resistance variable layer 201, insulating film 202, and infrared ray absorption layer 203 having raised in response to the incident infrared ray recovers the ambient temperature. In order to cool resistance variable layer 201, insulating film 202, and infrared ray absorption layer 203, the signal processing circuit applies pulsed current to beams 102a, 102b via electrode pads 15a, 15b and second wires 14c, 14d. As a result, by virtue of the Peltier effect, resistance variable layer 201, insulating film 202, and infrared ray absorption layer 203 are cooled. This makes it possible to instantaneously cool the temperature of infrared ray receiver 12A to the ambient temperature. As will be described later, applying current to Peltier device 12P of infrared sensor according to Example 1 after shutting off the infrared ray will largely shorten the falling time, that is, the cooling time (see FIGS. 32B and 32D). Accordingly, the cooling achieved by the Peltier device 12P largely improves the response speed of infrared sensor 1A.

Note that, the reason why the Peltier effect is exhibited despite beams 102a, 102b each having the phononic crystal structure being excellent in heat-insulation performance is as follows.

Heat is transferred by lattice vibrations called phonons, or conduction electrons. Because of beams 102a, 102b each having the phononic crystal structure, heat transfer by the lattice vibrations is suppressed. On the other hand, the phononic crystal structure merely slightly suppresses, by the simply increased voids, conduction of heat by conduction electrons. Therefore, the applying current to beams 102a, 102b achieves the above-described Peltier effect.

Infrared sensor 1A operates in the foregoing manner.

Figure 2:
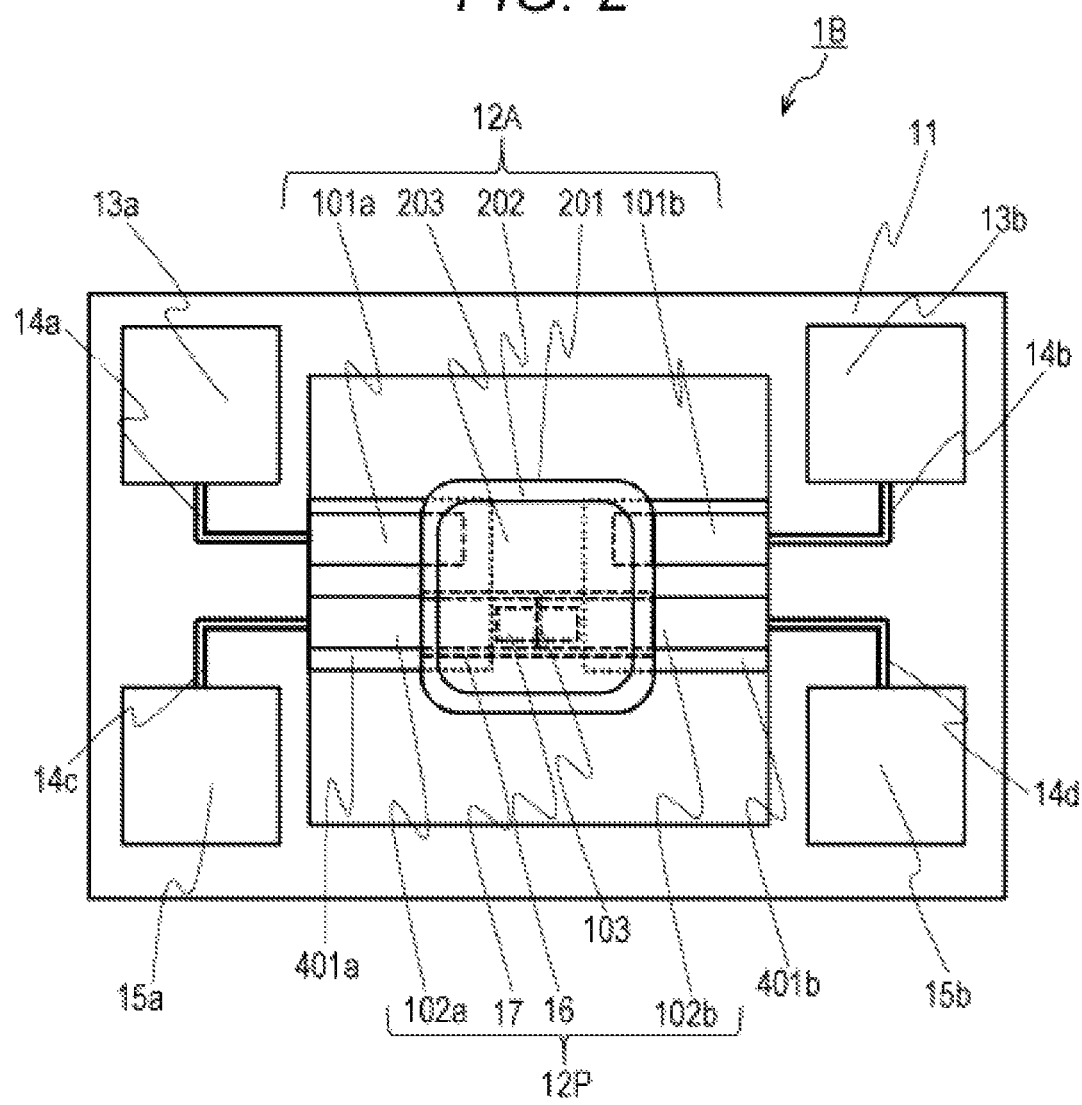
FIG. 2 is a schematic plan view of another example of the infrared sensor according to the first exemplary embodiment.

As shown in FIG. 2, infrared sensor 1B being a variation of infrared sensor 1A further includes insulator 401a that physically connects beam 101a and beam 102a, and insulator 401b that physically connects beam 101b and beam 102b. This improves the mechanical strength for suspending resistance variable layer 201, insulating film 202, and infrared ray absorption layer 203. Note that, insulators 401a, 401b are structured by an insulating material. This secures electrical insulation between beam 101a and beam 102a, and between beam 101b and beam 102b.

Figure 3:
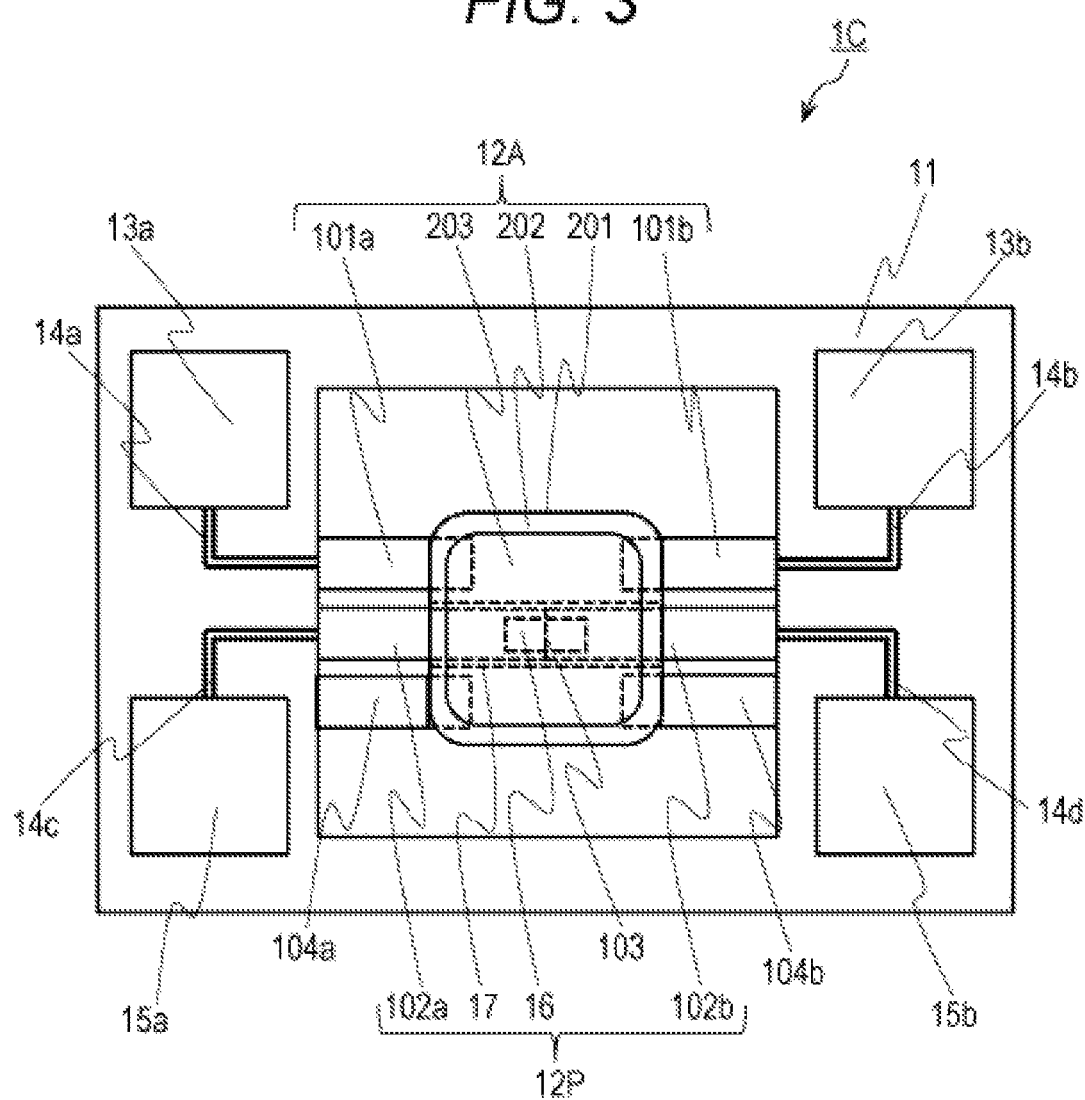
FIG. 3 is a schematic plan view of yet another example of the infrared sensor according to the first exemplary embodiment.

As shown in FIG. 3, infrared sensor 10 being other variation of infrared sensor 1A further includes, in addition to beams 101a, 101b, 102a, 102b, beams 104a, 104b. This improves the mechanical strength for suspending resistance variable layer 201, insulating film 202, and infrared ray absorption layer 203.

Second Exemplary Embodiment

Figure 18A:
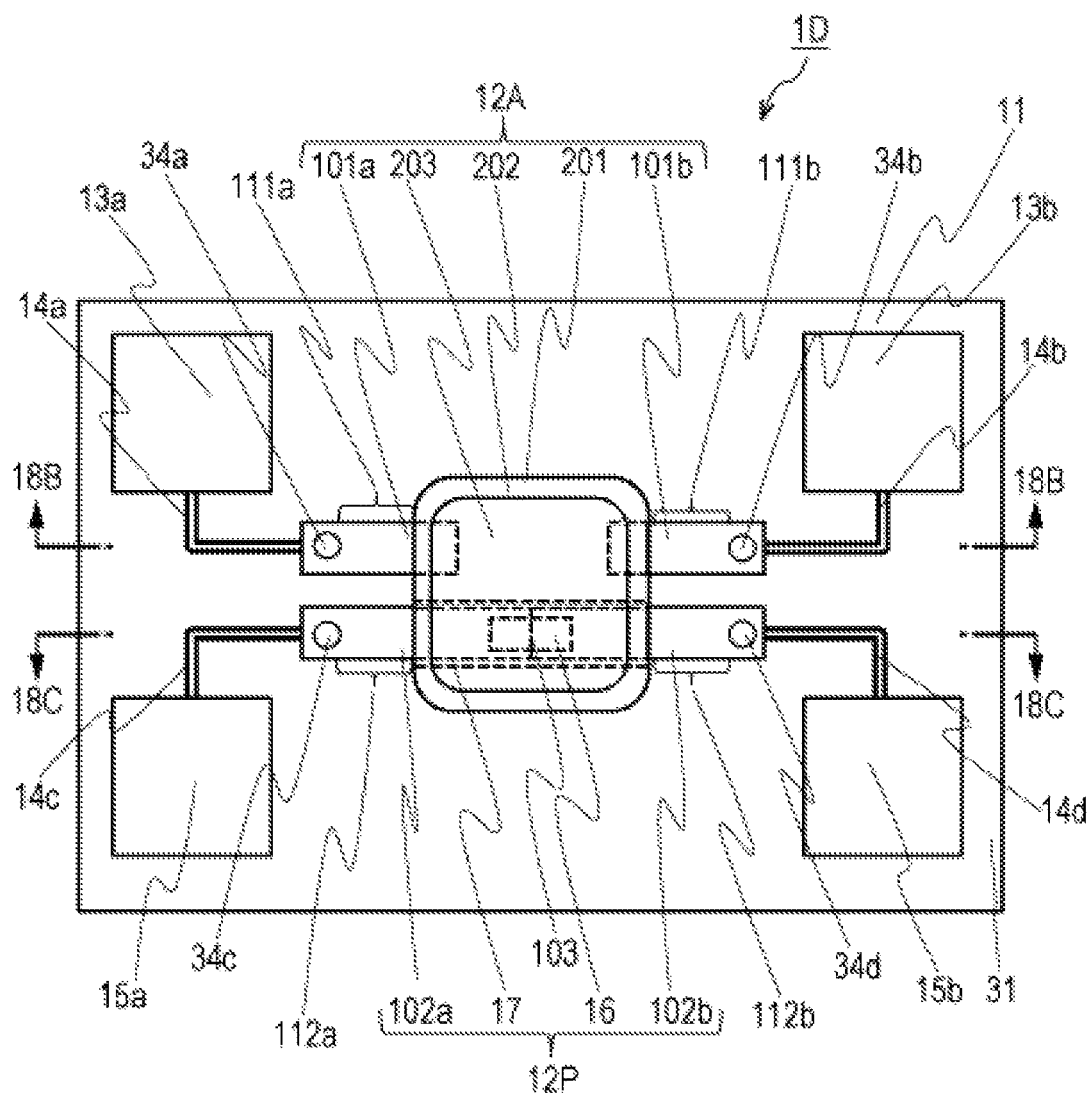
FIG. 18A is a schematic plan view of an example of an infrared sensor according to a second exemplary embodiment.
Figure 18B:
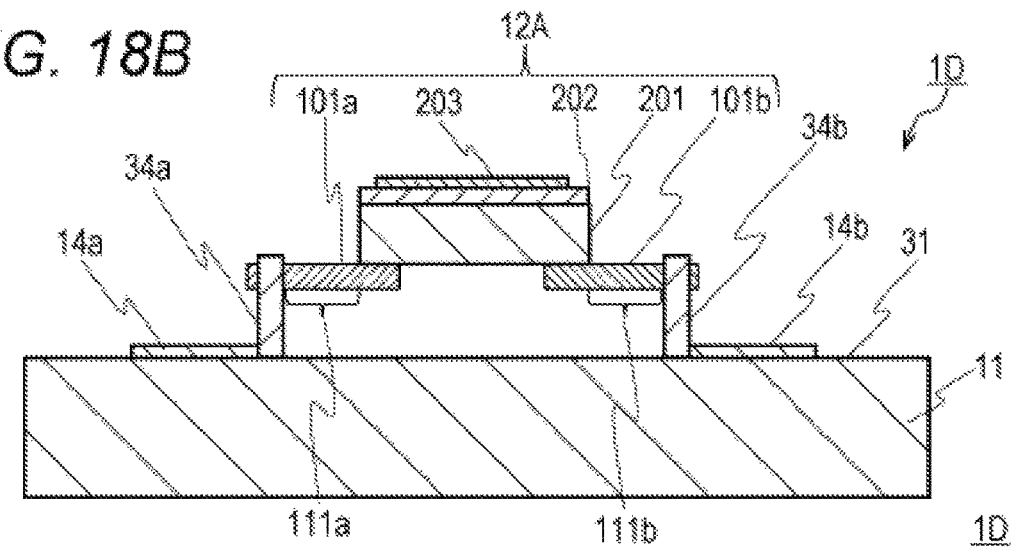
FIG. 18B is a schematic cross-sectional view of the infrared sensor according to the second exemplary embodiment taken along line 18B-18B in FIG. 18A.
Figure 18C:
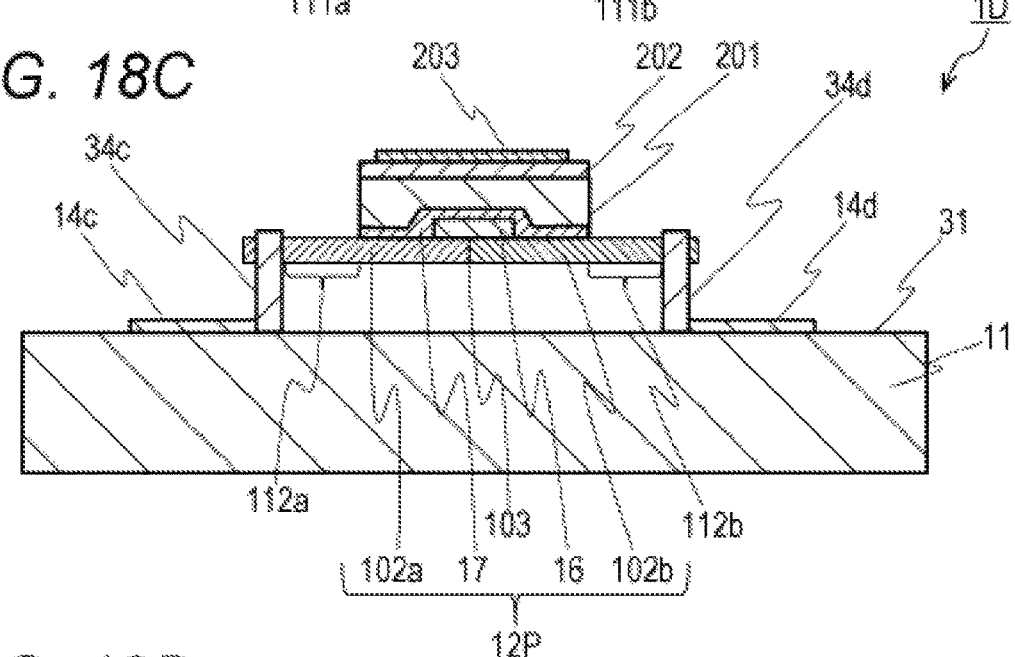
FIG. 18C is a schematic cross-sectional view of the infrared sensor according to the second exemplary embodiment taken along line 18C-18C in FIG. 18A.

FIGS. 18A to 18C show infrared sensor 1D according to the second exemplary embodiment. FIG. 18B is a cross-sectional view of infrared sensor 1D taken along line 18B-18B in FIG. 18A. FIG. 18C is a cross-sectional view of infrared sensor 1D taken along line 18C-18C in FIG. 18A. Infrared sensor 1D is a bolometer infrared sensor.

Infrared sensor 1D is different from infrared sensor 1A according to the first exemplary embodiment in further including posts 34a, 34b, 34c, 34d disposed at upper surface 31 of base substrate 11. Base substrate 11 includes no recess 32. Posts 34a, 34b, 34c, 34d extend in the direction becoming far from upper surface 31 of base substrate 11. One ends of beams 101a, 101b, 102a, 102b are electrically connected to posts 34a, 34b, 34c, 34d, respectively.

Resistance variable layer 201, insulating film 202, and infrared ray absorption layer 203 are supported by beams 101a, 101b, 102a, 102b so as to be spaced apart from base substrate 11. As shown in FIG. 18B, bolometer infrared ray receiver 12A, beam 101a, and beam 101a are suspended by posts 34a, 34b above base substrate 11. Further, as shown in FIG. 18C, Peltier device 12P, beam 102a, and beam 102b are suspended by post 34c and post 34d above base substrate 11. As is well known in the art, suspending these elements in this manner improves the detection sensitivity of the infrared sensor.

Beam 101a is electrically connected to second wire 14a via post 34a. Beam 101b is electrically connected to second wire 14b via post 34b. Beam 102a is electrically connected to second wire 14c via post 34c. Beam 101d is electrically connected to second wire 14d via post 34d.

Interface 103 is thermally connected to resistance variable layer 201 via first wire 16 and insulating film 17.

Posts 34a, 34b, 34c, 34d are structured by an electrically conductive material. The electrically conductive material may be, for example, metal. The metal as the material of posts 34a, 34b, 34c, 34d may be, for example, Cu and Al.

Infrared sensor 1D may further include an infrared ray reflective film at upper surface 31 of base substrate 11. This structure further improves the detection sensitivity of infrared sensor 1D. The material of the infrared ray reflective film may be, for example, Al and Au.

The phononic crystal structure is desirably provided at: section 111a between post 34a and one end of resistance variable layer 201 in beam 101a as seen in a plan view; section 111b between post 34b and the other end of resistance variable layer 201 in beam 101b as seen in a plan view; section 112a between post 34c and one end of resistance variable layer 201 in beam 102a as seen in a plan view; and section 112b between post 34d and the other end of resistance variable layer 201 in beam 102b as seen in a plan view.

The rest of the structure of infrared sensor 1D according to the second exemplary embodiment including any preferred mode is similar to that of infrared sensor 1A according to the first exemplary embodiment. Further, the operation of infrared sensor 1B according to the second exemplary embodiment is similar to that of infrared sensor 1A according to the first exemplary embodiment.

In the following, a description will be given of an exemplary method for manufacturing infrared sensor 1D according to the second exemplary embodiment.

Firstly, as base substrate 11, a semiconductor substrate is provided. The semiconductor substrate is structured by, for example, Si.

Figure 20:
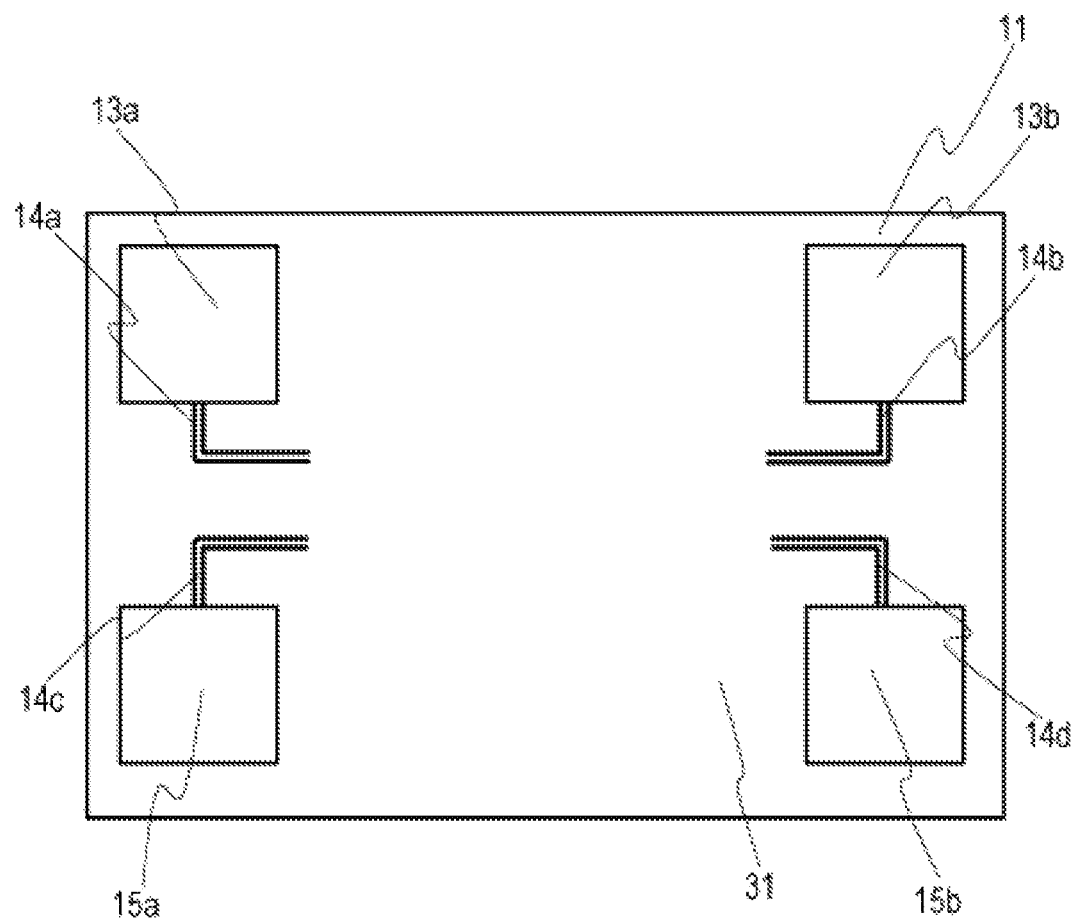
FIG. 20 is a schematic plan view for describing an exemplary method for manufacturing the infrared sensor according to the second exemplary embodiment.

Next, as shown in FIG. 20, electrode pads 13a, 13b, 15a, 15b and second wires 14a, 14b, 14c, 14d are formed at upper surface 31 of base substrate 11. Electrode pads 13a, 13b, 15a, 15b and second wires 14a, 14b, 14c, 14d may be formed by any known method including any thin film forming scheme such as sputtering or vapor deposition, or any pattern formation scheme such as photolithography. Simultaneously with the forming electrode pads 13a, 13b, 15a, 15b and second wires 14a, 14b, 14c, 14d, an infrared ray reflective film may be formed at upper surface 31 of base substrate 11.

Figure 21A:
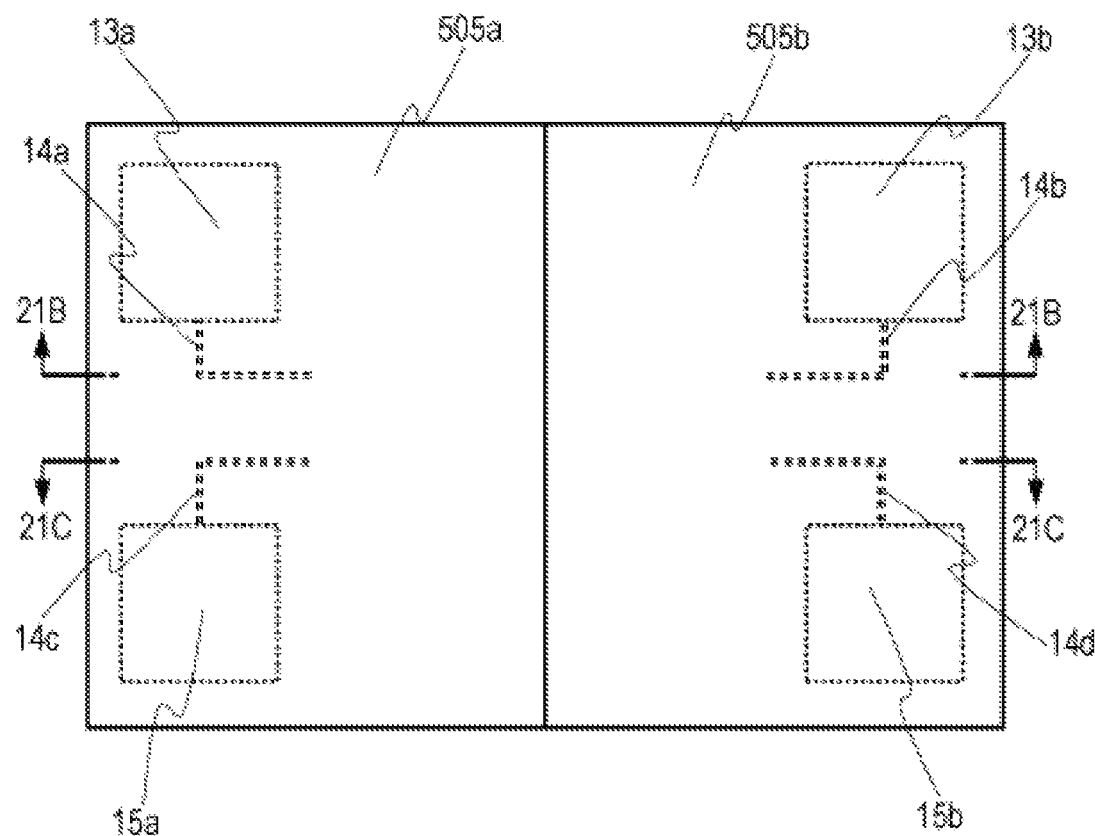
FIG. 21A is a schematic plan view for describing an exemplary method for manufacturing the infrared sensor according to the second exemplary embodiment.
Figure 21B:
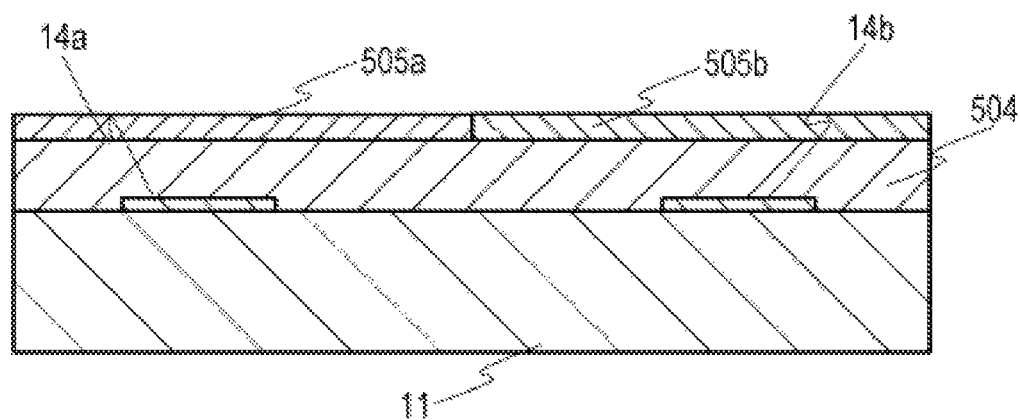
FIG. 21B is a schematic cross-sectional view taken along line 21B-21B in FIG. 21A.
Figure 21C:
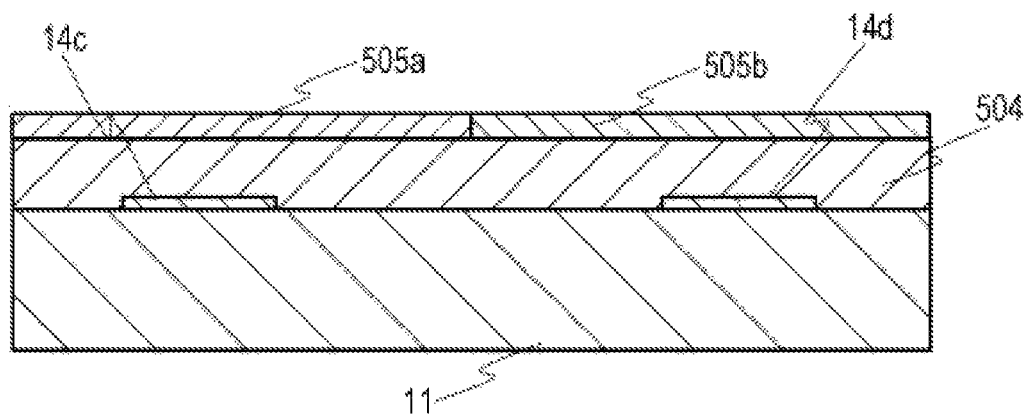
FIG. 21C is a schematic cross-sectional view taken along line 21C-21C in FIG. 21A.

Next, as shown in FIGS. 21A to 21C, sacrificial layer 504 and beam layers 505a, 505b are successively formed at upper surface 31 of base substrate 11. Sacrificial layer 504 is formed so as to cover electrode pads 13a, 13b, 15a, 15b and second wires 14a, 14b, 14c, 14d. Sacrificial layer 404 is representatively structured by resin. The thickness of sacrificial layer 504 may be selected so as to correspond to the distance between beams 101a, 101b, 102a, 102b and base substrate 11 in the manufactured infrared sensor 1D. The resin may be, for example, polyimide. Sacrificial layer 504 may be formed by, for example, any known thin film forming scheme such as CVD, sputtering, or spin coating. The material of beam layer 505a may be, for example, n-type Si. The material of beam layer 505a may be, for example, p-type Si. Beams layers 505a, 505b may be formed by CVD and photolithography. The thickness of each of beam layers 505a, 505b falls within a range of, for example, 10 nm to 500 nm inclusive.

Figure 22A:
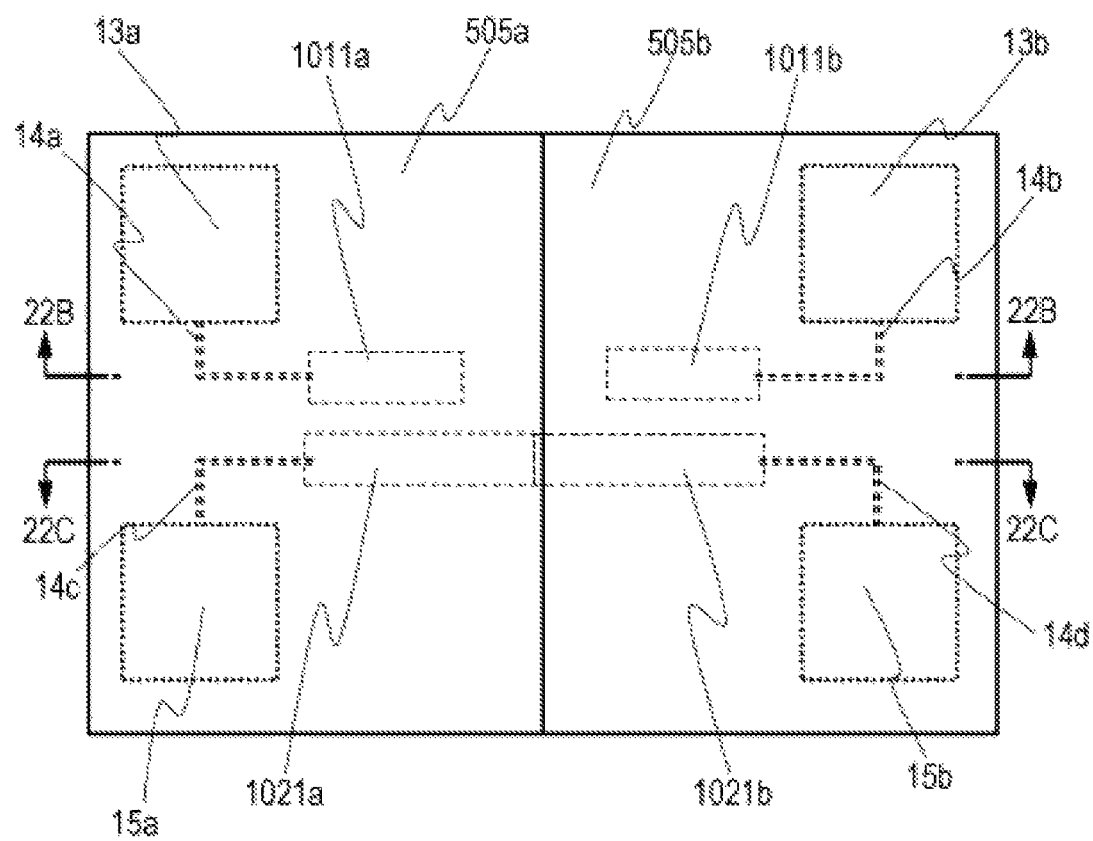
FIG. 22A is a schematic plan view for describing an exemplary method for manufacturing the infrared sensor according to the second exemplary embodiment.
Figure 22B:
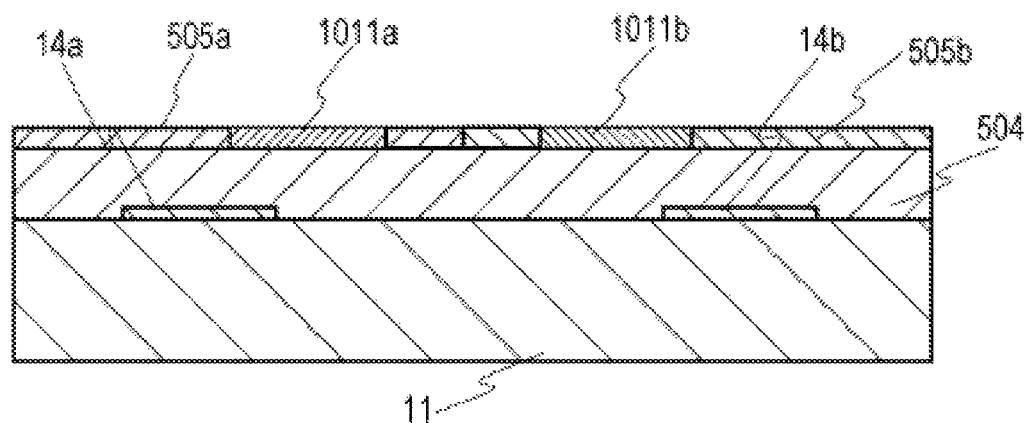
FIG. 22B is a schematic cross-sectional view taken along line 22B-22B in FIG. 22A.
Figure 22C:
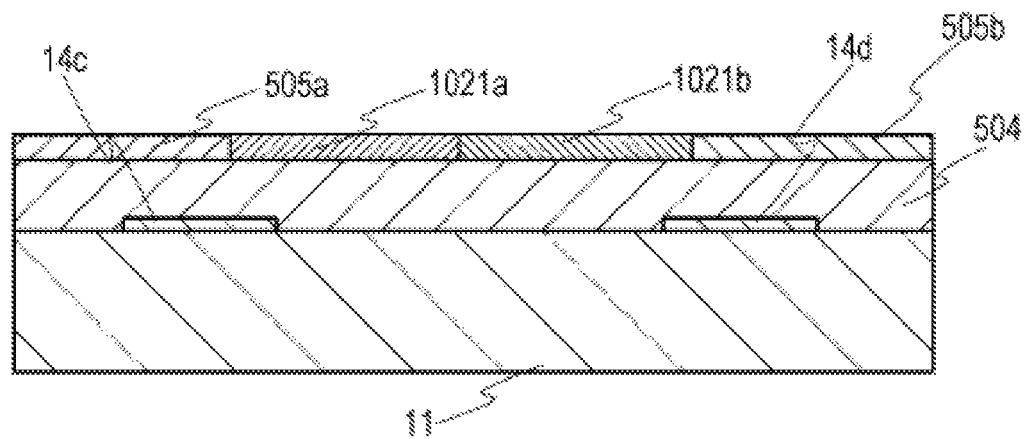
FIG. 22C is a schematic cross-sectional view taken along line 22C-22C in FIG. 22A.

Next, as shown in FIGS. 22A to 22C, a plurality of through holes 18 are periodically formed at regions 1011a, 1011b, 1021a, 1022b. Note that, FIGS. 22A to 22C do not show a plurality of through holes 18. The method for forming the plurality of through holes 18 is as described above.

Figure 23A:
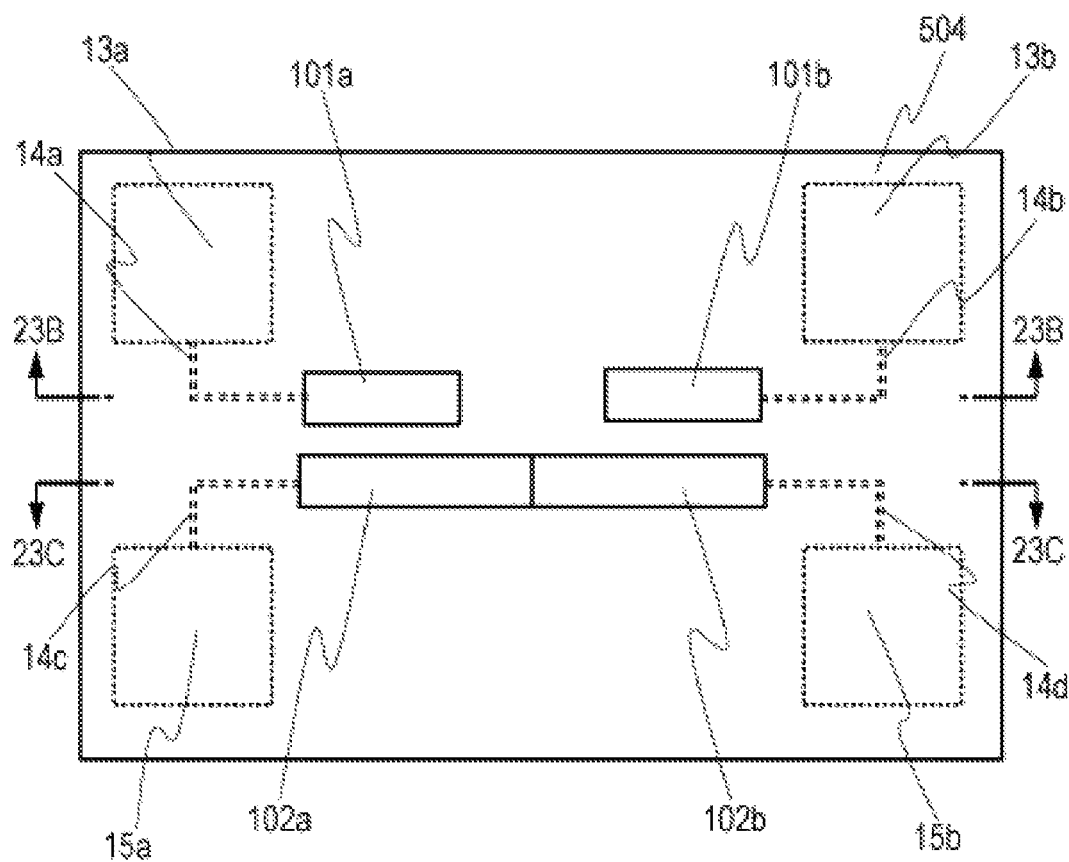
FIG. 23A is a schematic plan view for describing an exemplary method for manufacturing the infrared sensor according to the second exemplary embodiment.
Figure 23B:
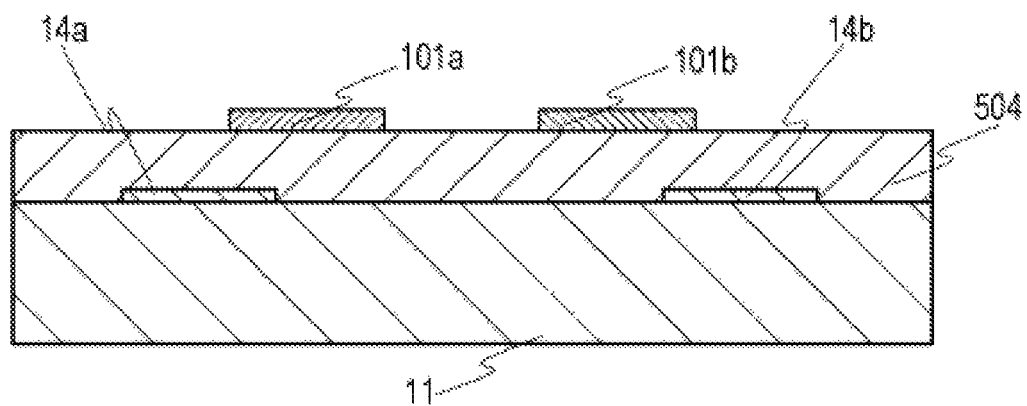
FIG. 23B is a schematic cross-sectional view taken along line 23B-23B in FIG. 23A.
Figure 23C:
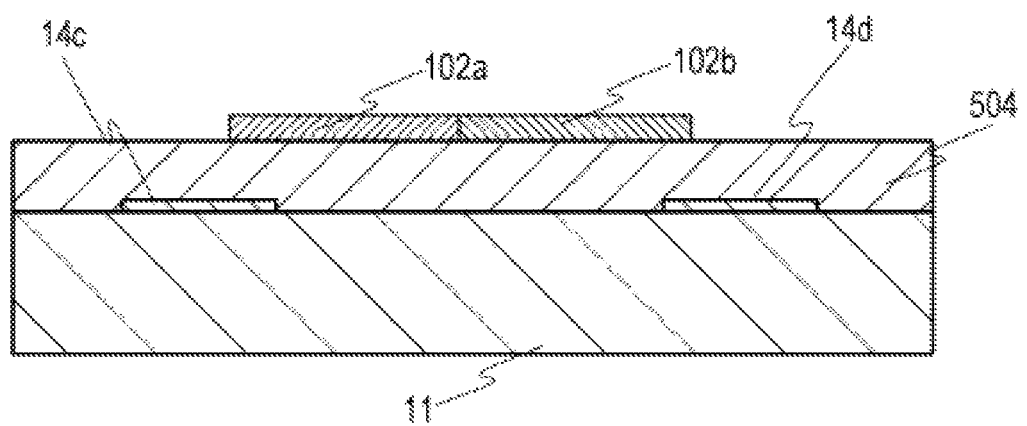
FIG. 23C is a schematic cross-sectional view taken along line 23C-23C in FIG. 23A.

Next, as shown in FIGS. 23A to 23C, beam layers 505a, 505b at the region excluding regions 1011a, 1011b, 1021a, 1021b are removed by photolithography and etching, to form beams 101a, 101b, 102a, 102b.

Figure 24A:
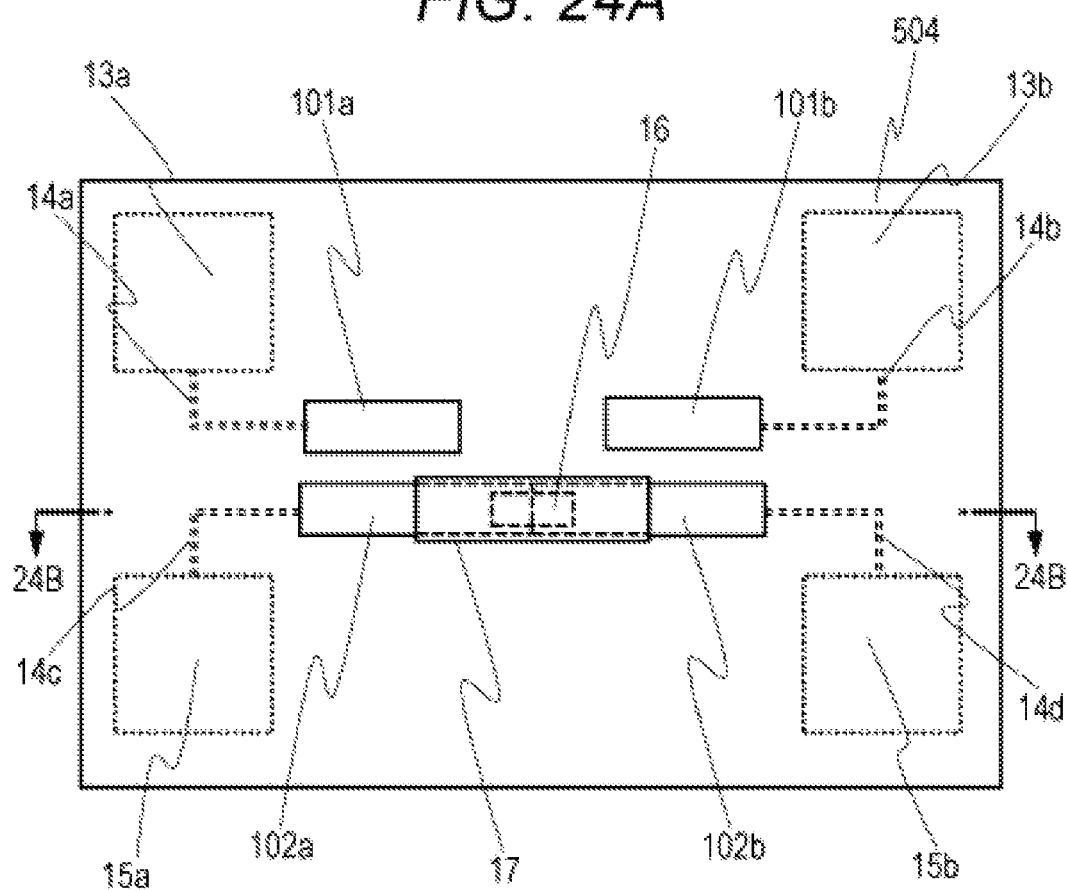
FIG. 24A is a schematic plan view for describing an exemplary method for manufacturing the infrared sensor according to the second exemplary embodiment.
Figure 24B:
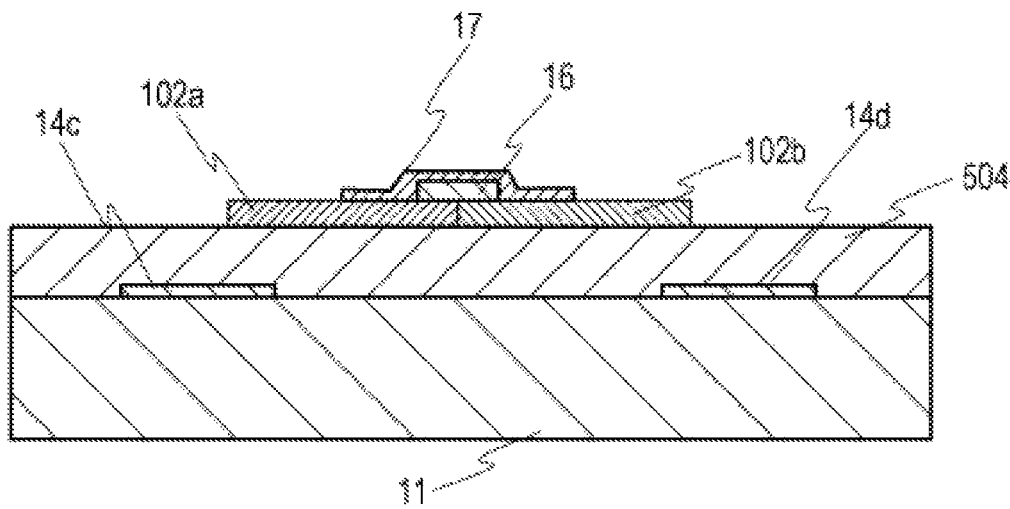
FIG. 24B is a schematic cross-sectional view taken along line 24B-24B in FIG. 24A.

Next, as shown in FIGS. 24A and 24B, first wire 16 that electrically connects beams 102a, 102b is formed by photolithography and etching. Then, by photolithography and any known thin film forming method, insulating film 17 consisting of SiN is formed so as to cover first wire 16.

Figure 25A:
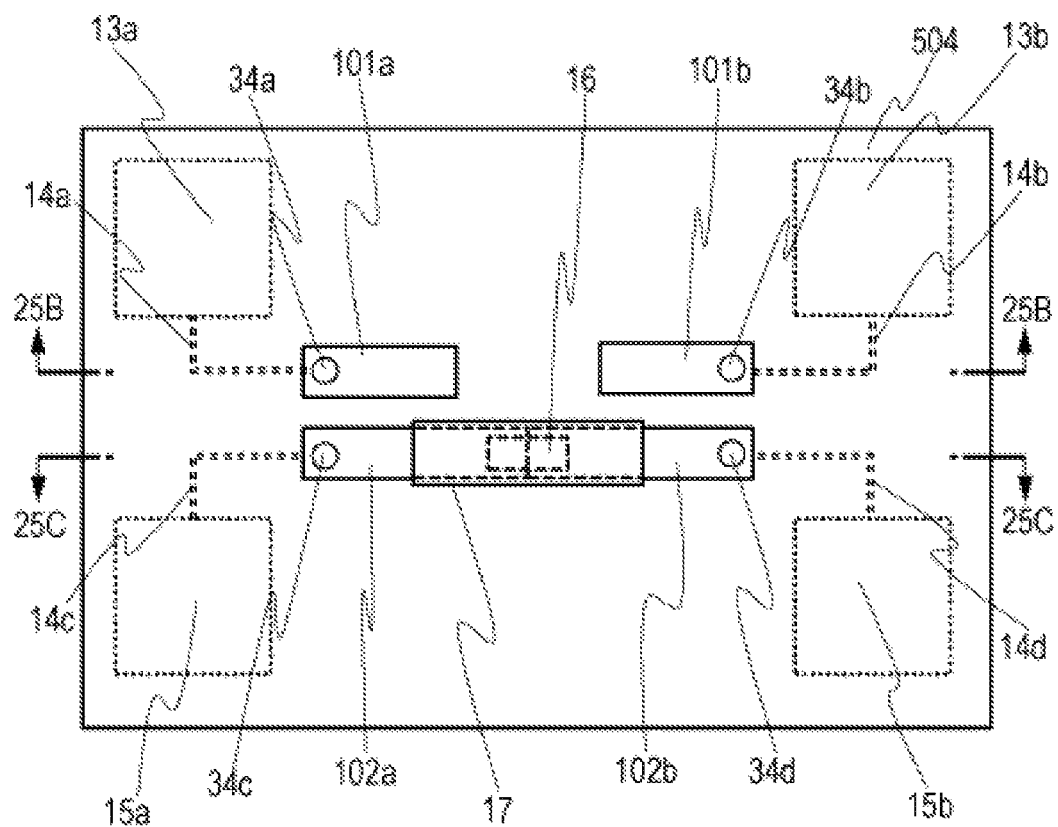
FIG. 25A is a schematic plan view of an exemplary method for manufacturing the infrared sensor according to the second exemplary embodiment.
Figure 25B:
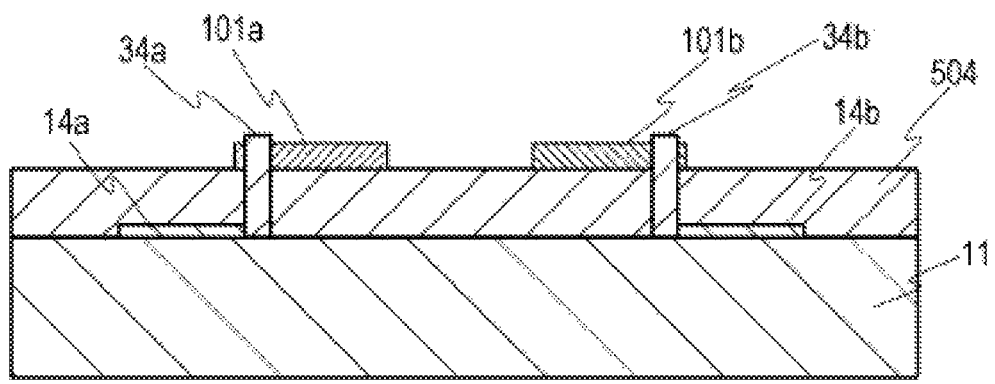
FIG. 25B is a schematic cross-sectional view taken along line 25B-25B in FIG. 25A.
Figure 25C:
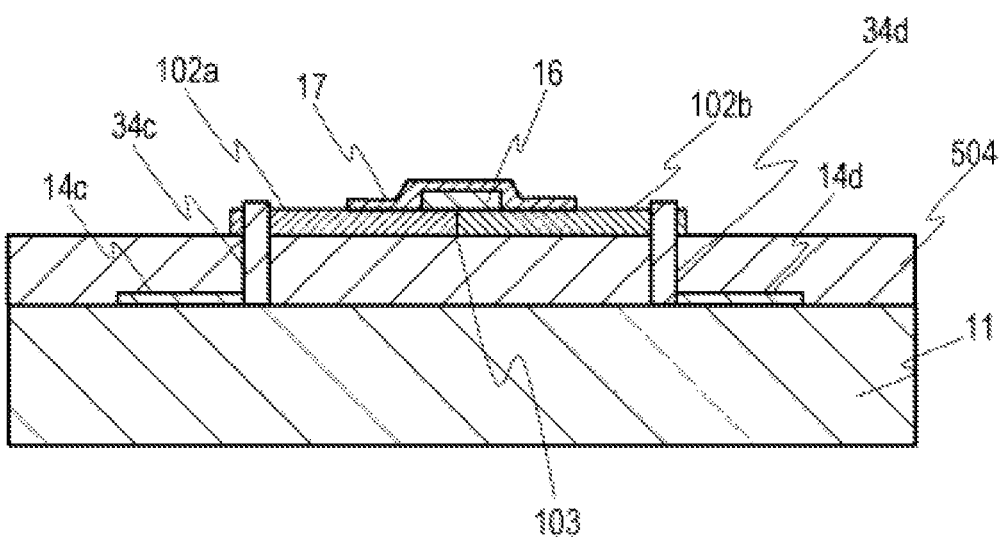
FIG. 25C is a schematic cross-sectional view taken along line 25C-25C in FIG. 25A.

Next, as shown in FIGS. 25A to 25C, posts 34a, 34b, 34c, 34d are formed. In forming posts 34a, 34b, 34c, 34d, selective etching for securing space for forming posts 34a, 34b, 34c, 34d, and any thin film forming scheme such as sputtering or vapor deposition for forming posts 34a, 34b, 34c, 34d in the secured space may be used.

Figure 26A:
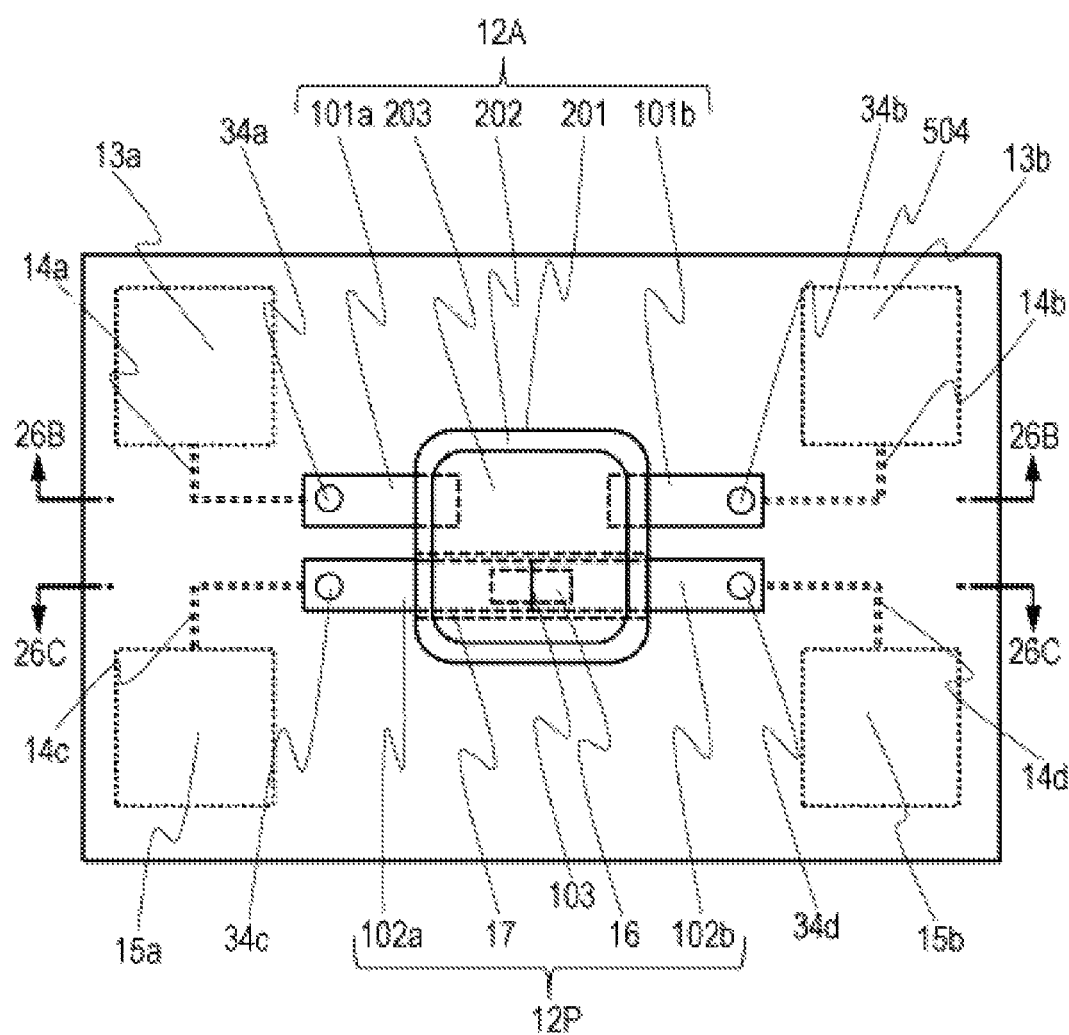
FIG. 26A is a schematic plan view for describing an exemplary method for manufacturing the infrared sensor according to the second exemplary embodiment.
Figure 26B:
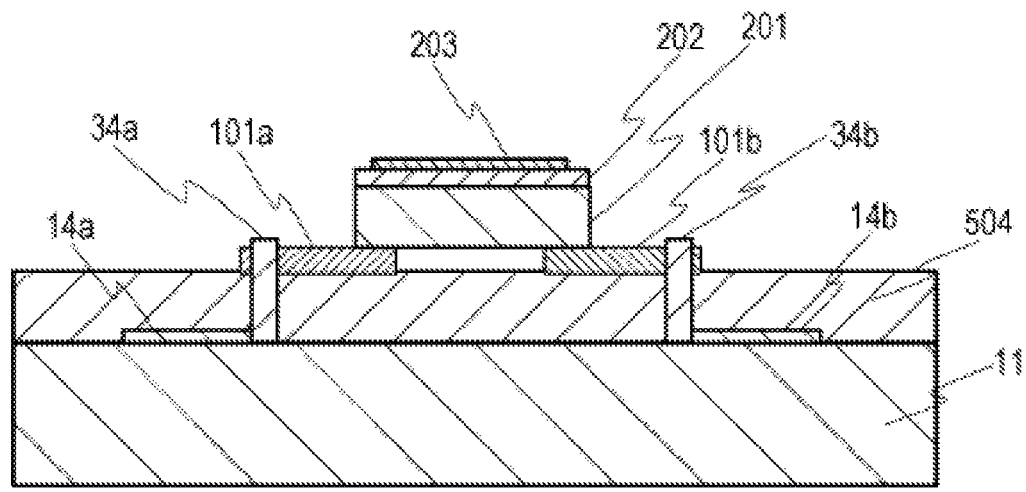
FIG. 26B is a schematic cross-sectional view taken along line 26B-26B in FIG. 26A.
Figure 26C:
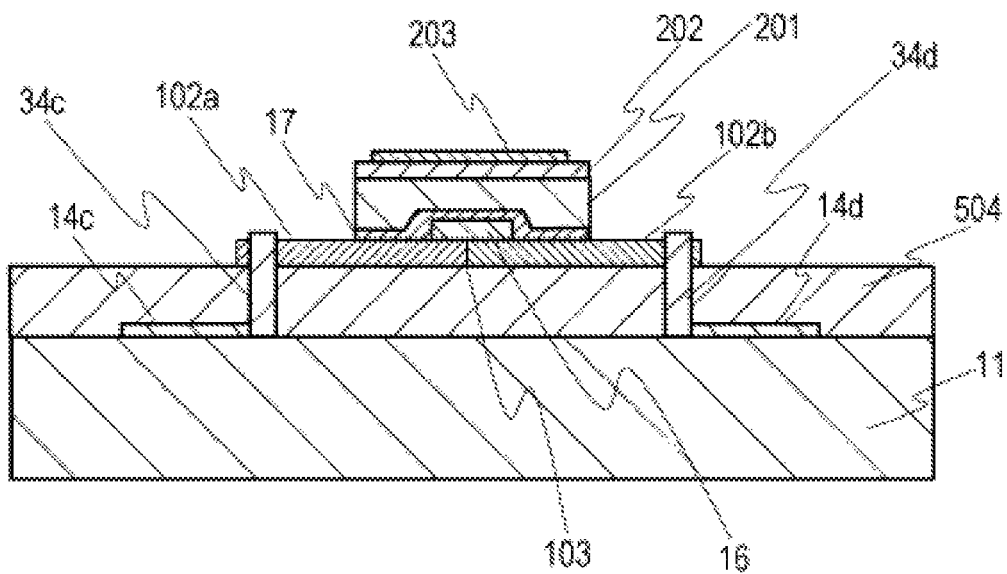
FIG. 26C is a schematic cross-sectional view taken along line 26C-26C in FIG. 26A.

Next, as shown in FIGS. 26A to 26C, resistance variable layer 201, insulating film 202, and infrared ray absorption layer 203 are formed. The structure and method for forming each of resistance variable layer 201, insulating film 202, and infrared ray absorption layer 203 are as described above.

Finally, sacrificial layer 504 is removed by selective etching.

Thus, infrared sensor 1D according to the second exemplary embodiment shown in FIGS. 18A to 18C is obtained.

Figure 18D:
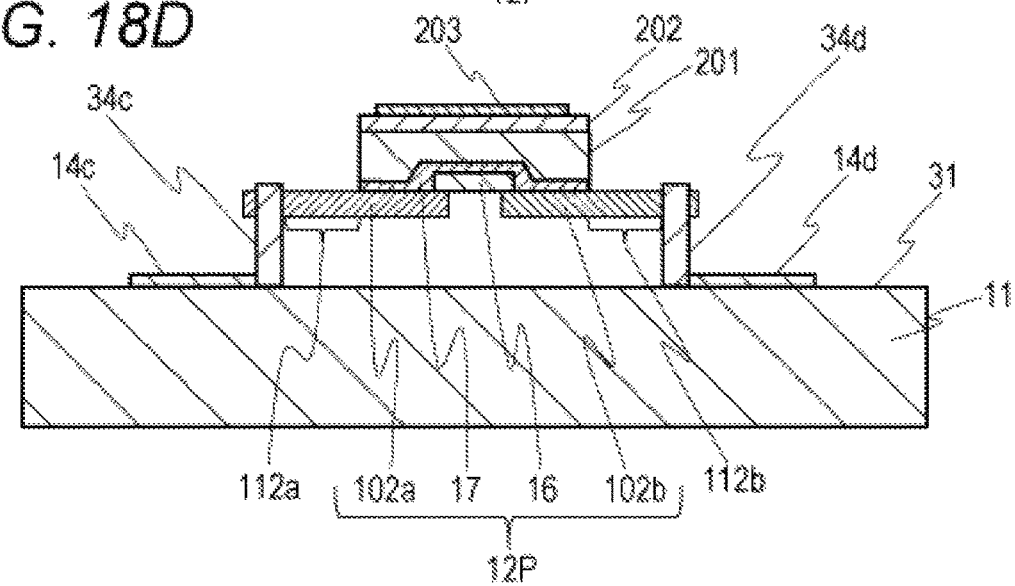
FIG. 18D is a cross-sectional view of another example of the infrared sensor according to the second exemplary embodiment.

In place of the above-described Peltier device 12P, Peltier device 12P with no interface 103 as shown in FIG. 18D may be used. In this case, first wire 16 corresponds to the cold junction of Peltier device 12P. First wire 16 is thermally connected to resistance variable layer 201 via insulating film 17.

Figure 19:
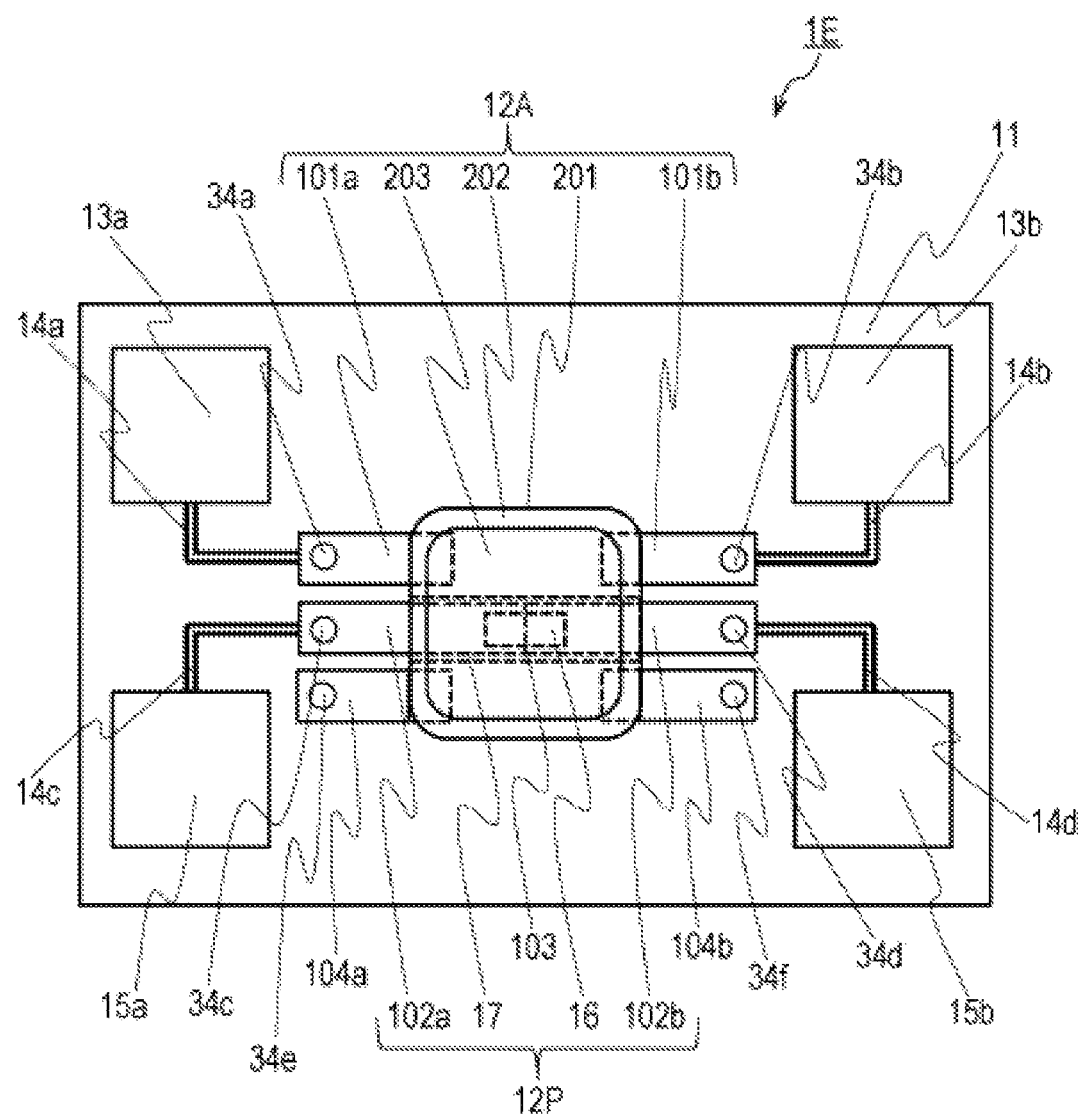
FIG. 19 is a schematic plan view of another example of the infrared sensor according to the second exemplary embodiment.

As shown in FIG. 19, infrared sensor 1E being a variation of infrared sensor 1D further includes beams 104a, 104b. This further improves the mechanical strength for suspending resistance variable layer 201, insulating film 202, and infrared ray absorption layer 203.

Third Exemplary Embodiment

Figure 27A:
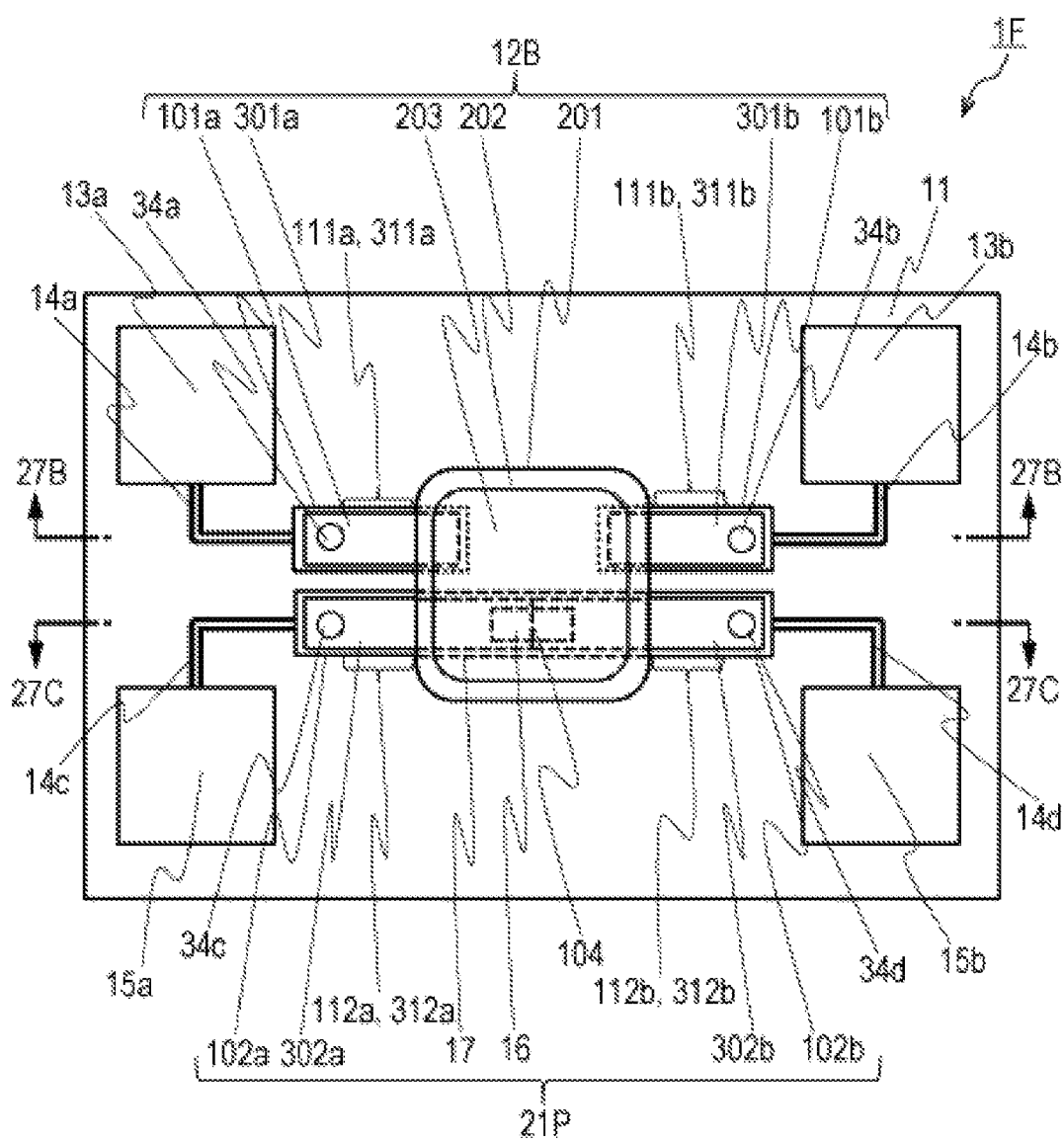
FIG. 27A is an exemplary schematic plan view of an infrared sensor according to a third exemplary embodiment.
Figure 27B:
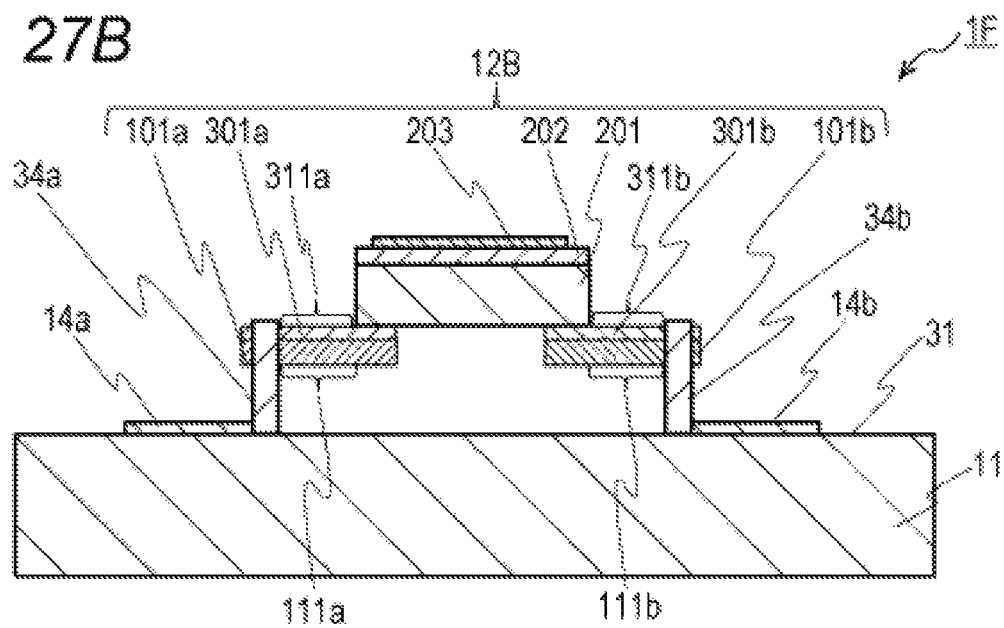
FIG. 27B is a schematic cross-sectional view of the infrared sensor according to the third exemplary embodiment taken along line 27B-27B in FIG. 27A.
Figure 27C:
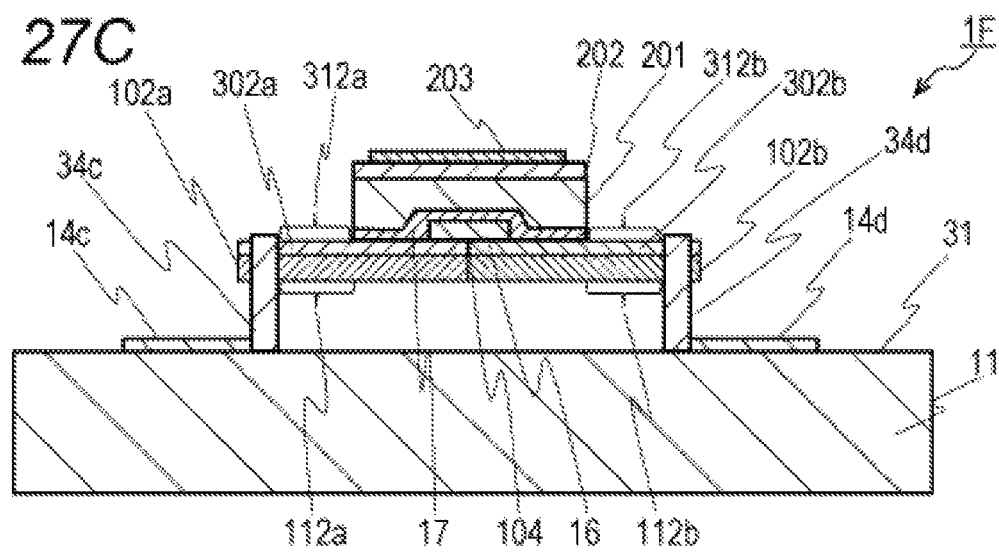
FIG. 27C is a schematic cross-sectional view of the infrared sensor according to the third exemplary embodiment taken along line 27C-27C in FIG. 27A.

FIGS. 27A to 27C show infrared sensor 1F according to the third exemplary embodiment. FIG. 27B is a cross-sectional view of infrared sensor 1F taken along line 27B-27B in FIG. 27A. FIG. 27C is a cross-sectional view of infrared sensor 1F taken along line 27C-27C in FIG. 27A. Infrared sensor 1F is a bolometer infrared sensor.

Infrared ray receiver 12B of infrared sensor 1F is different from infrared ray receiver 12A of infrared sensor 1D according to the second exemplary embodiment in further including thin film 301a formed on beam 101a and thin film 301b formed on beam 101b. Note that, thin film 301a and thin film 301b are referred to also as a bolometer first thin film and a bolometer second thin film, respectively.

Peltier device 21P of infrared sensor 1F is different from Peltier device 12P of infrared sensor 1D according to the second exemplary embodiment in further including thin film 302a formed on beam 102a and thin film 302b formed on beam 102b. Note that, thin film 302a and thin film 302b are referred to also as a Peltier first thin film and a Peltier second thin film, respectively.

One ends of thin films 301a, 301b, 302a, 302b are electrically connected to posts 34a, 34b, 34c, 34d, respectively.

Other ends of thin films 301a, 301b are connected to resistance variable layer 201.

Another end of thin film 302a is connected to the other end of thin film 302b, to form interface 104. First wire 16 electrically connecting thin films 302a, 302b is formed on thin films 302a, 302b across interface 104. Further, insulating film 17 is formed on first wire 16 and thin films 302a, 302b so as to cover first wire 16.

Resistance variable layer 201, insulating film 202, and infrared ray absorption layer 203 are supported by beams 101a, 101b, 102a, 102b and thin films 301a, 301b, 302a, 302b so as to be spaced apart from base substrate 11. As shown in FIGS. 27B and 27C, as seen in a cross-sectional view, resistance variable layer 201, insulating film 202, infrared ray absorption layer 203, and beams 101a, 101b, 102a, 102b are suspended by posts 34a, 34b, 34c, 34d above base substrate 11.

Each of beams 101a, 101b, 102a, 102b consists of an insulating material.

Thin films 301a, 301b are used in reading a detection signal for an infrared ray becoming incident on infrared ray receiver 12B.

Thin films 301a, 301b each consist of an electrically conductive material. The electrically conductive material may be, for example, metal with low thermal conductivity (for example, Ti or TiN) and a semiconductor. More preferably, the electrically conductive material is a semiconductor such as Si or SiGe with an added impurity.

Each of thin films 301a, 301b has a phononic crystal structure. The phononic crystal structure is desirably provided at: section 311a between post 34a and one end of resistance variable layer 201 in thin film 301a as seen in a plan view; and section 311b between post 34b and the other end of resistance variable layer 201 in thin film 301b as seen in a plan view.

In the case where metal is used as the material of each of thin films 301a, 301b, the phononic crystal structure little exhibits the heat-insulation effect. In this case, desirably, the thickness of thin films 301a, 301b should be 10 nm or smaller in order to attain the heat-insulation effect.

Thin films 302a, 302b structure a thermocouple, to function as a Peltier device. That is, thin films 302a, 302b are used in absorbing heat generated at infrared ray receiver 12B. Interface 104 corresponds to the cold junction of the Peltier device. Interface 104 is thermally connected to resistance variable layer 201 via first wire 16 and insulating film 17. One of thin films 302a, 302b consists of a p-type semiconductor material. The other one of thin films 302a, 302b consists of an n-type semiconductor material. Each of the p-type semiconductor material and the n-type semiconductor material is desirably a silicon-based semiconductor material (for example, Si or SiGe) used in the silicon process technology.

Each of thin films 302a, 302b has a phononic crystal structure. The phononic crystal structure is desirably provided at section 312a between post 34c and one end of resistance variable layer 201 in thin film 302a as seen in a plan view, and at section 312b between post 34d and the other end of resistance variable layer 201 in thin film 302b as seen in a plan view.

The rest of the structure of infrared sensor 1F according to the third exemplary embodiment including any preferred mode is similar to that of infrared sensor 1D according to the second exemplary embodiment. Further, the operation of infrared sensor 1F according to the third exemplary embodiment is similar to that of infrared sensor 1A according to the first exemplary embodiment except that thin film 301a, thin film 301b read a detection signal for an infrared ray in place of beams 101a, 101b, and thin film 302a and thin film 302b function as a Peltier device in place of beams 102a, 102b.

A person skilled in the art is capable of easily manufacturing infrared sensor 1F according to the third exemplary embodiment by referring to the method for manufacturing infrared sensor 1D according to the second exemplary embodiment.

Figure 27D:
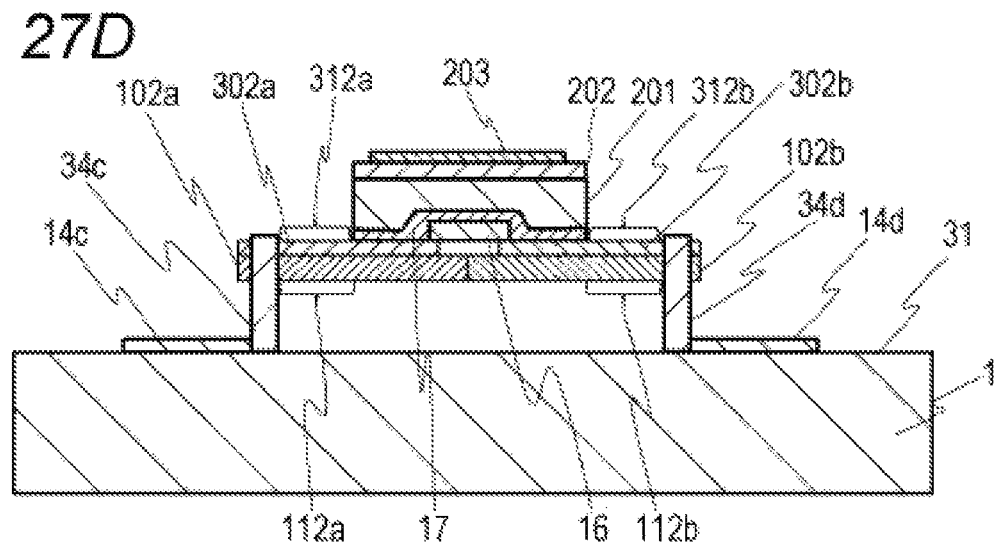
FIG. 27D is a cross-sectional view of another example of the infrared sensor according to the third exemplary embodiment.

As shown in FIG. 27D, in place of Peltier device 21P, a Peltier device with no interface 104 may be used. In this case, first wire 16 corresponds to the cold junction of the Peltier device. First wire 16 is thermally connected to resistance variable layer 201 via insulating film 17.

Figure 28:
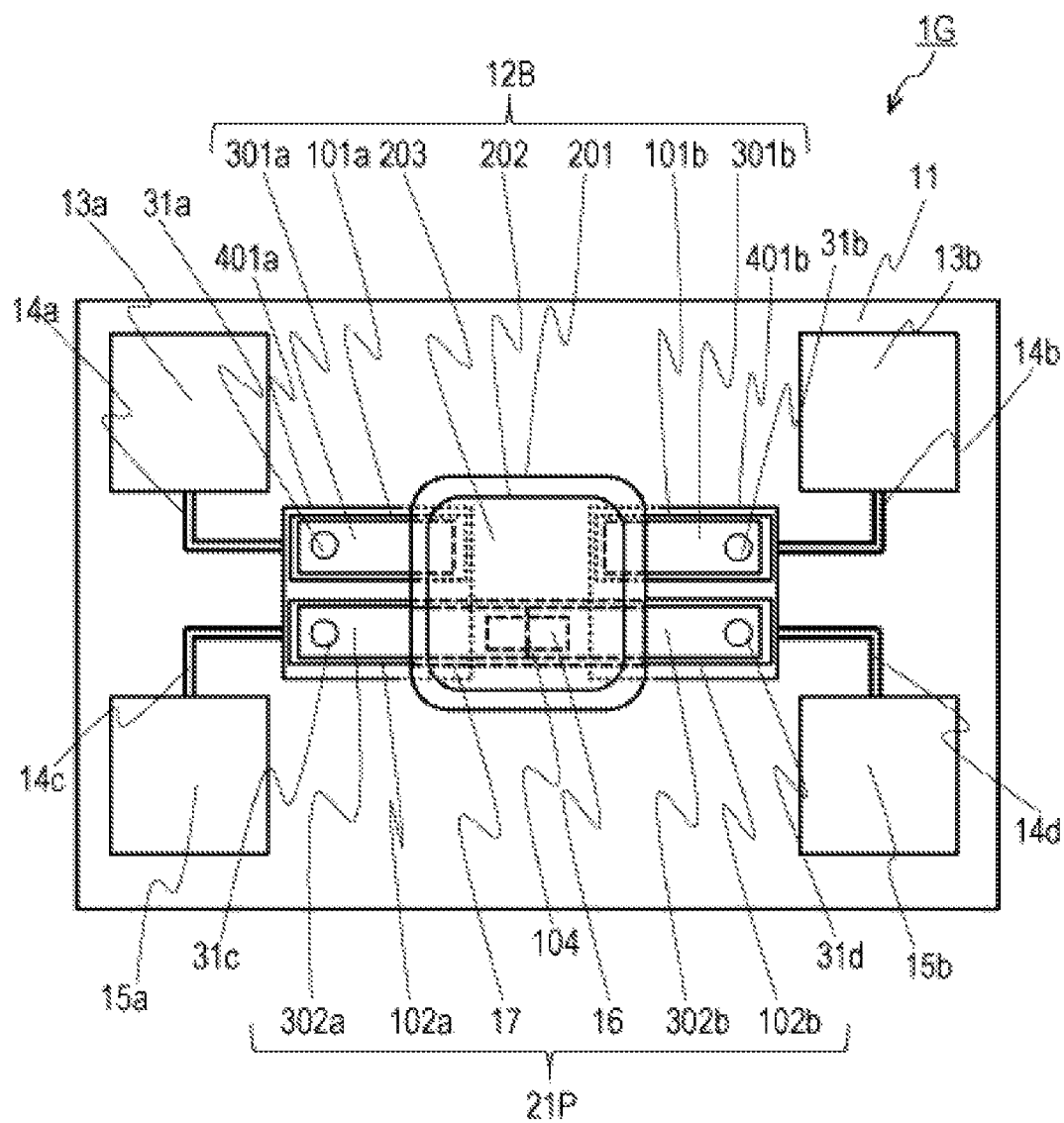
FIG. 28 is a schematic plan view of another example of the infrared sensor according to the third exemplary embodiment.

As shown in FIG. 28, infrared sensor 1G being a variation of infrared sensor 1F further includes insulator 401a that physically connects beam 101a and beam 102a, and insulator 401b that physically connects beam 101b and beam 102b. This improves the mechanical strength for suspending resistance variable layer 201, insulating film 202, and infrared ray absorption layer 203. Note that, insulators 401a, 401b are each structured by an insulating material. Therefore, electrical insulation is secured between beam 101a and beam 102a, and between beam 101b and beam 102b.

Figure 29:
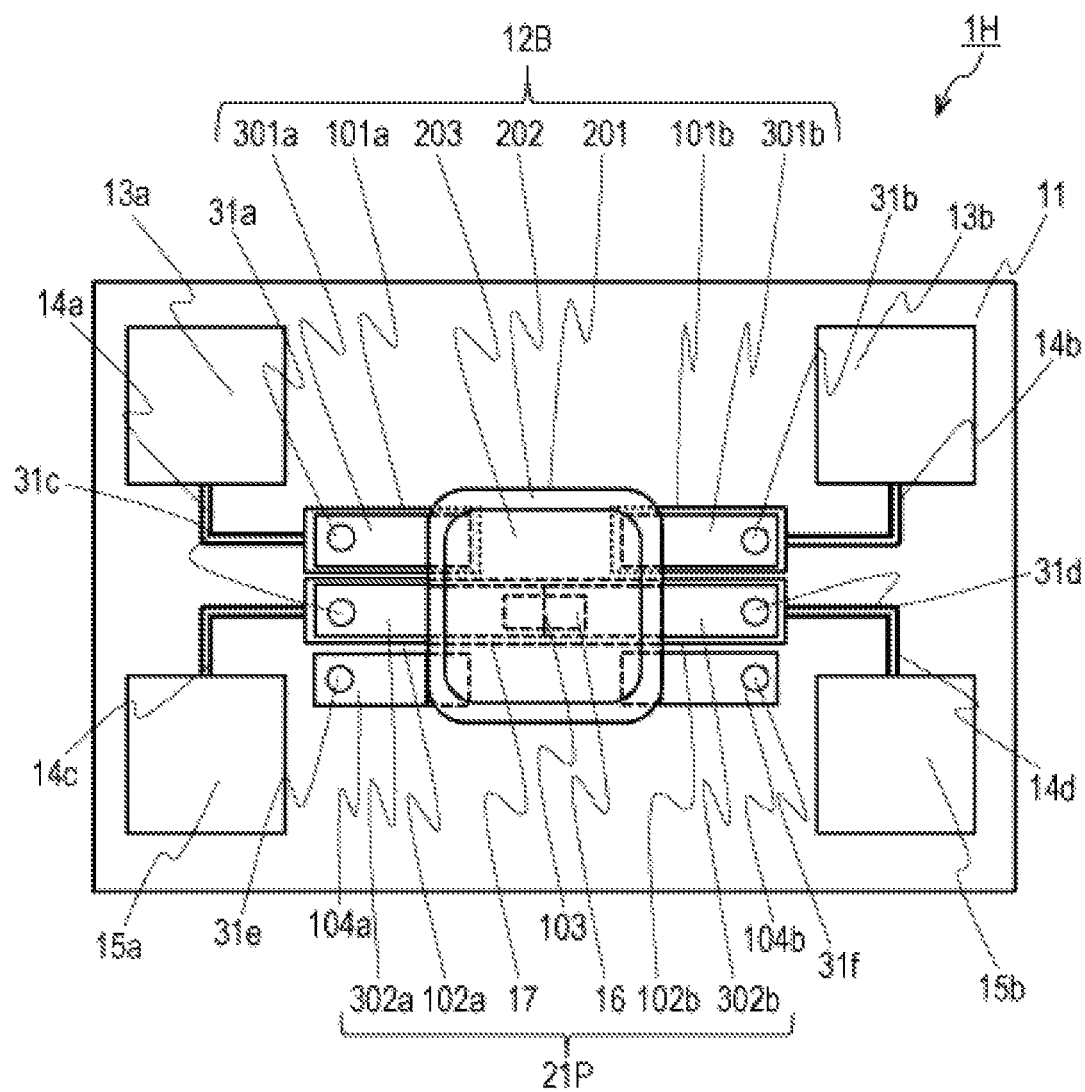
FIG. 29 is a schematic plan view of yet another example of the infrared sensor according to the third exemplary embodiment.

As shown in FIG. 29, infrared sensor 1H being other variation of infrared sensor 1F further includes beams 104a, 104b. This improves the mechanical strength for suspending resistance variable layer 201, insulating film 202, and infrared ray absorption layer 203.

Fourth Exemplary Embodiment

Figure 30A:
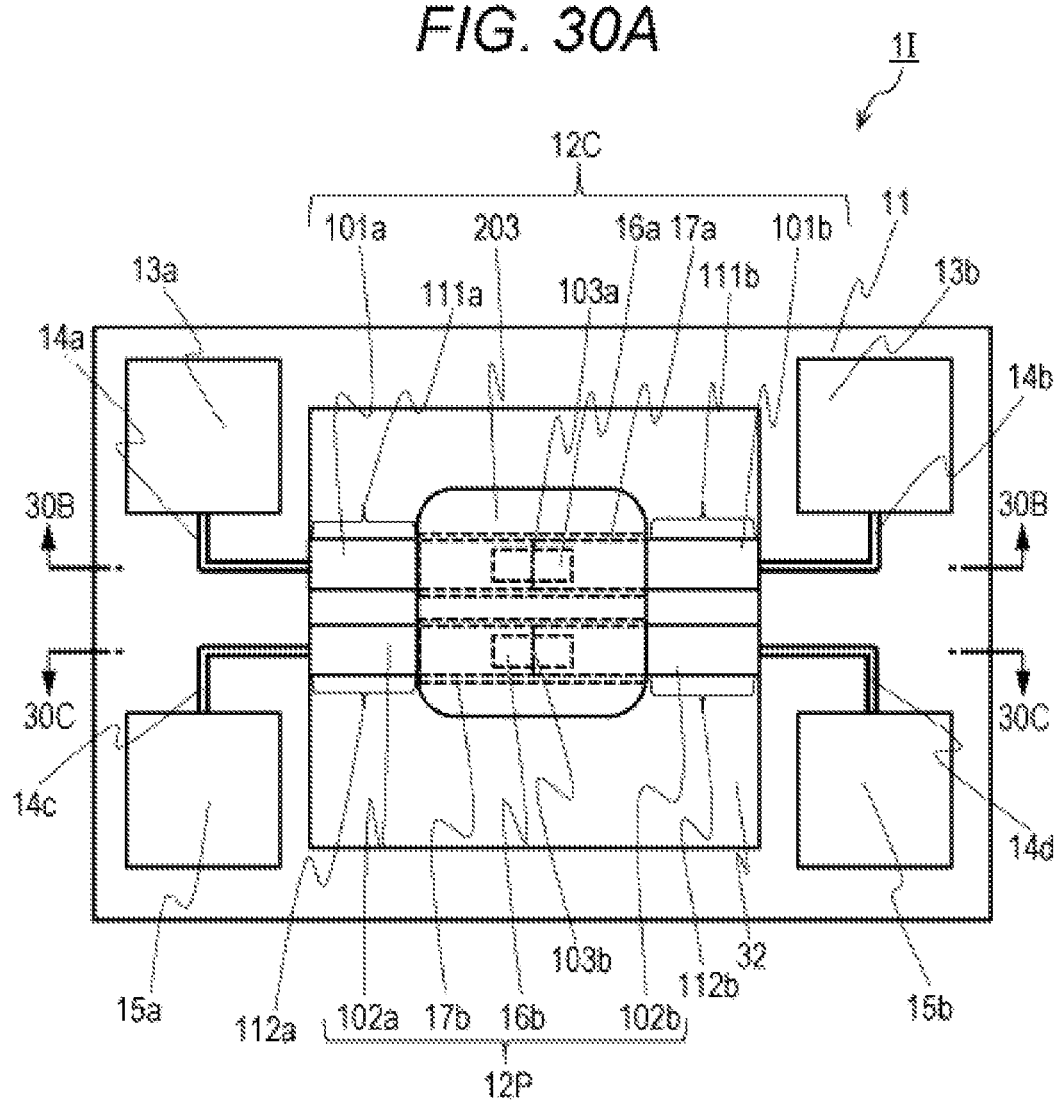
FIG. 30A is a schematic plan view of an example of an infrared sensor according to a fourth exemplary embodiment.
Figure 30B:
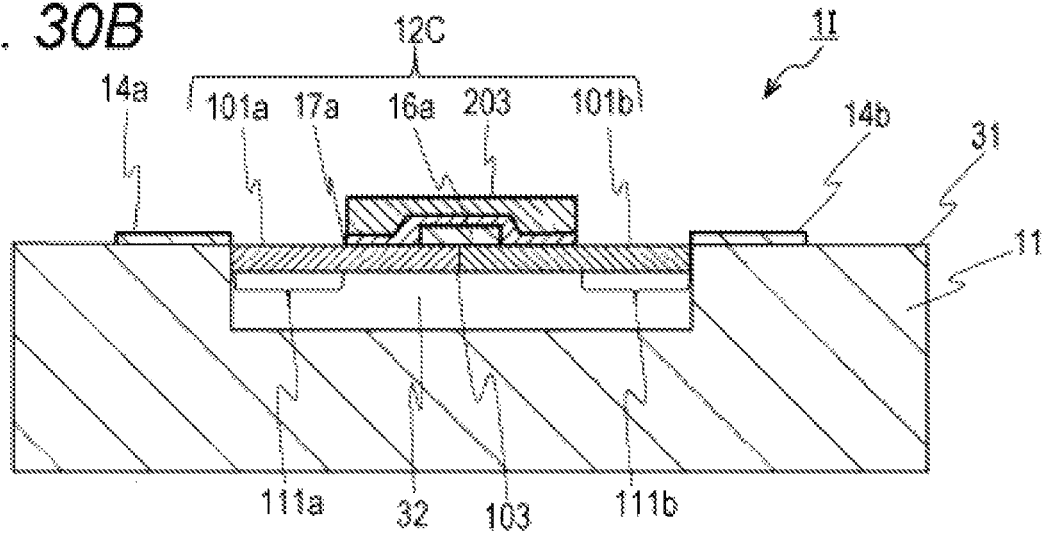
FIG. 30B is a schematic cross-sectional view of the infrared sensor according to the fourth exemplary embodiment taken along line 30B-30B in FIG. 30A.
Figure 30C:
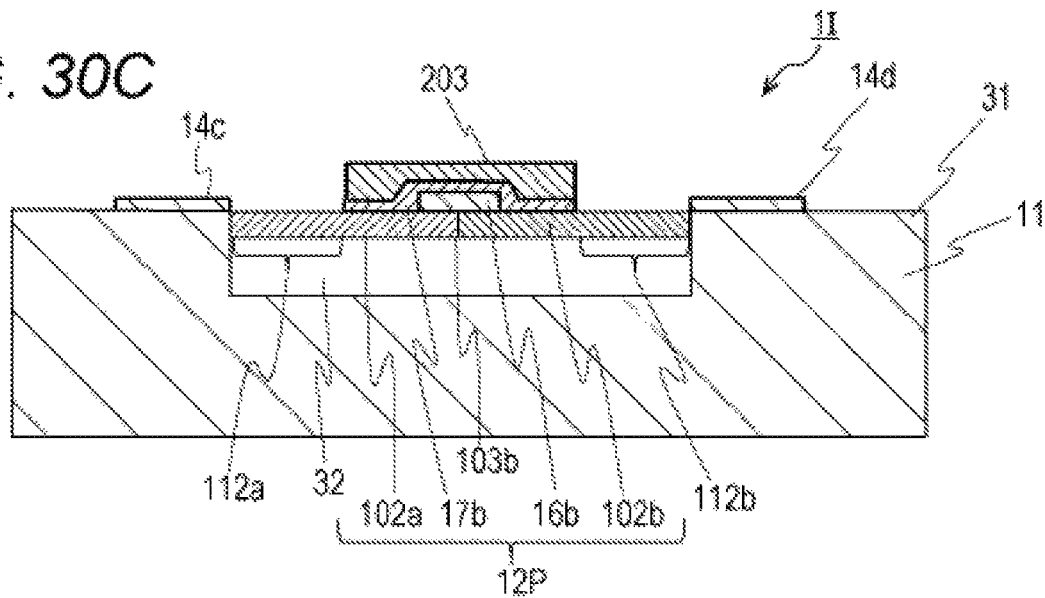
FIG. 30C is a schematic cross-sectional view of the infrared sensor according to the fourth exemplary embodiment taken along line 30C-30C in FIG. 30A.

FIGS. 30A to 30C show infrared sensor 1I according to a fourth exemplary embodiment. FIG. 30B is a cross-sectional view of infrared sensor 1I taken along line 30B-30B in FIG. 30A. FIG. 30C is a cross-sectional view of infrared sensor 1I taken along line 30C-30C in FIG. 30A. Infrared sensor 1I is a thermopile infrared sensor.

Infrared ray receiver 12C of infrared sensor 1I is different from infrared ray receiver 12A of infrared sensor 1A according to the first exemplary embodiment in including beams 101a, 101b, infrared ray absorption layer 203, first wire 16a, and insulating film 17a.

One end of beam 101a and one end of beam 101b are connected to base substrate 11. Another end of beam 101a is connected to the other end of beam 101b, to form interface 103a. Infrared sensor 1I further includes first wire 16a and insulating film 17a. First wire 16a is formed on beams 101a, 101b across interface 103a. First wire 16a electrically connects beams 101a, 101b. Insulating film 17a is formed on first wire 16a, beam 101a, and beam 101b.

Beams 101a, 101b are used in reading a detection signal for an infrared ray becoming incident on infrared ray absorption layer 203. One of beams 101a, 101b consists of a p-type semiconductor material. The other one of beams 101a, 101b consists of an n-type semiconductor material. Note that, beam 101a and beam 101b are referred to also as a thermopile first beam and a thermopile second beam, respectively.

Peltier device 12P of infrared sensor 1I is structured similarly to Peltier device 12P of infrared sensor 1A according to the first exemplary embodiment.

The rest of the structure of infrared sensor 1I according to the fourth exemplary embodiment including any preferred mode is similar to that of infrared sensor 1A according to the first exemplary embodiment.

In the following, a description will be given of an operation of infrared sensor 1I according to the fourth exemplary embodiment.

When an infrared ray becomes incident on infrared ray absorption layer 203, infrared ray absorption layer 203 absorbs the infrared ray. Thus, the temperature of beams 101a, 101b being thermally in contact with infrared ray absorption layer 203 via infrared ray receiver 12B and insulating film 17a rises. As a result, a temperature difference occurs in beams 101a, 101 b in the direction from infrared ray absorption layer 203 toward base substrate 11. This generates electromotive force attributed to the Seebeck effect at beams 101a, 101b. A signal processing circuit connected to electrode pads 13a, 13b measures the generated electromotive force, to calculate the detected intensity of the infrared ray.

Thereafter, the Peltier device cools infrared ray absorption layer 203. The cooling method is similar to the method for cooling infrared sensor 1A according to the first exemplary embodiment.

Infrared sensor 1I operates in the foregoing manner.

A person skilled in the art is capable of easily manufacturing infrared sensor 1I according to the fourth exemplary embodiment by referring to the method for manufacturing infrared sensor 1A according to the first exemplary embodiment.

Figure 30D:
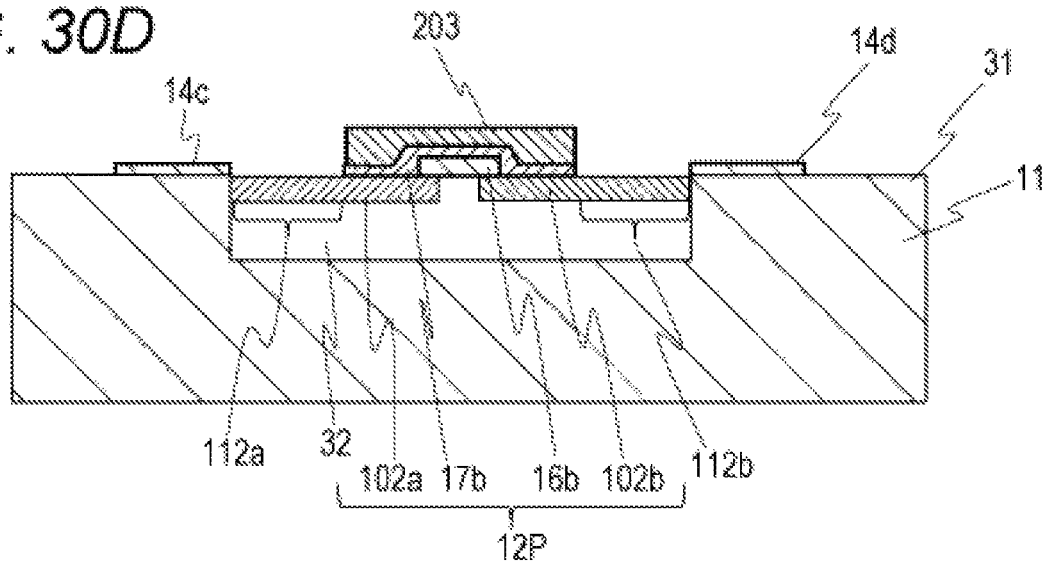
FIG. 30D is a cross-sectional view of another example of the infrared sensor according to the fourth exemplary embodiment.

As shown in FIG. 30D, in place of Peltier device 12P, Peltier device 12P with no interface 103b may be used. In this case, first wire 16 corresponds to the cold junction of the Peltier device. First wire 16 is thermally connected to resistance variable layer 201 via an insulating film 17.

Figure 31A:
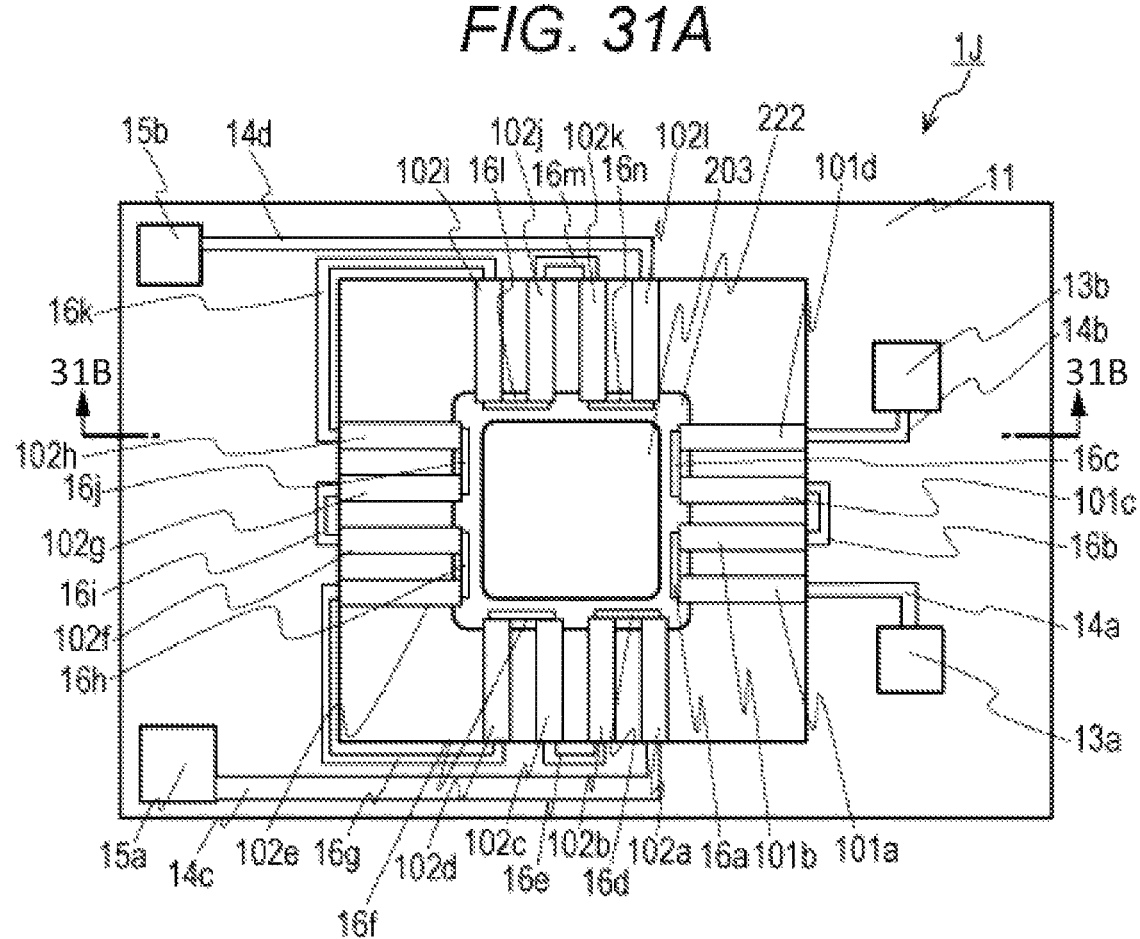
FIG. 31A is a schematic plan view of another example of the infrared sensor according to the fourth exemplary embodiment.
Figure 31B:
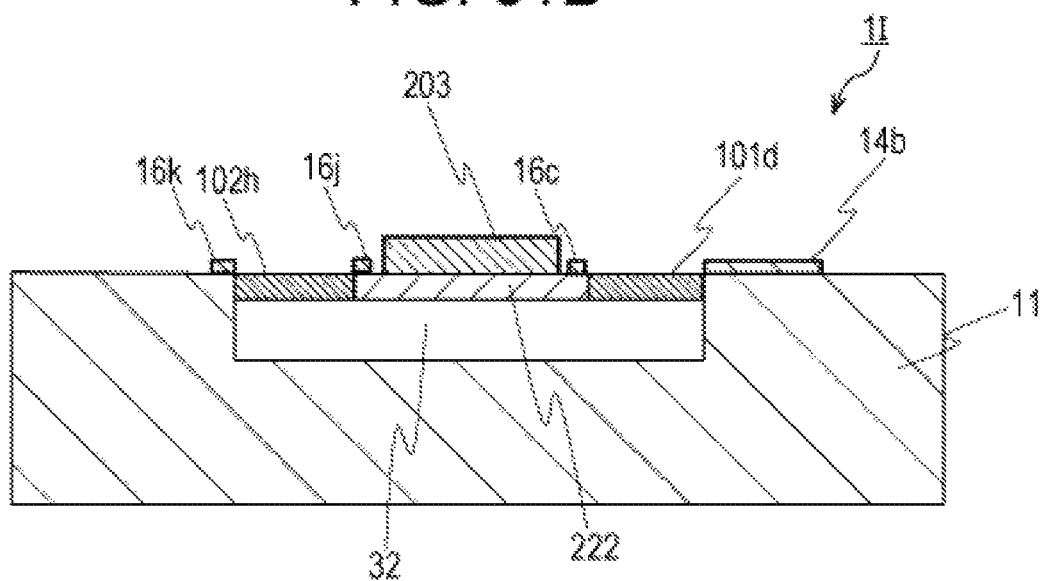
FIG. 31B is schematic cross-sectional view of the infrared sensor taken along line 31B-31B in FIG. 31A.

As shown in FIGS. 31A and 31B, infrared sensor 1J being a variation of infrared sensor 1I further includes insulating layer 222, beams 101c, 101d, 102c, 102d, 102e, 102f, 102g, 102h, 102i, 102j, 102k, 102l, and first wires 16c, 16d, 16e, 16f, 16g, 16h, 16i, 16j, 16k, 16l, 16m, 16n.

Insulating layer 222 consists of, for example, Si.

First wires 16a, 16c, 16d, 16f, 16h, 16j, 16l, 16n are formed on insulating layer 222.

Infrared ray absorption layer 203 is formed on insulating layer 222.

One ends of beams 101a, 101b, 101c, 101d, 102a, 102b, 102c, 102d, 102e, 102f, 102g, 102h, 102i, 102j, 102k, 102l are connected to insulating layer 222.

Other ends of beams 101a, 101b, 101c, 101d, 102a, 102b, 102c, 102d, 102e, 102f, 102g, 102h, 102i, 102j, 102k, 102l are connected to base substrate 11.

Beams 101a, 101b, 101c, 101d are electrically connected in series by first wires 16a, 16b, 16c. One of beams 101a, 101c and one of beams 101b, 101d consist of a p-type semiconductor material. The other one of beams 101a, 101c and the other one of beams 101b, 101d consist of an n-type semiconductor material.

Each of beams 101a, 101b, 101c, 101d, 102a, 102b, 102c, 102d, 102e, 102f, 102g, 102h, 102i, 102j, 102k, 102l has a phononic crystal structure.

Beams 102a, 102b, 102c, 102d, 102e, 102f, 102g, 102h, 102i, 102j, 102k, 102l are electrically connected in series by first wires 16d, 16e, 16f, 16g, 16h, 16i, 16j, 16k, 16l, 16m, 16n. One of beams 102a, 102c, 102e, 102g, 102i, 102k and one of beams 102b, 102d, 102f, 102h, 102i, 102j, 102l consist of a p-type semiconductor material. The other one of beams 102a, 102c, 102e, 102g, 102i, 102k and the other one of beams 102b, 102d, 102f, 102h, 102i, 102j, 102l consist of an n-type semiconductor material. First wires 16d, 16f, 16h, 16j, 16l, 16n correspond to the cold junction of the Peltier device. Infrared ray absorption layer 203 is indirectly cooled via insulating layer 222. Since infrared sensor 1J has a plurality of cold junctions, infrared sensor 1J exhibits further excellent cooling effect.

Example 1

An infrared sensor according to Example 1 was structured similarly to infrared sensor 1A according to the first exemplary embodiment.

Using the semiconductor process technique, the infrared sensor according to Example 1 was manufacturing as follows.

Firstly, SOI wafer 111 (available from Shin-Etsu Chemical Co., Ltd.) was purchased. As shown in FIGS. 12A and 12B, SOI wafer 111 had layered structure consisting of lower Si layer 501 having a thickness of 625 μm, intermediate $SiO_2$ layer 502 having a thickness of 2 μm, and upper Si layer 503 having a thickness of 150 nm.

Next, as shown in FIGS. 13A to 13C, by photolithography and ion injection, region 1011a to be beam 101a, region 1011b to be beam 101b, region 1021a to be beam 102a, and region 1021b to be beam 102b were doped with ions which will be described later. Note that, regions 1011a, 1011b, 1021a, 1021b were included in region R having a quadrangular outer shape. Each of regions 1011a, 1011b was doped with boron (B) at an acceleration voltage of 20 keV and by a dose of $9.3 \times 10^{14}$ atoms/$cm^2$. On the other hand, region 1021a was doped with boron at an acceleration voltage of 20 keV and by a dose of $9.3 \times 10^{14}$ atoms/$cm^2$. Region 1021b was doped with phosphorus at an acceleration voltage of 55 keV and a dose of $9.0 \times 10^{14}$ atoms/$cm^2$. Then, SOI wafer 111 underwent heat treatment for five minutes in nitrogen atmosphere at 1000° C.

Next, a plurality of through holes 18 each having a diameter of 80 nm were periodically formed every 100 nm by electron beam lithography and etching at regions 1011a, 1011b, 1021a, 1022b. FIG. 13D is an enlarged view of region 1011b where a plurality of through holes 18 were formed. In this manner, the phononic crystal structure was formed. The ratio of the diameter 80 nm of each through hole 18 against the period 100 nm was 0.8.

Next, as shown in FIGS. 14A to 14E, by photolithography and etching, Si layer 503 at region R (FIG. 13A) excluding regions 1011a, 1011 b, 1021a, 1021b was removed, to form beams 101a, 101b, 102a, 102b. Each of beams 101a, 101b had width W1 of 1 μm and length L1 of 14 μm. Each of beams 102a, 102b functioning as a Peltier device had width W2 of 1 μm and length L2 of 16 μm.

Next, as shown in FIGS. 15A to 15C, by photolithography and sputtering, second wires 14a, 14b, 14c, 14d consisting of Al and having a thickness of 100 nm, and electrode pads 13a, 13b, 15a, 15b consisting of Al and having a thickness of 100 nm were formed. In parallel, by photolithography and sputtering, first wire 16 consisting of Al and having a thickness of 100 nm that electrically connects beams 102a, 102b was formed. Then, by photolithography and sputtering, insulating film 17 consisting of SiN and having a thickness of 30 nm was formed so as to cover first wire 16.

Next, as shown in FIGS. 16A to 16C, by photolithography and sputtering, resistance variable layer 201 consisting of amorphous Si, insulating film 202 consisting of SiN, and infrared ray absorption layer 203 consisting of Cr were layered, to form infrared ray receiver 12A. Infrared ray receiver 12A measured 12 μm×12 μm. Resistance variable layer 201 had a thickness of 200 nm. Insulating film 202 had a thickness of 30 nm. Infrared ray absorption layer 203 had a thickness of 5 nm.

Finally, as shown in FIGS. 17A to 17C, $SiO_2$ layer 502 was partially removed by hydrogen fluoride vapor phase etching. In this manner, infrared sensor according to Example 1 was fabricated.

Example 2

Using block copolymer lithography in place of electron beam lithography, an infrared sensor was fabricated similarly to Example 1 except that through holes 18 each having a diameter of 27.2 nm was periodically formed every 34 nm. The ratio of diameter 27.2 nm of each through hole 18 against the period 34 nm was 0.8 similarly to Example 1. Accordingly, Example 1 and Example 2 were identical to each other in void fraction. Here, the void fraction means the rate of the sum of the area of the plurality of through holes 18 against the area of regions 1011a, 1011b, 1021a or 1021b as seen in a plan view. For example, when the area of region 1011a is S1 (FIG. 13A), the number of through holes 18 formed at region 1011a is n1, and the area of each through hole 18 is s1 (FIG. 7B), the void fraction is obtained by n1×s1/S1.

Comparative Example 1

An infrared sensor was fabricated through a process similar to that of Example 1 except that no through holes 18 were formed.

Performance of Peltier Device

The Peltier effect of the infrared sensor according to each of Examples 1, 2 and Comparative example 1 was examined. While infrared ray receiver 12A was being cooled by a steady-state current of 3 mA caused to pass through beams 102a, 102b, a steady-state voltage of 2 V was applied to beams 101a, 101b. The current passing through resistance variable layer 201 at this time was measured, and the temperature of infrared ray receiver 12A was calculated from a change in resistance of resistance variable layer 201. The temperature of infrared ray receiver 12A before being cooled was 25.0° C.

Table 1 shows the results of Examples 1, 2 and Comparative example 1.

TABLE 1

|  | Period of phononic crystal (nm) | Temperature of infrared ray receiver (° C.) |
| --- | --- | --- |
| Comparative example 1 | N/A | 20.6 |
| Example 1 | 100 | 13.5 |
| Example 2 | 34 | −2.0 |

As can be seen from Table 1, the Peltier effect that the infrared sensor according to each of Examples 1, 2 exhibits is superior than the Peltier effect that the infrared sensor according to Comparative example 1 exhibits. Further, it can be seen that, when each of beams 102a, 102b functioning as a Peltier device has a phononic crystal, the cooling performance of the Peltier device improves as the period of the phononic crystal is smaller.

Time-Response Test

Infrared sensors according to Example 1 and Comparative example 1 underwent a time-response test. In the time-response test, firstly, a signal processing circuit applied a constant voltage to beams 101a, 101b via electrode pads 13a, 13b and second wires 14a, 14b, and the signal processing circuit monitored the amount of current passing through resistance variable layer 201. Next, infrared ray receiver 12A was irradiated with an infrared ray for 5 ms. Thereafter, the infrared ray was shut off. At the same time, immediately after a pulse current of 25 μA was started to be applied to beams 102a, 102b, a pulse current of 25 μA was applied to beams 102a, 102b for 0.010 ms.

Figure 32B:
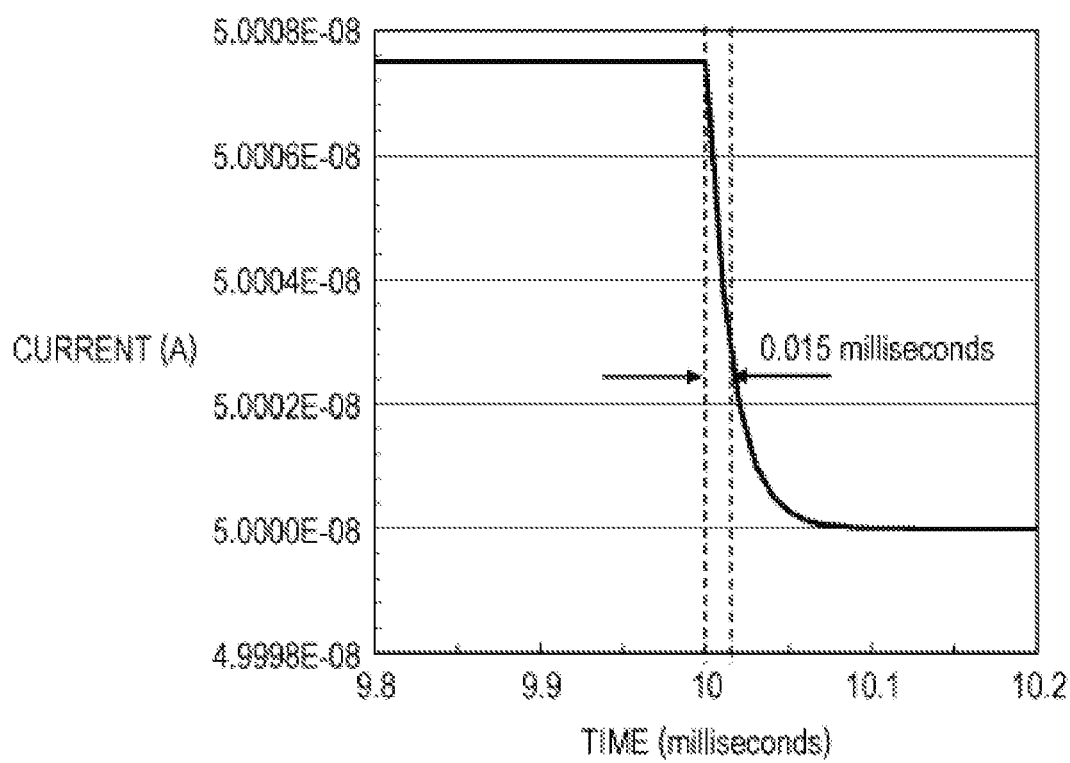
FIG. 32B is an enlarged view of portion B encircled by a broken line in FIG. 32A.
Figure 32C:
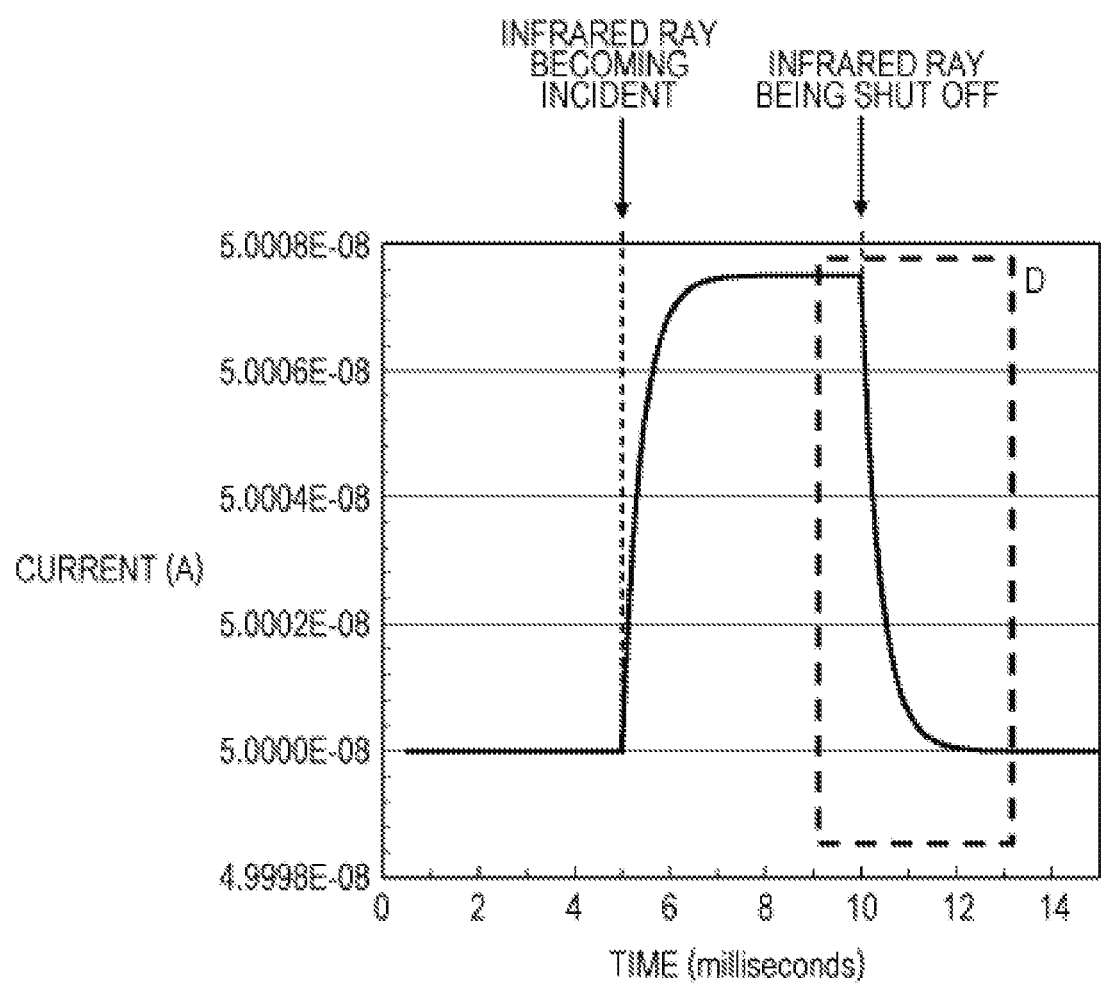
FIG. 32C is a graph showing a result of a time-response test when current is not passed through the beams of the infrared sensor according to Example 1.
Figure 32D:
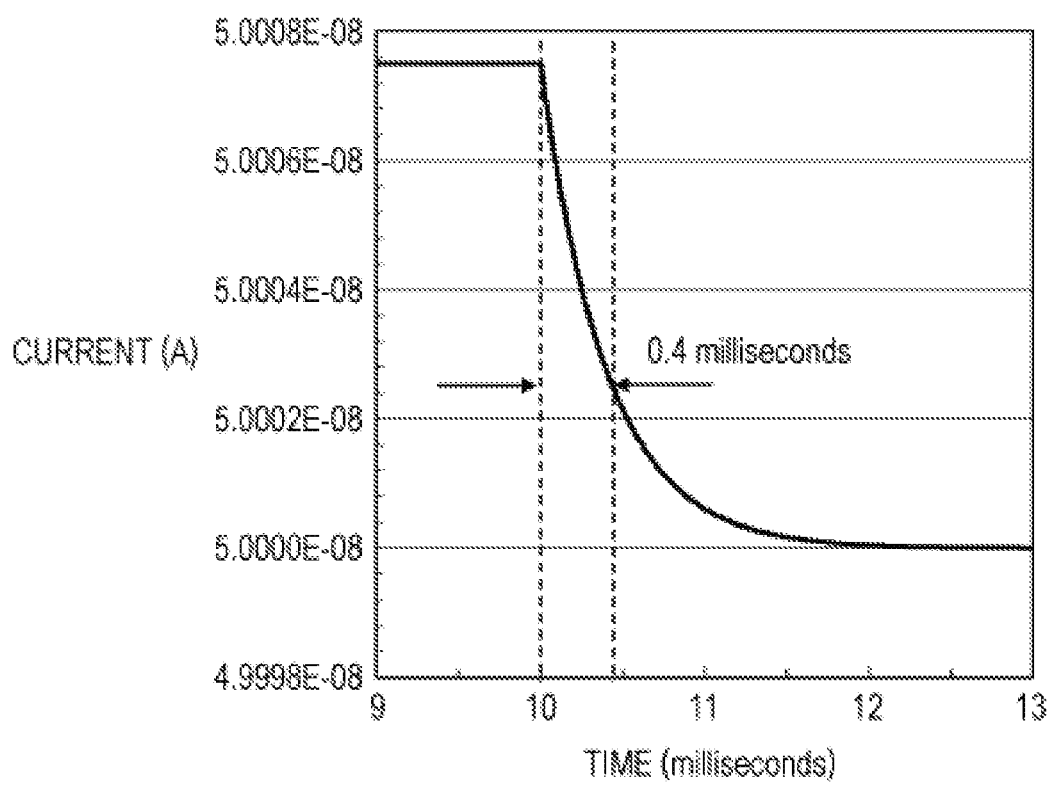
FIG. 32D is an enlarged view of portion D encircled by a broken line in FIG. 32C.
Figure 32E:
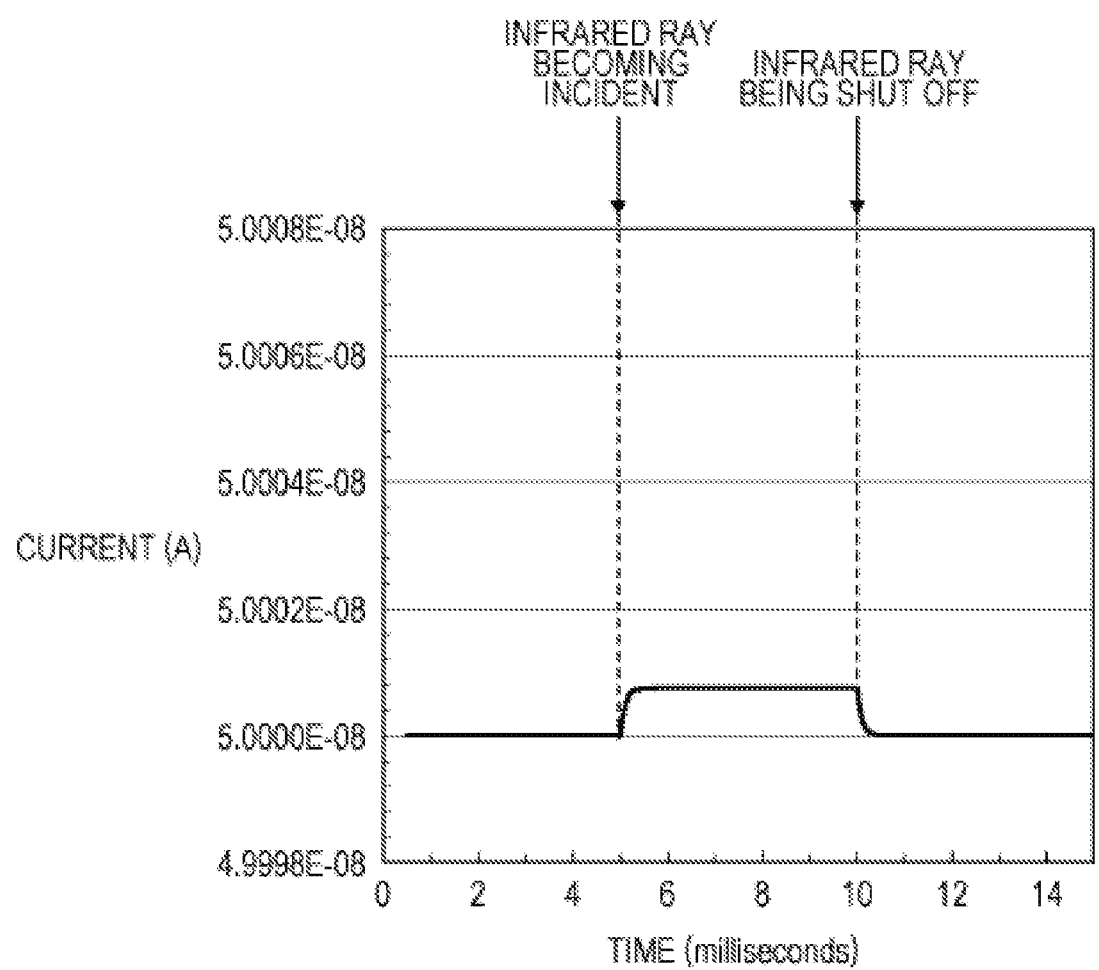
FIG. 32E is a graph showing a result of a time-response test when current is not passed through beams of an infrared sensor according to Comparative example 1.

FIG. 32A is a graph showing the result of the time-response test when the current was applied to beams 102 of the infrared sensor according to Example 1. FIG. 32B is an enlarged view of portion B surrounded by a broken line shown in FIG. 32A. FIG. 32C is a graph showing the result of the time-response test when no current was applied to beams 102 of the infrared sensor according to Example 1. FIG. 32D is an enlarged view of portion D encircled by a broken line in FIG. 32C. FIG. 32E is a graph showing the result of the time-response test when no current was applied to beams 102 of the infrared sensor according to Comparative example 1.

As can be seen from FIGS. 32A and 32E, the current value of resistance variable layer 201 of the infrared sensor according to Example 1 is greater than the current value of resistance variable layer 201 of the infrared sensor according to Comparative example 1. That is, the infrared sensor according to Example 1 having the phononic crystal is excellent in detection sensitivity than the infrared sensor according to Comparative example 1 having no phononic crystal.

Further, as can be seen from FIGS. 32B and 32D, the pulse current flowing through beams 102a, 102b largely reduces the falling time from 0.4 ms to 0.015 ms. Here, it is assumed that the time point where the infrared ray is shut off is $t_0$, the current value at time point $t_0$ is $I_0$, and the time point where the current value attains $I_0 \times \exp(-1)$ after the shutting off the infrared ray is $t_1$. The falling time is defined by $t_1-t_0$. When the falling time following the shutting off the first infrared ray is short, detection of the second infrared ray becoming incident on infrared ray receiver 12A the next can be accurately started within a short time after the shutting off the first infrared ray. Therefore, for example, in detecting the temperature of a distanced target object, a reduction in the temperature of the target object is quickly detected.

From the foregoing, by cooling infrared ray receiver 12A using the Peltier device, the response speed of the infrared sensor (that is, the shortness of time from the shutting off the first infrared ray to the starting accurately detecting the second infrared ray) improves.

The configuration of the present disclosure provides an infrared sensor being excellent in both of detection sensitivity and response speed.

The inventive aspects derived from the above-described disclosure are shown in the following.

Article A1

An infrared sensor comprising:
a base substrate;
a bolometer infrared ray receiver;
a Peltier device;
a first post extending in a direction becoming far from the base substrate;
a second post extending in a direction becoming far from the base substrate;
a third post extending in a direction becoming far from the base substrate; and
a fourth post extending in a direction becoming far from the base substrate, wherein
the bolometer infrared ray receiver comprises
a resistance variable layer in which resistance varies upon absorption of an infrared ray,
a bolometer first beam electrically connected to the resistance variable layer, and
a bolometer second beam electrically connected to the resistance variable layer,
a front surface of the bolometer infrared ray receiver is irradiated with the infrared ray,
the Peltier device comprises a Peltier first beam formed of a p-type semiconductor material and a Peltier second beam formed of an n-type semiconductor material,
the Peltier device is in contact with a back surface of the bolometer infrared ray receiver,
one end of the bolometer first beam, one end of the bolometer second beam, one end of the Peltier first beam, and one end of the Peltier second beam are respectively connected to the first post, the second post, the third post, and the fourth post,
the bolometer infrared ray receiver, the bolometer first beam, and the bolometer second beam are suspended above the base substrate by the first post and the second post,
the Peltier device, the Peltier first beam, and the Peltier second beam are suspended above the base substrate by the third post and the fourth post,
the bolometer first beam has a first phononic crystal structure including a plurality of through holes arranged regularly,
the bolometer second beam has a second phononic crystal structure including a plurality of through holes arranged regularly,
the Peltier first beam has a third phononic crystal structure including a plurality of through holes arranged regularly, and
the Peltier second beam has a fourth phononic crystal structure including a plurality of through holes arranged regularly.

Article A2

The infrared sensor according to article A1, wherein
the first phononic crystal structure is provided at a first section between the first post and one end of the resistance variable layer in the bolometer first beam as seen in a plan view,
the second phononic crystal structure is provided at a second section between the second post and another end of the resistance variable layer in the bolometer second beam as seen in the plan view,
the third phononic crystal structure is provided at a third section between the third post and the one end of the resistance variable layer in the Peltier first beam as seen in the plan view, and
the fourth phononic crystal structure is provided at a fourth section between the fourth post and another end of the resistance variable layer in the Peltier second beam as seen in the plan view.

Article A3

The infrared sensor according to article A1, wherein
the plurality of through holes of the first phononic crystal structure are regularly arranged with a first period,
the plurality of through holes of the second phononic crystal structure are regularly arranged with a second period,
the plurality of through holes of the third phononic crystal structure are regularly arranged with a third period, and
the plurality of through holes of the fourth phononic crystal structure are regularly arranged with a fourth period.

Article A4

The infrared sensor according to article A3, wherein the first period, the second period, the third period, and the fourth period are equal to one another.

Article A5

The infrared sensor according to article A1, wherein
another end of the Peltier first beam is connected to another end of the Peltier second beam, to form an interface between the Peltier first beam and the Peltier second beam, and
the interface is thermally connected to the resistance variable layer.

Article A6

The infrared sensor according to article A1, wherein
another end of the Peltier first beam is unconnected to another end of the Peltier second beam,
the Peltier first beam is electrically connected to the Peltier second beam with a first wire, and
the first wire is thermally connected to the resistance variable layer.

Article A7

The infrared sensor according to article A5, wherein
the resistance variable layer has four regions being equal to one another in area as seen in a plan view, and
the interface is in contact with at least two of the regions.

Article A8

The infrared sensor according to article A3, wherein
the bolometer first beam, the bolometer second beam, the Peltier first beam, and the Peltier second beam respectively include a first domain, a second domain, a third domain, and a fourth domain,
the first domain, the second domain, the third domain, and the fourth domain respectively include the first phononic crystal structure, the second phononic crystal structure, the third phononic crystal structure, and the fourth phononic crystal structure,
the bolometer first beam, the bolometer second beam, the Peltier first beam, and the Peltier second beam respectively include a fifth domain, a sixth domain, a seventh domain, and an eighth domain,
in the fifth domain, a fifth phononic crystal structure including a plurality of through holes regularly arranged with a fifth period is formed, in the sixth domain, a sixth phononic crystal structure including a plurality of through holes regularly arranged with a sixth period is formed, in the seventh domain, a seventh phononic crystal structure including a plurality of through holes regularly arranged with a seventh period are formed, in the eighth domain, an eighth phononic crystal structure including a plurality of through holes regularly arranged with an eighth period, as seen in a plan view, the first domain is interposed between the fifth domain and the resistance variable layer, as seen in the plan view, the second domain is interposed between the sixth domain and the resistance variable layer, as seen in the plan view, the third domain is interposed between the seventh domain and the resistance variable layer, as seen in the plan view, the fourth domain is interposed between the eighth domain and the resistance variable layer, the fifth period is greater than the first period, the sixth period is greater than the second period, the seventh period is greater than the third period, and the eighth period is greater than the fourth period.

Article A9

The infrared sensor according to article A8, wherein in the first domain, among the plurality of through holes regularly arranged with the first period in the first domain, a plurality of through holes regularly arranged with a ninth period different from the first period are formed, in the second domain, among the plurality of through holes regularly arranged with the second period in the second domain, a plurality of through holes regularly arranged with a tenth period different from the second period are formed, in the third domain, among the plurality of through holes regularly arranged with the third period in the third domain, a plurality of through holes regularly arranged with an eleventh period different from the third period are formed, in the fourth domain, among the plurality of through holes regularly arranged with the fourth period in the fourth domain, a plurality of through holes regularly arranged with a twelfth period different from the fourth period are formed, in the fifth domain, among the plurality of through holes regularly arranged with the fifth period in the fifth domain, a plurality of through holes regularly arranged with a thirteenth period different from the fifth period are formed, in the sixth domain, among the plurality of through holes regularly arranged with the sixth period in the sixth domain, a plurality of through holes regularly arranged with a fourteenth period different from the sixth period are formed, in the seventh domain, among the plurality of through holes regularly arranged with the seventh period in the seventh domain, a plurality of through holes regularly arranged with a fifteenth period different from the seventh period are formed, and in the eighth domain, among the plurality of through holes regularly arranged with the eighth period in the eighth domain, a plurality of through holes regularly arranged with a sixteenth period different from the eighth period are formed.

Article A10

The infrared sensor according to article A8, wherein the plurality of through holes regularly arranged with the first period, the plurality of through holes regularly arranged with the second period, the plurality of through holes regularly arranged with the third period, the plurality of through holes regularly arranged with the fourth period, the plurality of through holes regularly arranged with the fifth period, the plurality of through holes regularly arranged with the sixth period, the plurality of through holes regularly arranged with the seventh period, and the plurality of through holes regularly arranged with the eighth period are each at least five in number.

Article A11

The infrared sensor according to article A8, wherein a unit lattice of a periodic structure composing each of the first domain, the second domain, the third domain, the fourth domain, the fifth domain, the sixth domain, the seventh domain, and the eighth domain is selected from a group consisting of a tetragonal lattice, a hexagonal lattice, a rectangular lattice, and a centered-rectangular lattice.

Article A12

The infrared sensor according to article A8, wherein the first period, the second period, the third period, the fourth period, the fifth period, the sixth period, the seventh period, and the eighth period each have a value of not less than 1 nm and not more than 300 nm.

Article A13

The infrared sensor according to article A8, wherein a value obtained by dividing a value of a diameter of each of the plurality of through holes regularly arranged with the first period by a value of the first period, a value obtained by dividing a value of a diameter of each of the plurality of through holes regularly arranged with the second period by a value of the second period, a value obtained by dividing a value of a diameter of each of the plurality of through holes regularly arranged with the third period by a value of the third period, a value obtained by dividing a value of a diameter of each of the plurality of through holes regularly arranged with the fourth period by a value of the fourth period, a value obtained by dividing a value of a diameter of each of the plurality of through holes regularly arranged with the fifth period by a value of the fifth period, a value obtained by dividing a value of a diameter of each of the plurality of through holes regularly arranged with the sixth period by a value of the sixth period, a value obtained by dividing a value of a diameter of each of the plurality of through holes regularly arranged with the seventh period by a value of the seventh period, and a value obtained by dividing a value of a diameter of each of the plurality of through holes regularly arranged with the eighth period by a value of the eighth period each are not less than 0.5 and not more than 0.9.

Article A14

The infrared sensor according to article A1, wherein the bolometer first beam, the bolometer second beam, the Peltier first beam, and the Peltier second beam respectively include a first domain, a second domain, a third domain, and a fourth domain, the first domain includes a plurality of first sub domains regularly arranged with a first period, the second domain includes a plurality of second sub domains regularly arranged with a second period, the third domain includes a plurality of third sub domains regularly arranged with a third period, the fourth domain includes a plurality of fourth sub domains regularly arranged with a fourth period, the plurality of first sub domains are each formed of a phononic crystal including a plurality of through holes regularly arranged with a fifth period, the plurality of second sub domains are each formed of a phononic crystal including a plurality of through holes regularly arranged with a sixth period, the plurality of third sub domains are each formed of a phononic crystal including a plurality of through holes regularly arranged with a seventh period, and the plurality of fourth sub domains are each formed of a phononic crystal including a plurality of through holes regularly arranged with an eighth period.

Article A15

The infrared sensor according to article A14, wherein the bolometer first beam further includes a fifth domain, the bolometer second beam further includes a sixth domain, the Peltier first beam further includes a seventh domain, the Peltier second beam further includes an eighth domain, the fifth domain includes a plurality of fifth sub domains regularly arranged with a ninth period, the sixth domain includes a plurality of sixth sub domains regularly arranged with a tenth period, the seventh domain includes a plurality of seventh sub domains regularly arranged with an eleventh period, the eighth domain includes a plurality of eighth sub domains regularly arranged with a twelfth period, the plurality of fifth sub domains are each formed of a phononic crystal including a plurality of through holes regularly arranged with a thirteenth period, the plurality of sixth sub domains are each formed of a phononic crystal including a plurality of through holes regularly arranged with a fourteenth period, the plurality of seventh sub domains are each formed of a phononic crystal including a plurality of through holes regularly arranged with a fifteenth period, the plurality of eighth sub domains are each formed of a phononic crystal including a plurality of through holes regularly arranged with a sixteenth period, as seen in a plan view, the first domain is interposed between the fifth domain and the resistance variable layer, as seen in the plan view, the second domain is interposed between the sixth domain and the resistance variable layer, as seen in the plan view, the third domain is interposed between the seventh domain and the resistance variable layer, as seen in the plan view, the fourth domain is interposed between the eighth domain and the resistance variable layer, the ninth period is greater in value than the first period, the tenth period is greater in value than the second period, the eleventh period is greater in value than the third period, and the twelfth period is greater in value than the fourth period.

Article A16

A method for cooling a bolometer infrared ray receiver of an infrared sensor, the method including:

(a) providing the infrared sensor that comprises a base substrate including a recess, the bolometer infrared ray receiver, a Peltier device, a first post extending in a direction becoming far from the base substrate, a second post extending in a direction becoming far from the base substrate, a third post extending in a direction becoming far from the base substrate, and a fourth post extending in a direction becoming far from the base substrate, wherein the bolometer infrared ray receiver comprises a resistance variable layer in which resistance varies upon absorption of an infrared ray, a bolometer first beam electrically connected to the resistance variable layer, and a bolometer second beam electrically connected to the resistance variable layer, a front surface of the bolometer infrared ray receiver is irradiated with the infrared ray, the Peltier device comprises a Peltier first beam formed of a p-type semiconductor material and a Peltier second beam formed of an n-type semiconductor material, the Peltier device is in contact with a back surface of the bolometer infrared ray receiver, one end of the bolometer first beam, one end of the bolometer second beam, one end of the Peltier first beam, and one end of the Peltier second beam are respectively connected to the first post, the second post, the third post, and the fourth post, the bolometer infrared ray receiver, the bolometer first beam, and the bolometer second beam are suspended above the base substrate by the first post and the second post, the Peltier device, the Peltier first beam, and the Peltier second beam are suspended above the base substrate by the third post and the fourth post, the bolometer first beam has a first phononic crystal structure including a plurality of through holes arranged regularly, the bolometer second beam has a second phononic crystal structure including a plurality of through holes arranged regularly, the Peltier first beam has a third phononic crystal structure including a plurality of through holes arranged regularly, and the Peltier second beam has a fourth phononic crystal structure including a plurality of through holes arranged regularly, (b) irradiating the front surface of the bolometer infrared ray receiver with the infrared ray;

(c) shutting off the infrared ray being incident on the bolometer infrared ray receiver; and (d) applying current to the Peltier first beam and the Peltier second beam, to cool the bolometer infrared ray receiver.

Article A17

The method according to article A16, wherein the first phononic crystal structure is provided at a first section between another end of the bolometer first beam and one end of the resistance variable layer in the bolometer first beam as seen in a plan view, the second phononic crystal structure is provided at a second section between another end of the bolometer second beam and another end of the resistance variable layer in the bolometer second beam as seen in the plan view, the third phononic crystal structure is provided at a third section between another end of the Peltier first beam and the one end of the resistance variable layer in the Peltier first beam as seen in the plan view, and the fourth phononic crystal structure is provided at a fourth section between another end of the Peltier second beam and the other end of the resistance variable layer in the Peltier second beam as seen in the plan view.

Article A18

The method for cooling a bolometer infrared ray receiver of an infrared sensor according to article A16, wherein the plurality of through holes of the first phononic crystal structure are regularly arranged with a first period, the plurality of through holes of the second phononic crystal structure are regularly arranged with a second period, the plurality of through holes of the third phononic crystal structure are regularly arranged with a third period, and the plurality of through holes of the fourth phononic crystal structure are regularly arranged with a fourth period.

Article A19

The method for cooling a bolometer infrared ray receiver of an infrared sensor according to article A18, wherein the first period, the second period, the third period, and the fourth period are equal to one another.

Article A20

The method for cooling a bolometer infrared ray receiver of an infrared sensor according to article A16, wherein another end of the Peltier first beam is connected to another end of the Peltier second beam, to form an interface between the Peltier first beam and the Peltier second beam, and the interface is interposed between the resistance variable layer and the recess.

Article B1

An infrared sensor comprising:

a base substrate;

a bolometer infrared ray receiver;

a Peltier device;

a first post extending in a direction becoming far from the base substrate;

a second post extending in a direction becoming far from the base substrate;

a third post extending in a direction becoming far from the base substrate; and a fourth post extending in a direction becoming far from the base substrate, wherein the bolometer infrared ray receiver comprises a resistance variable layer in which resistance varies upon absorption of an infrared ray, a bolometer first beam formed of a first insulating material, a bolometer second beam formed of a second insulating material, a bolometer first thin film formed on the bolometer first beam, and a bolometer second thin film formed on the bolometer second beam, wherein the bolometer first thin film is electrically connected to the resistance variable layer, the bolometer second thin film is electrically connected to the resistance variable layer, and a front surface of the bolometer infrared ray receiver is irradiated with the infrared ray, the Peltier device comprises a Peltier first beam formed of a third insulating material, a Peltier second beam formed of a fourth insulating material, a Peltier first thin film formed on the Peltier first beam, and a Peltier second thin film formed on the Peltier second beam, wherein the Peltier first thin film is formed of a p-type semiconductor material, and the Peltier first thin film is formed of an n-type semiconductor material, the Peltier device is in contact with a back surface of the bolometer infrared ray receiver, one end of the bolometer first beam and one end of the bolometer first thin film are connected to the first post, one end of the bolometer second beam and one end of the bolometer second thin film are connected to the second post, one end of the Peltier first beam and one end of the Peltier first thin film are connected to the third post, one end of the Peltier second beam and one end of the Peltier second thin film are connected to the fourth post, the bolometer infrared ray receiver, the bolometer first beam, the bolometer first thin film, the bolometer second beam, and the bolometer second thin film are suspended above the base substrate by the first post and the second post, the Peltier device, the Peltier first beam, the Peltier first thin film, the Peltier second beam, and the Peltier second thin film are suspended above the base substrate by the third post and the fourth post, the bolometer first thin film has a first phononic crystal structure structured by a plurality of through holes arranged regularly, the bolometer second thin film has a second phononic crystal structure including a plurality of through holes arranged regularly, the Peltier first thin film includes a third phononic crystal structure including a plurality of through holes arranged regularly, and the Peltier second thin film has a fourth phononic crystal structure including a plurality of through holes arranged regularly.

Article B2

The infrared sensor according to article B1, wherein the first phononic crystal structure is provided at a first section between the first post and one end of the resistance variable layer in the bolometer first thin film as seen in a plan view, the second phononic crystal structure is provided at a second section between the second post and another end of the resistance variable layer in the bolometer second thin film as seen in the plan view, the third phononic crystal structure is provided at a third section between the third post and the one end of the resistance variable layer in the Peltier first thin film as seen in the plan view, and the fourth phononic crystal structure is provided at a fourth section between the fourth post and another end of the resistance variable layer in the Peltier second thin film as seen in the plan view.

Article B3

The infrared sensor according to article B1, wherein the plurality of through holes of the first phononic crystal structure are regularly arranged with a first period, the plurality of through holes of the second phononic crystal structure are regularly arranged with a second period, the plurality of through holes of the third phononic crystal structure are regularly arranged with a third period, and the plurality of through holes of the fourth phononic crystal structure are regularly arranged with a fourth period.

Article B4

The infrared sensor according to article B3, wherein the first period, the second period, the third period, and the fourth period are equal to one another.

Article B5

The infrared sensor according to article B1, wherein another end of the Peltier first thin film is connected to another end of the Peltier second thin film, to form an interface between the Peltier first thin film and the Peltier second thin film, and the interface is thermally connected to the resistance variable layer.

Article B6

The infrared sensor according to article B1, wherein
another end of the Peltier first thin film is unconnected to another end of the Peltier second thin film,
the Peltier first thin film is electrically connected to the Peltier second thin film with a first wire, and
the first wire is thermally connected to the resistance variable layer.

Article B7

The infrared sensor according to article B5, wherein
the resistance variable layer has four regions being equal to one another in area as seen in a plan view, and
the interface is in contact with at least two of the regions.

Article B8

The infrared sensor according to article B3, wherein
the bolometer first thin film, the bolometer second thin film, the Peltier first thin film, and the Peltier second thin film respectively include a first domain, a second domain, a third domain, and a fourth domain,
the first domain, the second domain, the third domain, and the fourth domain respectively include the first phononic crystal structure, the second phononic crystal structure, the third phononic crystal structure, and the fourth phononic crystal structure,
the bolometer first thin film, the bolometer second thin film, the Peltier first thin film, and the Peltier second thin film respectively include a fifth domain, a sixth domain, a seventh domain, and an eighth domain,
in the fifth domain, a fifth phononic crystal structure including a plurality of through holes regularly arranged with a fifth period is formed,
in the sixth domain, a sixth phononic crystal structure including a plurality of through holes regularly arranged with a sixth period is formed,
in the seventh domain, a seventh phononic crystal structure including a plurality of through holes regularly arranged with a seventh period is formed,
in the eighth domain, an eighth phononic crystal structure including a plurality of through holes regularly arranged with an eighth period is formed,
as seen in a plan view, the first domain is interposed between the fifth domain and the resistance variable layer,
as seen in the plan view, the second domain is interposed between the sixth domain and the resistance variable layer,
as seen in the plan view, the third domain is interposed between the seventh domain and the resistance variable layer,
as seen in the plan view, the fourth domain is interposed between the eighth domain and the resistance variable layer,
the fifth period is greater than the first period,
the sixth period is greater than the second period,
the seventh period is greater than the third period, and
the eighth period is greater than the fourth period.

Article B9

The infrared sensor according to article B8, wherein
in the first domain, among the plurality of through holes regularly arranged with the first period in the first domain, a plurality of through holes regularly arranged with a ninth period different from the first period are formed,
in the second domain, among the plurality of through holes regularly arranged with the second period in the second domain, a plurality of through holes regularly arranged with a tenth period different from the second period are formed,
in the third domain, among the plurality of through holes regularly arranged with the third period in the third domain, a plurality of through holes regularly arranged with an eleventh period different from the third period are formed,
in the fourth domain, among the plurality of through holes regularly arranged with the fourth period in the fourth domain, a plurality of through holes regularly arranged with a twelfth period different from the fourth period are formed,
in the fifth domain, among the plurality of through holes regularly arranged with the fifth period in the fifth domain, a plurality of through holes regularly arranged with a thirteenth period different from the fifth period are formed,
in the sixth domain, among the plurality of through holes regularly arranged with the sixth period in the sixth domain, a plurality of through holes regularly arranged with a fourteenth period different from the sixth period are formed,
in the seventh domain, among the plurality of through holes regularly arranged with the seventh period in the seventh domain, a plurality of through holes regularly arranged with a fifteenth period different from the seventh period are formed, and
in the eighth domain, among the plurality of through holes regularly arranged with the eighth period in the eighth domain, a plurality of through holes regularly arranged with a sixteenth period different from the eighth period are formed.

Article B10

The infrared sensor according to article B8, wherein the plurality of through holes regularly arranged with the first period, the plurality of through holes regularly arranged with the second period, the plurality of through holes regularly arranged with the third period, the plurality of through holes regularly arranged with the fourth period, the plurality of through holes regularly arranged with the fifth period, the plurality of through holes regularly arranged with the sixth period, the plurality of through holes regularly arranged with the seventh period, and the plurality of through holes regularly arranged with the eighth period are each at least five in number.

Article B11

The infrared sensor according to article B8, wherein a unit lattice of a periodic structure composing each of the first domain, the second domain, the third domain, the fourth domain, the fifth domain, the sixth domain, the seventh domain, and the eighth domain is selected from a group consisting of a tetragonal lattice, a hexagonal lattice, a rectangular lattice, and a centered-rectangular lattice.

Article B12

The infrared sensor according to article B8, wherein the first period, the second period, the third period, the fourth period, the fifth period, the sixth period, the seventh period, and the eighth period each have a value of not less than 1 nm and not more than 300 nm.

Article B13

The infrared sensor according to article B8, wherein a value obtained by dividing a value of a diameter of each of the plurality of through holes regularly arranged with the first period by a value of the first period, a value obtained by dividing a value of a diameter of each of the plurality of through holes regularly arranged with the second period by a value of the second period, a value obtained by dividing a value of a diameter of each of the plurality of through holes regularly arranged with the third period by a value of the third period, a value obtained by dividing a value of a diameter of each of the plurality of through holes regularly arranged with the fourth period by a value of the fourth period, a value obtained by dividing a value of a diameter of each of the plurality of through holes regularly arranged with the fifth period by a value of the fifth period, a value obtained by dividing a value of a diameter of each of the plurality of through holes regularly arranged with the sixth period by a value of the sixth period, a value obtained by dividing a value of a diameter of each of the plurality of through holes regularly arranged with the seventh period by a value of the seventh period, and a value obtained by dividing a value of a diameter of each of the plurality of through holes regularly arranged with the eighth period by a value of the eighth period each are not less than 0.5 and not more than 0.9.

Article B14

The infrared sensor according to article B1, wherein the bolometer first beam, the bolometer second beam, the Peltier first beam, and the Peltier second beam respectively include a first domain, a second domain, a third domain, and a fourth domain, the first domain includes a plurality of first sub domains regularly arranged with a first period, the second domain includes a plurality of second sub domains regularly arranged with a second period, the third domain includes a plurality of third sub domains regularly arranged with a third period, the fourth domain includes a plurality of fourth sub domains regularly arranged with a fourth period, the plurality of first sub domains are each formed of a phononic crystal including a plurality of through holes regularly arranged with a fifth period, the plurality of second sub domains are each formed of a phononic crystal including a plurality of through holes regularly arranged with a sixth period, the plurality of third sub domains are each formed of a phononic crystal including a plurality of through holes regularly arranged with a seventh period, and the plurality of fourth sub domains are each formed of a phononic crystal including a plurality of through holes regularly arranged with an eighth period.

Article B15

The infrared sensor according to article B14, wherein the bolometer first beam further includes a fifth domain, the bolometer second beam further includes a sixth domain, the Peltier first beam further includes a seventh domain, the Peltier second beam further includes an eighth domain, the fifth domain includes a plurality of fifth sub domains regularly arranged with a ninth period, the sixth domain includes a plurality of sixth sub domains regularly arranged with a tenth period, the seventh domain includes a plurality of seventh sub domains regularly arranged with an eleventh period, the eighth domain includes a plurality of eighth sub domains regularly arranged with a twelfth period, the plurality of fifth sub domains are each formed of a phononic crystal including a plurality of through holes regularly arranged with a thirteenth period, the plurality of sixth sub domains are each formed of a phononic crystal including a plurality of through holes regularly arranged with a fourteenth period, the plurality of seventh sub domains are each formed of a phononic crystal including a plurality of through holes regularly arranged with a fifteenth period, the plurality of eighth sub domains are each formed of a phononic crystal including a plurality of through holes regularly arranged with a sixteenth period, as seen in a plan view, the first domain is interposed between the fifth domain and the resistance variable layer, as seen in the plan view, the second domain is interposed between the sixth domain and the resistance variable layer, as seen in the plan view, the third domain is interposed between the seventh domain and the resistance variable layer, as seen in the plan view, the fourth domain is interposed between the eighth domain and the resistance variable layer, the ninth period is greater in value than the first period, the tenth period is greater in value than the second period, the eleventh period is greater in value than the third period, and the twelfth period is greater in value than the fourth period.

Article B16

A method for cooling a bolometer infrared ray receiver of an infrared sensor, the method including:

(a) providing the infrared sensor that comprises
 a base substrate,
 the bolometer infrared ray receiver,
 a Peltier device,
 a first post extending in a direction becoming far from the base substrate,
 a second post extending in a direction becoming far from the base substrate,
 a third post extending in a direction becoming far from the base substrate, and
 a fourth post extending in a direction becoming far from the base substrate, wherein
the bolometer infrared ray receiver comprises
 a resistance variable layer in which resistance varies upon absorption of an infrared ray,
 a bolometer first beam formed of a first insulating material,
 a bolometer second beam formed of a second insulating material,
 a bolometer first thin film formed on the bolometer first beam, and
 a bolometer second thin film formed on the bolometer second beam, wherein
the bolometer first thin film is electrically connected to the resistance variable layer,
the bolometer second thin film is electrically connected to the resistance variable layer, and
a front surface of the bolometer infrared ray receiver is irradiated with the infrared ray,
the Peltier device comprises
 a Peltier first beam formed of a third insulating material,
 a Peltier second beam formed of a fourth insulating material,
 a Peltier first thin film formed on the Peltier first beam, and
 a Peltier second thin film formed on the Peltier second beam, wherein
the Peltier first thin film is formed of a p-type semiconductor material,
the Peltier first thin film is formed of an n-type semiconductor material,
the Peltier device is in contact with a back surface of the bolometer infrared ray receiver,
one end of the bolometer first beam and one end of the bolometer first thin film are connected to the first post,
one end of the bolometer second beam and one end of the bolometer second thin film are connected to the second post,
one end of the Peltier first beam and one end of the Peltier first thin film are connected to the third post, one end of the Peltier second beam and one end of the Peltier second thin film are connected to the fourth post, the bolometer infrared ray receiver, the bolometer first beam, the bolometer first thin film, the bolometer second beam, and the bolometer second thin film are suspended above the base substrate by the first post and the second post, the Peltier device, the Peltier first beam, the Peltier first thin film, the Peltier second beam, and the Peltier second thin film are suspended above the base substrate by the third post and the fourth post, the bolometer first thin film has a first phononic crystal structure including a plurality of through holes arranged regularly, the bolometer second thin film has a second phononic crystal structure including a plurality of through holes arranged regularly, the Peltier first thin film has a third phononic crystal structure including a plurality of through holes arranged regularly, and the Peltier second thin film has a fourth phononic crystal structure including a plurality of through holes arranged regularly, (b) irradiating the front surface of the bolometer infrared ray receiver with the infrared ray;

(c) shutting off the infrared ray being incident on the bolometer infrared ray receiver; and (d) applying current to the Peltier first thin film and the Peltier first thin film, to cool the bolometer infrared ray receiver.

Article B17

The method according to article B16, wherein the first phononic crystal structure is provided at a first section between the first post and one end of the resistance variable layer in the bolometer first thin film as seen in a plan view, the second phononic crystal structure is provided at a second section between the second post and another end of the resistance variable layer in the bolometer second thin film as seen in the plan view, the third phononic crystal structure is provided at a third section between the third post and the one end of the resistance variable layer in the Peltier first thin film as seen in the plan view, and the fourth phononic crystal structure is provided at a fourth section between the fourth post and the other end of the resistance variable layer in the Peltier second thin film as seen in the plan view.

Article B18

The method for cooling a bolometer infrared ray receiver of an infrared sensor according to article B16, wherein the plurality of through holes of the first phononic crystal structure are regularly arranged with a first period, the plurality of through holes of the second phononic crystal structure are regularly arranged with a second period, the plurality of through holes of the third phononic crystal structure are regularly arranged with a third period, and the plurality of through holes of the fourth phononic crystal structure are regularly arranged with a fourth period.

Article B19

The method for cooling a bolometer infrared ray receiver of an infrared sensor according to article B18, wherein the first period, the second period, the third period, and the fourth period are equal to one another.

Article B20

The method for cooling a bolometer infrared ray receiver of an infrared sensor according to article B16, wherein another end of the Peltier first thin film is connected to another end of the Peltier second thin film, to form an interface between the Peltier first thin film and the Peltier second thin film, and the interface is thermally connected to the resistance variable layer.

Article C1

An infrared sensor comprising:

a base substrate including a recess;

a thermopile infrared ray receiver; and a Peltier device, wherein the thermopile infrared ray receiver comprises an infrared ray absorption layer, a thermopile first beam thermally connected to the infrared ray absorption layer and formed of a first p-type semiconductor material, and a thermopile second beam thermally connected to the infrared ray absorption layer and formed of first n-type semiconductor material, the Peltier device is interposed between the thermopile infrared ray receiver and the recess, a front surface of the bolometer infrared ray receiver is irradiated with the infrared ray, the Peltier device comprises a Peltier first beam formed of a second p-type semiconductor material and a Peltier second beam formed of a second n-type semiconductor material, the Peltier device is in contact with a back surface of the thermopile infrared ray receiver, one end of the thermopile first beam, one end of the thermopile second beam, one end of the Peltier first beam, and one end of the Peltier second beam are connected to the base substrate, the thermopile infrared ray receiver, the Peltier device, the thermopile first beam, the thermopile second beam, the Peltier first beam, and the Peltier second beam are suspended above the base substrate, the thermopile first beam has a first phononic crystal structure including a plurality of through holes arranged regularly, the thermopile second beam has a second phononic crystal structure including a plurality of through holes arranged regularly, the Peltier first beam has a third phononic crystal structure including a plurality of through holes arranged regularly, and the Peltier second beam has a fourth phononic crystal structure including a plurality of through holes arranged regularly.

Article C2

The infrared sensor according to article C1, wherein the first phononic crystal structure is provided at a first section between the one end of the thermopile first beam and one end of the infrared ray absorption layer in the thermopile first beam as seen in a plan view, the second phononic crystal structure is provided at a second section between the one end of the thermopile second beam and another end of the infrared ray absorption layer in the thermopile second beam as seen in the plan view, the third phononic crystal structure is provided at a third section between the one end of the Peltier first beam and the one end of the infrared ray absorption layer in the Peltier first beam as seen in the plan view, and the fourth phononic crystal structure is provided at a fourth section between the one end of the Peltier second beam and another end of the infrared ray absorption layer in the Peltier second beam as seen in the plan view.

Article C3
The infrared sensor according to article C1, wherein
the plurality of through holes of the first phononic crystal structure are regularly arranged with a first period,
the plurality of through holes of the second phononic crystal structure are regularly arranged with a second period,
the plurality of through holes of the third phononic crystal structure are regularly arranged with a third period, and
the plurality of through holes of the fourth phononic crystal structure are regularly arranged with a fourth period.

Article C4
The infrared sensor according to article C3, wherein the first period, the second period, the third period, and the fourth period are equal to one another.

Article C5
The infrared sensor according to article C1, wherein
another end of the Peltier first beam is connected to another end of the Peltier second beam, to form an interface between the Peltier first beam and the Peltier second beam, and
the interface is interposed between the infrared ray absorption layer and the recess.

Article C6
The infrared sensor according to article C1, wherein
another end of the Peltier first beam is unconnected to another end of the Peltier second beam,
the Peltier first beam is electrically connected to the Peltier second beam with a first wire, and
the first wire is interposed between the infrared ray absorption layer and the recess.

Article C7
The infrared sensor according to article C5, wherein
the infrared ray absorption layer has four regions being equal to one another in area as seen in a plan view, and
the interface is in contact with at least two of the regions.

Article C8
The infrared sensor according to article C3, wherein
the thermopile first beam, the thermopile second beam, the Peltier first beam, and the Peltier second beam respectively include a first domain, a second domain, a third domain, and a fourth domain,
the first domain, the second domain, the third domain, and the fourth domain respectively include the first phononic crystal structure, the second phononic crystal structure, the third phononic crystal structure, and the fourth phononic crystal structure,
the thermopile first beam, the thermopile second beam, the Peltier first beam, and the Peltier second beam respectively include a fifth domain, a sixth domain, a seventh domain, and an eighth domain,
in the fifth domain, a fifth phononic crystal structure including a plurality of through holes regularly arranged with a fifth period is formed,
in the sixth domain, a sixth phononic crystal structure including a plurality of through holes regularly arranged with a sixth period is formed,
in the seventh domain, a seventh phononic crystal structure including a plurality of through holes regularly arranged with a seventh period is formed,
in the eighth domain, an eighth phononic crystal structure including a plurality of through holes regularly arranged with an eighth period is formed,
as seen in a plan view, the first domain is interposed between the fifth domain and the infrared ray absorption layer,
as seen in the plan view, the second domain is interposed between the sixth domain and the infrared ray absorption layer,
as seen in the plan view, the third domain is interposed between the seventh domain and the infrared ray absorption layer,
as seen in the plan view, the fourth domain is interposed between the eighth domain and the infrared ray absorption layer,
the fifth period is greater than the first period,
the sixth period is greater than the second period,
the seventh period is greater than the third period, and
the eighth period is greater than the fourth period.

Article C9
The infrared sensor according to article C8, wherein
in the first domain, among the plurality of through holes regularly arranged with the first period in the first domain, a plurality of through holes regularly arranged with a ninth period different from the first period are formed,
in the second domain, among the plurality of through holes regularly arranged with the second period in the second domain, a plurality of through holes regularly arranged with a tenth period different from the second period are formed,
in the third domain, among the plurality of through holes regularly arranged with the third period in the third domain, a plurality of through holes regularly arranged with an eleventh period different from the third period are formed,
in the fourth domain, among the plurality of through holes regularly arranged with the fourth period in the fourth domain, a plurality of through holes regularly arranged with a twelfth period different from the fourth period are formed,
in the fifth domain, among the plurality of through holes regularly arranged with the fifth period in the fifth domain, a plurality of through holes regularly arranged with a thirteenth period different from the fifth period are formed,
in the sixth domain, among the plurality of through holes regularly arranged with the sixth period in the sixth domain, a plurality of through holes regularly arranged with a fourteenth period different from the sixth period are formed,
in the seventh domain, among the plurality of through holes regularly arranged with the seventh period in the seventh domain, a plurality of through holes regularly arranged by fifteenth period different from the seventh period are formed, and
in the eighth domain, among the plurality of through holes regularly arranged with the eighth period in the eighth domain, a plurality of through holes regularly arranged with a sixteenth period different from the eighth period are formed.

Article C10
The infrared sensor according to article C8, wherein the plurality of through holes regularly arranged with the first period, the plurality of through holes regularly arranged with the second period, the plurality of through holes regularly arranged with the third period, the plurality of through holes regularly arranged with the fourth period, the plurality of through holes regularly arranged with the fifth period, the plurality of through holes regularly arranged with the sixth period, the plurality of through holes regularly arranged with the seventh period, and the plurality of through holes regularly arranged with the eighth period are each at least five in number.

Article C11
The infrared sensor according to article C8, wherein a unit lattice of a periodic structure composing each of the first domain, the second domain, the third domain, the fourth domain, the fifth domain, the sixth domain, the seventh domain, and the eighth domain is one of a tetragonal lattice, a hexagonal lattice, a rectangular lattice, and a centered-rectangular lattice.

Article C12

The infrared sensor according to article C8, wherein the first period, the second period, the third period, the fourth period, the fifth period, the sixth period, the seventh period, and the eighth period each have a value of not less than 1 nm and not more than 300 nm.

Article C13

The infrared sensor according to article C8, wherein a value obtained by dividing a value of a diameter of each of the plurality of through holes regularly arranged with the first period by a value of the first period, a value obtained by dividing a value of a diameter of each of the plurality of through holes regularly arranged with the second period by a value of the second period, a value obtained by dividing a value of a diameter of each of the plurality of through holes regularly arranged with the third period by a value of the third period, a value obtained by dividing a value of a diameter of each of the plurality of through holes regularly arranged with the fourth period by a value of the fourth period, a value obtained by dividing a value of a diameter of each of the plurality of through holes regularly arranged with the fifth period by a value of the fifth period, a value obtained by dividing a value of a diameter of each of the plurality of through holes regularly arranged with the sixth period by a value of the sixth period, a value obtained by dividing a value of a diameter of each of the plurality of through holes regularly arranged with the seventh period by a value of the seventh period, and a value obtained by dividing a value of a diameter of each of the plurality of through holes regularly arranged with the eighth period by a value of the eighth period each are not less than 0.5 and not more than 0.9.

Article C14

The infrared sensor according to article C1, wherein the thermopile first beam, the thermopile second beam, the Peltier first beam, and the Peltier second beam respectively include a first domain, a second domain, a third domain, and a fourth domain, the first domain includes a plurality of first sub domains regularly arranged with a first period, the second domain includes a plurality of second sub domains regularly arranged with a second period, the third domain includes a plurality of third sub domains regularly arranged with a third period, the fourth domain includes a plurality of fourth sub domains regularly arranged with a fourth period, the plurality of first sub domains are each formed of a phononic crystal including a plurality of through holes regularly arranged with a fifth period, the plurality of second sub domains are each formed of a phononic crystal including a plurality of through holes regularly arranged with a sixth period, the plurality of third sub domains are each formed of a phononic crystal including a plurality of through holes regularly arranged with a seventh period, and the plurality of fourth sub domains are each formed of a phononic crystal including a plurality of through holes regularly arranged with an eighth period.

Article C15

The infrared sensor according to article C14, wherein the thermopile first beam further includes a fifth domain, the thermopile second beam further includes a sixth domain, the Peltier first beam further includes a seventh domain, the Peltier second beam further includes an eighth domain, the fifth domain includes a plurality of fifth sub domains regularly arranged with a ninth period, the sixth domain includes a plurality of sixth sub domains regularly arranged with a tenth period, the seventh domain includes a plurality of seventh sub domains regularly arranged with an eleventh period, the eighth domain includes a plurality of eighth sub domains regularly arranged with a twelfth period, the plurality of fifth sub domains are each formed of a phononic crystal including a plurality of through holes regularly arranged with a thirteenth period, the plurality of sixth sub domains are each formed of a phononic crystal including a plurality of through holes regularly arranged with a fourteenth period, the plurality of seventh sub domains are each formed of a phononic crystal including a plurality of through holes regularly arranged with a fifteenth period, the plurality of eighth sub domains are each formed of a phononic crystal including a plurality of through holes regularly arranged with a sixteenth period, as seen in a plan view, the first domain is interposed between the fifth domain and the infrared ray absorption layer, as seen in the plan view, the second domain is interposed between the sixth domain and the infrared ray absorption layer, as seen in the plan view, the third domain is interposed between the seventh domain and the infrared ray absorption layer, as seen in the plan view, the fourth domain is interposed between the eighth domain and the infrared ray absorption layer, the ninth period is greater in value than the first period, the tenth period is greater in value than the second period, the eleventh period is greater in value than the third period, and the twelfth period is greater in value than the fourth period.

Article C16

A method for cooling a thermopile infrared ray receiver of an infrared sensor, the method including:

(a) providing the infrared sensor that comprises a base substrate including a recess,
the thermopile infrared ray receiver, and
a Peltier device, wherein
the thermopile infrared ray receiver comprises
an infrared ray absorption layer,
a thermopile first beam thermally connected to the infrared ray absorption layer and formed of a first p-type semiconductor material, and
a thermopile second beam thermally connected to the infrared ray absorption layer and formed of a first n-type semiconductor material,
the Peltier device is interposed between the thermopile infrared ray receiver and the recess,
a front surface of the bolometer infrared ray receiver is irradiated with the infrared ray,
the Peltier device comprises a Peltier first beam formed of a second p-type semiconductor material, and a Peltier second beam formed of a second n-type semiconductor material,
the Peltier device is in contact with a back surface of the thermopile infrared ray receiver, one end of the thermopile first beam, one end of the thermopile second beam, one end of the Peltier first beam, and one end of the Peltier second beam are connected to the base substrate, the thermopile infrared ray receiver, the Peltier device, the thermopile first beam, the thermopile second beam, the Peltier first beam, and the Peltier second beam are suspended above the base substrate, the thermopile first beam has a first phononic crystal structure including a plurality of through holes arranged regularly, the thermopile second beam has a second phononic crystal structure including a plurality of through holes arranged regularly, the Peltier first beam has a third phononic crystal structure including a plurality of through holes arranged regularly, and the Peltier second beam has a fourth phononic crystal structure including a plurality of through holes arranged regularly, (b) irradiating the front surface of the bolometer infrared ray receiver with the infrared ray;

(c) shutting off the infrared ray being incident on the thermopile infrared ray receiver; and (d) applying current to the Peltier first beam and the Peltier second beam, to cool the thermopile infrared ray receiver.

Article C17

The method according to article C16, wherein the first phononic crystal structure is provided at a first section between the one end of the thermopile first beam and one end of the resistance variable layer in the thermopile first beam as seen in a plan view, the second phononic crystal structure is provided at a second section between the one end of the thermopile second beam and another end of the resistance variable layer in the thermopile second beam as seen in the plan view, the third phononic crystal structure is provided at a third section between the one end of the Peltier first beam and the one end of the resistance variable layer in the Peltier first beam as seen in the plan view, and the fourth phononic crystal structure is provided at a fourth section between the one end of the Peltier second beam and the other end of the resistance variable layer in the Peltier second beam as seen in the plan view.

Article C18

The method for cooling a thermopile infrared ray receiver of an infrared sensor according to article C16, wherein the plurality of through holes of the first phononic crystal structure are regularly arranged with a first period, the plurality of through holes of the second phononic crystal structure are regularly arranged with a second period, the plurality of through holes of the third phononic crystal structure are regularly arranged with a third period, and the plurality of through holes of the fourth phononic crystal structure are regularly arranged with a fourth period.

Article C19

The method for cooling a thermopile infrared ray receiver of an infrared sensor according to article C18, wherein the first period, the second period, the third period, and the fourth period are equal to one another.

Article C20

The method for cooling a thermopile infrared ray receiver of an infrared sensor according to article C16, wherein another end of the Peltier first beam is connected to another end of the Peltier second beam, to form an interface between the Peltier first beam and the Peltier second beam, and the interface is interposed between the resistance variable layer and the recess.

REFERENCE SIGNS LIST 1A, 1B, 1C, 1D, 1E, 1F, 1G, 1H, 1I, 1J: infrared sensor
11: base substrate
12A, 12B: (bolometer) infrared ray receiver
12C: (thermopile) infrared ray receiver
12P: Peltier device
13a, 13b: electrode pad
14a, 14b, 14c, 14d: second wire
15a, 15b: electrode pad
16, 16a, 16b, 16c, 16d, 16e, 16f, 16g, 16h, 16i, 16j, 16k, 16l, 16m, 16n: first wire
17, 17a, 17b: insulating film
18: through hole
19: unit lattice
21a, 21b, 21c: phononic domain
21P: Peltier device
25a, 25b: first periodic structure
26a, 26b: second periodic structure
27a, 27b: micro periodic structure
28a, 28b: sub phononic domain
29a, 29b: macro periodic structure
31: upper surface
32: recess
34a, 34b, 34c, 34e: post
91, 92, 93: phononic domain
101a, 101b, 101c, 101d: beam
102a, 102b, 102c, 102d, 102e, 102f, 102g, 102h, 102i, 102j, 102k, 102l: beam
103: interface
104a, 104b: beam
111: wafer
111a, 111b, 112a, 112b: section
201: resistance variable layer
202: insulating film
203: infrared ray absorption layer
222: insulating layer
301a, 301b, 302a, 302b: thin film
301b: thin film
311a, 311b, 312a, 312b: section
401a, 401b: insulator
404: sacrificial layer
501: Si layer
502: $SiO_2$ layer
503: Si layer
504: sacrificial layer
505a, 505b: beam layer
1011a, 1011b, 1021a, 1021b: region

What is claimed is:

1. An infrared sensor comprising:
   a base substrate including a recess;
   a thermopile infrared ray receiver; and
   a Peltier device, wherein:
   the thermopile infrared ray receiver comprises:
      an infrared ray absorption layer;
      a thermopile first beam thermally connected to the infrared ray absorption layer and formed of a first p-type semiconductor material; and a thermopile second beam thermally connected to the infrared ray absorption layer and formed of first n-type semiconductor material, the Peltier device is interposed between the thermopile infrared ray receiver and the recess, a front surface of the thermopile infrared ray receiver is irradiated with the infrared ray, the Peltier device comprises a Peltier first beam formed of a second p-type semiconductor material and a Peltier second beam formed of a second n-type semiconductor material, the Peltier device is in contact with a back surface of the thermopile infrared ray receiver, one end of the thermopile first beam, one end of the thermopile second beam, one end of the Peltier first beam, and one end of the Peltier second beam are connected to the base substrate, the thermopile infrared ray receiver, the Peltier device, the thermopile first beam, the thermopile second beam, the Peltier first beam, and the Peltier second beam are suspended above the base substrate, the thermopile first beam has a first phononic crystal structure including a plurality of through holes arranged regularly, the thermopile second beam has a second phononic crystal structure including a plurality of through holes arranged regularly, the Peltier first beam has a third phononic crystal structure including a plurality of through holes arranged regularly, the Peltier second beam has a fourth phononic crystal structure including a plurality of through holes arranged regularly, the plurality of through holes of the first phononic crystal structure are regularly arranged with a first period, the plurality of through holes of the second phononic crystal structure are regularly arranged with a second period, the plurality of through holes of the third phononic crystal structure are regularly arranged with a third period, the plurality of through holes of the fourth phononic crystal structure are regularly arranged with a fourth period, the thermopile first beam, the thermopile second beam, the Peltier first beam, and the Peltier second beam respectively include a first domain, a second domain, a third domain, and a fourth domain, the first domain, the second domain, the third domain, and the fourth domain respectively include the first phononic crystal structure, the second phononic crystal structure, the third phononic crystal structure, and the fourth phononic crystal structure, the thermopile first beam, the thermopile second beam, the Peltier first beam, and the Peltier second beam respectively include a fifth domain, a sixth domain, a seventh domain, and an eighth domain, in the fifth domain, a fifth phononic crystal structure including a plurality of through holes regularly arranged with a fifth period is formed, in the sixth domain, a sixth phononic crystal structure including a plurality of through holes regularly arranged with a sixth period is formed, in the seventh domain, a seventh phononic crystal structure including a plurality of through holes regularly arranged with a seventh period is formed, in the eighth domain, an eighth phononic crystal structure including a plurality of through holes regularly arranged with an eighth period is formed, as seen in a plan view, the first domain is interposed between the fifth domain and the infrared ray absorption layer, as seen in the plan view, the second domain is interposed between the sixth domain and the infrared ray absorption layer, as seen in the plan view, the third domain is interposed between the seventh domain and the infrared ray absorption layer, as seen in the plan view, the fourth domain is interposed between the eighth domain and the infrared ray absorption layer, the fifth period is greater than the first period, the sixth period is greater than the second period, the seventh period is greater than the third period, and the eighth period is greater than the fourth period.

2. The infrared sensor according to claim 1, wherein in the first domain, among the plurality of through holes regularly arranged with the first period in the first domain, a plurality of through holes regularly arranged with a ninth period different from the first period are formed, in the second domain, among the plurality of through holes regularly arranged with the second period in the second domain, a plurality of through holes regularly arranged with a tenth period different from the second period are formed, in the third domain, among the plurality of through holes regularly arranged with the third period in the third domain, a plurality of through holes regularly arranged with an eleventh period different from the third period are formed, in the fourth domain, among the plurality of through holes regularly arranged with the fourth period in the fourth domain, a plurality of through holes regularly arranged with a twelfth period different from the fourth period are formed, in the fifth domain, among the plurality of through holes regularly arranged with the fifth period in the fifth domain, a plurality of through holes regularly arranged with a thirteenth period different from the fifth period are formed, in the sixth domain, among the plurality of through holes regularly arranged with the sixth period in the sixth domain, a plurality of through holes regularly arranged with a fourteenth period different from the sixth period are formed, in the seventh domain, among the plurality of through holes regularly arranged with the seventh period in the seventh domain, a plurality of through holes regularly arranged by fifteenth period different from the seventh period are formed, and in the eighth domain, among the plurality of through holes regularly arranged with the eighth period in the eighth domain, a plurality of through holes regularly arranged with a sixteenth period different from the eighth period are formed.

3. The infrared sensor according to claim 1, wherein the plurality of through holes regularly arranged with the first period, the plurality of through holes regularly arranged with the second period, the plurality of through holes regularly arranged with the third period, the plurality of through holes regularly arranged with the fourth period, the plurality of through holes regularly arranged with the fifth period, the plurality of through holes regularly arranged with the sixth period, the plurality of through holes regularly arranged with the seventh period, and the plurality of through holes regularly arranged with the eighth period are each at least five in number.

4. The infrared sensor according to claim 1, wherein a unit lattice of a periodic structure composing each of the first domain, the second domain, the third domain, the fourth domain, the fifth domain, the sixth domain, the seventh domain, and the eighth domain is one of a tetragonal lattice, a hexagonal lattice, a rectangular lattice, and a centered-rectangular lattice.

5. The infrared sensor according to claim 1, wherein the first period, the second period, the third period, the fourth period, the fifth period, the sixth period, the seventh period, and the eighth period each have a value of not less than 1 nm and not more than 300 nm.

6. The infrared sensor according to claim 1, wherein a value obtained by dividing a value of a diameter of each of the plurality of through holes regularly arranged with the first period by a value of the first period, a value obtained by dividing a value of a diameter of each of the plurality of through holes regularly arranged with the second period by a value of the second period, a value obtained by dividing a value of a diameter of each of the plurality of through holes regularly arranged with the third period by a value of the third period, a value obtained by dividing a value of a diameter of each of the plurality of through holes regularly arranged with the fourth period by a value of the fourth period, a value obtained by dividing a value of a diameter of each of the plurality of through holes regularly arranged with the fifth period by a value of the fifth period, a value obtained by dividing a value of a diameter of each of the plurality of through holes regularly arranged with the sixth period by a value of the sixth period, a value obtained by dividing a value of a diameter of each of the plurality of through holes regularly arranged with the seventh period by a value of the seventh period, and a value obtained by dividing a value of a diameter of each of the plurality of through holes regularly arranged with the eighth period by a value of the eighth period each are not less than 0.5 and not more than 0.9.

7. An infrared sensor comprising:
a base substrate including a recess;
a thermopile infrared ray receiver; and
a Peltier device, wherein:
the thermopile infrared ray receiver comprises:
an infrared ray absorption layer;
a thermopile first beam thermally connected to the infrared ray absorption layer and formed of a first p-type semiconductor material; and
a thermopile second beam thermally connected to the infrared ray absorption layer and formed of first n-type semiconductor material,
the Peltier device is interposed between the thermopile infrared ray receiver and the recess,
a front surface of the thermopile infrared ray receiver is irradiated with the infrared ray,
the Peltier device comprises a Peltier first beam formed of a second p-type semiconductor material and a Peltier second beam formed of a second n-type semiconductor material,
the Peltier device is in contact with a back surface of the thermopile infrared ray receiver,
one end of the thermopile first beam, one end of the thermopile second beam, one end of the Peltier first beam, and one end of the Peltier second beam are connected to the base substrate,
the thermopile infrared ray receiver, the Peltier device, the thermopile first beam, the thermopile second beam, the Peltier first beam, and the Peltier second beam are suspended above the base substrate,
the thermopile first beam has a first phononic crystal structure including a plurality of through holes arranged regularly,
the thermopile second beam has a second phononic crystal structure including a plurality of through holes arranged regularly,
the Peltier first beam has a third phononic crystal structure including a plurality of through holes arranged regularly,
the Peltier second beam has a fourth phononic crystal structure including a plurality of through holes arranged regularly,
the thermopile first beam, the thermopile second beam, the Peltier first beam, and the Peltier second beam respectively include a first domain, a second domain, a third domain, and a fourth domain,
the first domain includes a plurality of first sub domains regularly arranged with a first period,
the second domain includes a plurality of second sub domains regularly arranged with a second period,
the third domain includes a plurality of third sub domains regularly arranged with a third period,
the fourth domain includes a plurality of fourth sub domains regularly arranged with a fourth period,
the plurality of first sub domains are each formed of a phononic crystal including a plurality of through holes regularly arranged with a fifth period,
the plurality of second sub domains are each formed of a phononic crystal including a plurality of through holes regularly arranged with a sixth period,
the plurality of third sub domains are each formed of a phononic crystal including a plurality of through holes regularly arranged with a seventh period, and
the plurality of fourth sub domains are each formed of a phononic crystal including a plurality of through holes regularly arranged with an eighth period.

8. The infrared sensor according to claim 7, wherein the thermopile first beam further includes a fifth domain,
the thermopile second beam further includes a sixth domain,
the Peltier first beam further includes a seventh domain,
the Peltier second beam further includes an eighth domain,
the fifth domain includes a plurality of fifth sub domains regularly arranged with a ninth period,
the sixth domain includes a plurality of sixth sub domains regularly arranged with a tenth period,
the seventh domain includes a plurality of seventh sub domains regularly arranged with an eleventh period,
the eighth domain includes a plurality of eighth sub domains regularly arranged with a twelfth period,
the plurality of fifth sub domains are each formed of a phononic crystal including a plurality of through holes regularly arranged with a thirteenth period,
the plurality of sixth sub domains are each formed of a phononic crystal including a plurality of through holes regularly arranged with a fourteenth period,
the plurality of seventh sub domains are each formed of a phononic crystal including a plurality of through holes regularly arranged with a fifteenth period, the plurality of eighth sub domains are each formed of a phononic crystal including a plurality of through holes regularly arranged with a sixteenth period, as seen in a plan view, the first domain is interposed between the fifth domain and the infrared ray absorption layer, as seen in the plan view, the second domain is interposed between the sixth domain and the infrared ray absorption layer, as seen in the plan view, the third domain is interposed between the seventh domain and the infrared ray absorption layer, as seen in the plan view, the fourth domain is interposed between the eighth domain and the infrared ray absorption layer, the ninth period is greater in value than the first period, the tenth period is greater in value than the second period, the eleventh period is greater in value than the third period, and the twelfth period is greater in value than the fourth period.

9. An infrared sensor comprising:

a base substrate;

a thermopile infrared ray receiver; and a Peltier device, wherein:

the thermopile infrared ray receiver comprises:
   an infrared ray absorption layer;
   a thermopile first beam thermally connected to the infrared ray absorption layer; and
   a thermopile second beam thermally connected to the infrared ray absorption layer, the Peltier device comprises a Peltier first beam and a Peltier second beam, one end of the thermopile first beam, one end of the thermopile second beam, one end of the Peltier first beam, and one end of the Peltier second beam are connected to the base substrate, the thermopile infrared ray receiver, the Peltier device, the thermopile first beam, the thermopile second beam, the Peltier first beam, and the Peltier second beam are suspended above the base substrate, at least a part of the thermopile first beam comprises a first phononic crystal structure composed of a plurality of through holes arranged regularly, at least a part of the thermopile second beam comprises a second phononic crystal structure composed of a plurality of through holes arranged regularly, at least a part of the Peltier first beam comprises a third phononic crystal structure composed of a plurality of through holes arranged regularly, at least a part of the Peltier second beam comprises a fourth phononic crystal structure composed of a plurality of through holes arranged regularly, the thermopile first beam, the thermopile second beam, the Peltier first beam, and the Peltier second beam respectively include a first domain, a second domain, a third domain, and a fourth domain, the first domain includes a plurality of first sub domains regularly arranged with a first period, the second domain includes a plurality of second sub domains regularly arranged with a second period, the third domain includes a plurality of third sub domains regularly arranged with a third period, the fourth domain includes a plurality of fourth sub domains regularly arranged with a fourth period, the plurality of first sub domains are each formed of a phononic crystal comprising a plurality of through holes regularly arranged with a fifth period, the plurality of second sub domains are each formed of a phononic crystal comprising a plurality of through holes regularly arranged with a sixth period, the plurality of third sub domains are each formed of a phononic crystal comprising a plurality of through holes regularly arranged with a seventh period, and the plurality of fourth sub domains are each formed of a phononic crystal comprising a plurality of through holes regularly arranged with an eighth period.

* * * * *